United States Patent
Kuzmin et al.

(10) Patent No.: US 10,884,915 B1
(45) Date of Patent: Jan. 5, 2021

(54) FLASH MEMORY CONTROLLER TO PERFORM DELEGATED MOVE TO HOST-SPECIFIED DESTINATION

(71) Applicant: Radian Memory Systems, Inc., Calabasas, CA (US)

(72) Inventors: Andrey V. Kuzmin, Moscow (RU); Mike Jadon, Manhattan Beach, CA (US); Richard M. Mathews, Porter Ranch, CA (US)

(73) Assignee: Radian Memory Systems, Inc., Calabasas, CA (US)

( * ) Notice: Subject to any disclaimer, the term of this patent is extended or adjusted under 35 U.S.C. 154(b) by 0 days.

(21) Appl. No.: 15/625,956

(22) Filed: Jun. 16, 2017

Related U.S. Application Data

(63) Continuation of application No. 14/466,167, filed on Aug. 22, 2014, which is a continuation of application
(Continued)

(51) Int. Cl.
*G06F 12/02* (2006.01)

(52) U.S. Cl.
CPC .. *G06F 12/0246* (2013.01); *G06F 2212/2022* (2013.01); *G06F 2212/7208* (2013.01)

(58) Field of Classification Search
None
See application file for complete search history.

(56) References Cited

U.S. PATENT DOCUMENTS

| | | |
|---|---|---|
| 5,568,423 A | 10/1996 | Jou et al. |
| 5,652,857 A | 7/1997 | Shimoi et al. |

(Continued)

FOREIGN PATENT DOCUMENTS

WO   2009100149 A1   8/2009

OTHER PUBLICATIONS

Webopedia, "LUN", Feb. 8, 2011, pp. 1-2, https://web.archive.org/web/20110208010549/https://www.webopedia.com/TERM/L/LUN.html (Year: 2011).*

(Continued)

*Primary Examiner* — Christopher D Birkhimer
(74) *Attorney, Agent, or Firm* — Marc P. Schuyler

(57) ABSTRACT

This disclosure provides for host-controller cooperation in managing NAND flash memory. The controller maintains information for each erase unit which tracks memory usage. This information assists the host in making decisions about specific operations, for example, initiating garbage collection, space reclamation, wear leveling or other operations. For example, metadata can be provided to the host identifying whether each page of an erase unit has been released, and the host can specifically then command each of consolidation and erase using direct addressing. By redefining host-controller responsibilities in this manner, much of the overhead association with FTL functions can be substantially removed from the memory controller, with the host directly specifying physical addresses. This reduces performance unpredictability and overhead, thereby facilitating integration of solid state drives (SSDs) with other forms of storage. The disclosed techniques are especially useful for direct-attached and/or network-attached storage.

27 Claims, 13 Drawing Sheets

Related U.S. Application Data

No. 13/767,723, filed on Feb. 14, 2013, now Pat. No. 9,652,376.

(60) Provisional application No. 61/757,464, filed on Jan. 28, 2013.

(56) References Cited

U.S. PATENT DOCUMENTS

| | | | |
|---|---|---|---|
| 5,860,082 A | 1/1999 | Smith et al. | |
| 6,134,631 A | 10/2000 | Jennings, III | |
| 6,549,482 B2 * | 4/2003 | Garner | G06F 9/4403 |
| | | | 365/189.04 |
| 7,096,378 B2 | 8/2006 | Stence et al. | |
| 7,339,823 B2 | 3/2008 | Nakayama et al. | |
| 7,404,031 B2 | 7/2008 | Oshima | |
| 7,581,078 B2 | 8/2009 | Ware | |
| 7,702,846 B2 | 4/2010 | Nakanishi et al. | |
| 7,710,777 B1 | 5/2010 | Mintierth | |
| 7,752,381 B2 | 7/2010 | Wong | |
| 7,801,561 B2 | 9/2010 | Parikh et al. | |
| 7,818,489 B2 | 10/2010 | Karamcheti et al. | |
| 7,836,244 B2 | 11/2010 | Kim et al. | |
| 7,861,122 B2 | 12/2010 | Cornwell et al. | |
| 7,877,569 B2 * | 1/2011 | Honda | G06F 3/0607 |
| | | | 711/103 |
| 7,887,569 B2 | 2/2011 | Frigg | |
| 7,941,692 B2 | 5/2011 | Royer et al. | |
| 7,970,983 B2 | 6/2011 | Nochimowski | |
| 7,991,944 B2 | 8/2011 | Lee et al. | |
| 8,000,144 B2 * | 8/2011 | Kim | G06F 13/4243 |
| | | | 365/185.11 |
| 8,001,318 B1 | 8/2011 | Iyer | |
| 8,024,545 B2 | 9/2011 | Kim et al. | |
| 8,037,234 B2 | 10/2011 | Yu | |
| 8,055,833 B2 | 11/2011 | Danilak et al. | |
| 8,065,471 B2 | 11/2011 | Yano et al. | |
| 8,065,473 B2 | 11/2011 | Ito et al. | |
| 8,068,365 B2 | 11/2011 | Kim | |
| 8,072,463 B1 | 12/2011 | Van Dyke | |
| 8,074,022 B2 | 12/2011 | Okin et al. | |
| 8,082,389 B2 | 12/2011 | Fujibayashi | |
| 8,086,790 B2 | 12/2011 | Roohparvar | |
| 8,316,201 B2 * | 11/2012 | Stern | G06F 11/1008 |
| | | | 711/165 |
| 8,347,042 B2 | 1/2013 | You | |
| 8,572,331 B2 | 10/2013 | Shalvi | |
| 8,949,517 B2 | 2/2015 | Cohen | |
| 9,171,585 B2 | 10/2015 | Rajan | |
| 9,229,854 B1 | 1/2016 | Kuzmin et al. | |
| 9,335,939 B2 | 5/2016 | Bennett et al. | |
| 9,400,745 B2 | 7/2016 | Camp | |
| 9,400,749 B1 | 7/2016 | Kuzmin et al. | |
| 9,432,298 B1 | 8/2016 | Smith | |
| 9,519,578 B1 | 12/2016 | Kuzmin et al. | |
| 9,542,118 B1 | 1/2017 | Lercari et al. | |
| 9,569,320 B2 | 2/2017 | Werner | |
| 9,582,192 B2 | 2/2017 | Choudhuri | |
| 2002/0136078 A1 * | 9/2002 | Garner | G06F 9/4403 |
| | | | 365/230.03 |
| 2003/0028733 A1 | 2/2003 | Tsunoda | |
| 2003/0065866 A1 | 4/2003 | Spencer | |
| 2003/0165076 A1 | 9/2003 | Gorobets | |
| 2004/0117414 A1 * | 6/2004 | Braun | G06F 8/65 |
| 2005/0144413 A1 | 6/2005 | Kuo et al. | |
| 2006/0022171 A1 | 10/2006 | Maeda et al. | |
| 2006/0221719 A1 | 10/2006 | Maeda | |
| 2007/0028035 A1 * | 2/2007 | Nishihara | G06F 12/0246 |
| | | | 711/103 |
| 2007/0058431 A1 | 3/2007 | Chung | |
| 2007/0233939 A1 | 10/2007 | Kim | |
| 2007/0260811 A1 | 11/2007 | Merry | |
| 2007/0283428 A1 | 12/2007 | Ma et al. | |
| 2008/0082596 A1 * | 4/2008 | Gorobets | G06F 12/0253 |
| 2008/0147964 A1 | 6/2008 | Chow et al. | |
| 2008/0155204 A1 | 6/2008 | Qawami et al. | |
| 2008/0189485 A1 | 8/2008 | Jung et al. | |
| 2009/0036163 A1 | 2/2009 | Kimbrell | |
| 2009/0046533 A1 | 2/2009 | Jo | |
| 2009/0083478 A1 | 3/2009 | Kunimatsu | |
| 2009/0089482 A1 | 4/2009 | Traister | |
| 2009/0089490 A1 | 4/2009 | Ozawa et al. | |
| 2009/0172219 A1 | 7/2009 | Mardiks | |
| 2009/0172250 A1 | 7/2009 | Allen et al. | |
| 2009/0172257 A1 | 7/2009 | Prins | |
| 2009/0198946 A1 | 8/2009 | Ebata | |
| 2009/0254705 A1 | 10/2009 | Abali et al. | |
| 2009/0271562 A1 | 10/2009 | Sinclair | |
| 2009/0300015 A1 | 12/2009 | Kazan et al. | |
| 2009/0327602 A1 | 12/2009 | Moore et al. | |
| 2010/0042655 A1 | 2/2010 | Tse et al. | |
| 2010/0115172 A1 | 5/2010 | Gillingham et al. | |
| 2010/0161882 A1 * | 6/2010 | Stern | G06F 11/1008 |
| | | | 711/103 |
| 2010/0161932 A1 * | 6/2010 | Stern | G06F 11/1008 |
| | | | 711/202 |
| 2010/0162012 A1 | 6/2010 | Cornwell et al. | |
| 2010/0182838 A1 * | 7/2010 | Kim | G06F 13/4243 |
| | | | 365/185.18 |
| 2010/0191779 A1 | 7/2010 | Hinrichs | |
| 2010/0241866 A1 | 9/2010 | Rodorff | |
| 2010/0262761 A1 | 10/2010 | Borchers | |
| 2010/0269015 A1 * | 10/2010 | Borchers | G06F 12/0246 |
| | | | 714/758 |
| 2010/0281230 A1 | 11/2010 | Rabii et al. | |
| 2010/0287217 A1 | 11/2010 | Borchers | |
| 2010/0329011 A1 | 12/2010 | Lee et al. | |
| 2011/0033548 A1 | 2/2011 | Kimmel et al. | |
| 2011/0035541 A1 * | 2/2011 | Tanaka | G06F 3/0608 |
| | | | 711/103 |
| 2011/0040927 A1 | 2/2011 | Fuxa | |
| 2011/0055445 A1 | 3/2011 | Gee et al. | |
| 2011/0161784 A1 * | 6/2011 | Selinger | G06F 11/1068 |
| | | | 714/768 |
| 2011/0197023 A1 | 8/2011 | Iwamitsu et al. | |
| 2011/0217977 A1 * | 9/2011 | Du | H04W 8/205 |
| | | | 455/432.1 |
| 2011/0238943 A1 | 9/2011 | Devendran et al. | |
| 2011/0255339 A1 * | 10/2011 | Kim | G06F 13/4243 |
| | | | 365/185.11 |
| 2011/0296133 A1 | 12/2011 | Flynn | |
| 2011/0314209 A1 * | 12/2011 | Eckstein | G06F 9/355 |
| | | | 711/104 |
| 2012/0005404 A1 | 1/2012 | Raz | |
| 2012/0033519 A1 | 2/2012 | Confalonieri et al. | |
| 2012/0059972 A1 | 3/2012 | Chen | |
| 2012/0066441 A1 | 3/2012 | Weingarten | |
| 2012/0131381 A1 | 5/2012 | Eleftheriou | |
| 2012/0191664 A1 | 7/2012 | Wakrat | |
| 2012/0204079 A1 | 8/2012 | Takefman | |
| 2012/0221781 A1 | 8/2012 | Frost | |
| 2013/0007343 A1 | 1/2013 | Rub | |
| 2013/0013852 A1 | 1/2013 | Hou | |
| 2013/0019062 A1 | 1/2013 | Bennett | |
| 2013/0073816 A1 | 3/2013 | Seo | |
| 2013/0073895 A1 | 3/2013 | Cohen | |
| 2013/0111295 A1 | 5/2013 | Li | |
| 2013/0124793 A1 | 5/2013 | Gyl | |
| 2013/0166825 A1 | 6/2013 | Kim et al. | |
| 2013/0242425 A1 | 9/2013 | Zayas | |
| 2013/0290619 A1 | 10/2013 | Knight | |
| 2013/0297852 A1 | 11/2013 | Fai et al. | |
| 2014/0101371 A1 | 4/2014 | Nguyen et al. | |
| 2014/0122781 A1 | 5/2014 | Smith et al. | |
| 2014/0208004 A1 | 7/2014 | Cohen | |
| 2014/0215129 A1 | 7/2014 | Kuzmin et al. | |
| 2015/0113203 A1 | 4/2015 | Dancho | |
| 2015/0149789 A1 | 5/2015 | Seo | |
| 2015/0212938 A1 | 7/2015 | Chen | |
| 2015/0261456 A1 | 9/2015 | Alcantara et al. | |
| 2015/0324264 A1 | 11/2015 | Vidypoornachy et al. | |
| 2015/0347296 A1 | 12/2015 | Kotte | |
| 2015/0364218 A1 | 12/2015 | Frayer | |

(56) References Cited

U.S. PATENT DOCUMENTS

| | | |
|---|---|---|
| 2016/0018998 A1 | 1/2016 | Mohan |
| 2016/0062698 A1 | 3/2016 | Wu |
| 2016/0357462 A1 | 12/2016 | Nam |
| 2016/0364179 A1 | 12/2016 | Tsai |

OTHER PUBLICATIONS

Anonymous, "Microsoft Information about the copy command", Feb. 5, 2005, pp. 1-2, https://web.archive.org/web/20050205044504/ https://www.computerhope.com/copyhlp.htm (Year: 2005).*

Anonymous, "COPY", Jun. 2, 2008, pp. 1-2, https://web.archive.org/web/20080602024456/https://ss64.com/nt/copy.html (Year: 2008).*

NVM Express, Version 1.0b, Jul. 12, 2011, pp. 1-126, published at http://www.nvmexpress.org/resources/ by the NVM Express Work Group.

John D. Strunk, "Hybrid Aggregates: Combining SSDs and HDDs in a single storage pool," Dec. 15, 2012, ACM SIGOPS Operating Systems Review archive, vol. 46 Issue 3, Dec. 2012, pp. 50-56.

Yiying Zhang, Leo Prasath Arulraj, Andrea C. Arpaci-Dusseau, Remzi H. Arpaci-Dusseau, Computer Sciences Department, University of Wisconsin-Madison, "De-indirection for Flash-based SSDs with NamelessWrites," published at https://www.usenix.org/conference/fast12/de-indirection-flash-based-ssds-nameless-writes, Feb. 7, 2012, pp. 1-16.

Stan Park and Kai Shen, Department of Computer Science, University of Rochester, "FIOS: A Fair, Efficient Flash I/O Scheduler," Feb. 23, 2012, pp. 1-15, published at www.usenix.org/event/fast12/tech/full_papers/Park.pdf by the Advanced Computing Systems Association, Fast'12, 10th Usenix Conference on File and Storage Technologies, San Jose.

Eric Seppanen, Matthew T. O'Keefe, David J. Lilja, Department of Electrical and Computer Engineering, University of Minnesota, "High Performance Solid State Storage Under Linux," Apr. 10, 2010, MSST '10 Proceedings of the 2010 IEEE 26th Symposium on Mass Storage Systems and Technologies (MSST), pp. 1-12.

Xiangyong Ouyangyz, David Nellansy, Robert Wipfely, David Flynny, Dhabaleswar K. Pandaz, "Beyond Block I/O: Rethinking Traditional Storage Primitives," Aug. 20, 2011, published at http://www.sciweavers.org/read/beyond-block-i-o-rethinking-traditional-storage-primitives-327868, by Fusion IO and the Ohio State University.

Intel Corp, PCI-SIG SR-IOV Primer—An Introduction to SR-IOV Technology,: 321211-002, Revision 2.5, Jan. 2011, 28 pages.

Applicant's appeal brief, U.S. Appl. No. 13/767,723, 60 pages, Feb. 27, 2015.

Examiner's answer, U.S. Appl. No. 13/767,723, 26 pages, filed Jul. 15, 2015.

Applicant's reply brief, U.S. Appl. No. 13/767,723, 35 pages, filed Sep. 14, 2015.

Garth Gibson, Greg Ganger, "Principles of Operation for Shingled Disk Devices," Canregie Mellon Parallel Data Laboratory, CMU-PDL-11-107, Apr. 2011, 9 pages.

Li-Pin Chang, "Hybrid Solid State Disks: Combining Heterogeneous NAND Flash in Large SSDs," National Chiao-Tung University, Taiwan, ASPDAC 2008, 26 pages.

Hua Wangx, Ping Huangxz, Shuang Hex, Ke Zhoux, Chunhua Lix, and Xubin He, "A Novel I/O Scheduler for SSD with Improved Performance and Lifetime," Mass Storage Systems and Technologies (MSST), 2013 IEEE 29th Symposium on, May 6-10, 2013, 5 pages.

Li-Pin Chang, "Hybrid Solid State Disks: Combining Heterogeneous NAND Flash in Large SSDs," National Chiao-Tung University, Taiwan, 978-1-4244-1922-7/08, 2008 IEEE, 6 pages.

Optimizing NAND Flash Performance, Flash Memory Summit, Santa Clara, CA USA Aug. 2008, Ryan Fisher, pp. 1-23.

High-Speed NAND Flash: Design Considerations to Maximize Performance, Flash Memory Summit, Santa Clara, CA USA Aug. 11, 2009, , Robert Pierce, pp. 1-19.

NAND 201: An Update on the Continued Evolution of NAND Flash, Jim Cooke, Micron White Paper, Sep. 6, 2011, pp. 1-10.

Spansion SLC NAND Flash Memory for Embedded, data sheet, S34ML01G1, S34ML02G1, S34ML04G1, Sep. 6, 2012, pp. 1-73.

Ouyang et al., "SDF: Software-defined flash for web-scale internet storage systems," Computer Architecture News—ASPLOS '14, vol. 42 Issue 1, Mar. 2014, 14 pages.

Macko et al., "Tracking Back References in a Write-Anywhere File System,"FAST'10 Proceedings of the 8th USENIX conference on File and storage technologies, 14 pages, Feb. 23, 2010.

Ohad, Rodeh, "IBM Research Report Defragmentation Mechanisms for Copy-on-Write File-systems," IBM white paper, Apr. 26, 2010, 10 pages, available at domino.watson.ibm.com/library/CyberDig.nsf/papers/298A0EF3C2CDB17B8525770700056B41F/$File/rj10465.pdf.

Office Action, U.S. Appl. No. 14/848,273, dated Nov. 25, 2016, 25 pages.

USPTO Office Communication in U.S. Appl. No. 14/951,708, dated Apr. 21, 2016, 14 pages.

Applicant response to Apr. 21, 2016 Office Action in U.S. Appl. No. 14/951,708, filed Sep. 16, 2016, 11 pages.

USPTO Office Communication in U.S. Appl. No. 15/053,372, dated Jun. 15, 2016, 19 pages.

Applicant response to Jun. 15, 2016 Office Action in U.S. Appl. No. 15/053,372, filed Sep. 15, 2016, 56 pages.

USPTO Office Communication in U.S. Appl. No. 15/074,778, dated May 18, 2016, 35 pages.

Applicant response to May 18, 2016 Office Action in U.S. Appl. No. 15/074,778, filed Aug. 17, 2016, 25 pages.

USPTO Office Communication in U.S. Appl. No. 15/074,778, dated Nov. 30, 2016, 43 pages.

NVM Express, V. 1.2.1, 217 pages, Jun. 3, 2016.

Applicant Mar. 27, 2017 response to USPTO Office Action of Nov. 25, 2016, U.S. Appl. No. 14/848,273, 14 pages.

PTAB Decision, Mar. 14, 2017, U.S. Appl. No. 13/767,723, Examiner Reversed, 8 pages.

Notice of Allowance, U.S. Appl. No. 14/880,529, dated Nov. 29, 2016, 16 pages.

Notice of Allowance, U.S. Appl. No. 15/053,372, dated Jan. 12, 2017, 10 pages.

Notice of Allowance, U.S. Appl. No. 14/951,708, dated Nov. 2, 2016, 12 pages.

USPTO Office Action dated Nov. 30, 2016, U.S. Appl. No. 15/074,778, 43 pages.

PTAB Decision, May 31, 2017, U.S. Appl. No. 14/466,167, Examiner Reversed, 7 pages.

Notice of Allowance, U.S. Appl. No. 15/346,641, dated May 16, 2017, 10 pages.

Final Office Action, U.S. Appl. No. 14/848,273, dated Apr. 19, 2017, 41 pages.

Preliminary Amendment, U.S. Appl. No. 15/621,888, filed Sep. 29, 2017, 10 pages.

NonFinal Office Action, U.S. Appl. No. 15/211,939, dated Sep. 29, 2017, 26 pages.

Applicant response to nonfinal office action, U.S. Appl. No. 14/848,273, filed Sep. 20, 2017, 17 pages.

NonFinal Office Action, U.S. Appl. No. 15/211,927, dated Oct. 18, 2017, 24 pages.

Applicant response submitted with RCE, U.S. Appl. No. 14/848,273, filed Jul. 17, 2017, 12 pages.

NonFinal Office Action, U.S. Appl. No. 14/848,273, dated Sep. 7, 2017, 26 pages.

Mar. 26, 2018 NonFinal Office Action, U.S. Appl. No. 15/211,939, 26 pages.

U.S. Appl. No. 14/848,273, Applicant's Appeal Brief, filed May 25, 2018 (54 pages).

May 21, 2018 Non-Final Office Action, U.S. Appl. No. 15/690,006, 38 pages.

Apr. 10, 2018 Final Office Action, U.S. Appl. No. 15/211,927, 35 pages.

U.S. Appl. No. 15/625,931, Applicant Apr. 30, 2018 response to Jan. 29, 2018 Office Action, 18 pages.

(56) References Cited

OTHER PUBLICATIONS

U.S. Appl. No. 14/848,273, Applicant's Reply Brief, 13 pages, filed Sep. 12, 2018.
U.S. Appl. No. 15/625,931, Applicant's Preappeal Conference Brief, 5 pages, filed Sep. 12, 2018.
U.S. Appl. No. 15/690,006, Applicant Response To Office Action, 21 pages, filed Sep. 12, 2018.
U.S. Appl. No. 14/848,273, Applicant's Appeal Brief, 54 pages, filed May 25, 2018.
U.S. Appl. No. 14/848,273, Examiner's Answer, 37 pages, filed Aug. 3, 2018.
U.S. Appl. No. 15/625,931, Applicant Response To Office Action, 18 pages, filed Apr. 30, 2018.
U.S. Appl. No. 15/625,931, Final Office Action, 27 pages, filed May 24, 2018.
U.S. Appl. No. 15/621,888, Non Final Office Action, 11 pages, filed Jun. 11, 2018.
U.S. Appl. No. 15/621,888, Applicant Response To Office Action, 30 pages, filed Sep. 10, 2018.
U.S. Appl. No. 15/690,006, Non Final Office Action, 38 pages, filed May 21, 2018.
U.S. Appl. No. 15/211,927, Final Office Action, 35 pages, filed Apr. 10, 2018.
U.S. Appl. No. 15/211,927, Applicant Response To Final Office Action/RCE, 18 pages, filed Sep. 10, 2018.
U.S. Appl. No. 15/211,939, Non Final Office Action, 29 pages, filed Mar. 26, 2018.
U.S. Appl. No. 15/211,939, Applicant Response To Office Action, 26 pages, filed Jul. 26, 2018.
U.S. Appl. No. 15/690,006, Preliminary Amendment, 14 pages, filed Dec. 2, 2017.
Applicant Response to Sep. 29, 2017 NonFinal Office Action, U.S. Appl. No. 15/211,939, dated Jan. 22, 2018, 22 pages.
U.S. Appl. No. 14/848,273, Applicant's Notice of Appeal, Applicant's Preappeal Request, and Applicant's Preappeal Conference Brief, filed by Applicant on Feb. 2, 2018, 11 pages.
U.S. Appl. No. 14/848,273, Final Rejection and list of references cited, dated Oct. 25, 2017, 32 pages.
U.S. Appl. No. 15/625,931, Nonfinal Office Action dated Jan. 29, 2018, and list of references cited, 30 pages.
Applicant response to nonfinal office action, U.S. Appl. No. 15/211,927, filed Feb. 5, 2018, 20 pages.
Preliminary Amendment filed by Applicant on Dec. 2, 2017, U.S. Appl. No. 15/690,006, 18 pages.
Preappeal Decision, U.S. Appl. No. 15/625,931, 2 pages, mailed Nov. 6, 2018.
Applicant's Appeal Brief, U.S. Appl. No. 15/625,931, 38 pages, filed Feb. 13, 2019.
Final Office Action, U.S. Appl. No. 15/621,888, 10 pages, dated Oct. 29, 2019.
Applicant Response after Final Office Action, U.S. Appl. No. 15/621,888, 10 pages, filed Jan 22, 2019.
Notice of Allowance, U.S. Appl. No. 15/621,888, 9 pages, dated Mar. 5, 2019.
Examiner's Answer, U.S. Appl. No. 15/625,931, 24 pages, dated Apr. 24, 2018.
Interview Summary, 5 pages, dated Jan. 22, 2019.
Response/RCE, U.S. Appl. No. 15/690,006, 28 pages, filed Mar. 26, 2019.
Final Office Action, U.S. Appl. No. 15/690,006, dated Dec. 3, 2018, 45 pages.
Interview Summary, U.S. Appl. No. 15/690,006, dated Mar. 25, 2019, 6 pages.
Applicant reply brief, U.S. Appl. No. 15/625,931, filed Jun. 25, 2019, 8 pages.
Nonfinal office action, dated Sep. 6, 2019, U.S. Appl. No. 15/211,927, 36 pages.
Applicant reply to nonfinal office action, 12 pages, U.S. Appl. No. 15/211,927.
Final office action, dated Jun. 25, 2019, U.S. Appl. No. 15/211,939, 29 pages.
Applicant response to final office action, submitted with RCE, U.S. Appl. No. 15/211,939, 13 pages.
Nonfinal office action, U.S. Appl. No. 15/690,006, 41 pages, dated Aug. 1, 2019.
Applicant response to nonfinal office action, U.S. Appl. No. 15/690,006, 22 pages, filed Nov. 20, 2019.
Open NAND Flash Interface (ONFI), specification, version 2.0, 174 pages, Feb. 27, 2008.
Open NAND Flash Interface (ONFI), specification, version 3.1, 296 pages Sep. 19, 2012.
Jun. 21, 2019, non-final office action, U.S. Appl. No. 15/621,888, 9 pages.
Aug. 20, 2019, Applicant response to Office Action, U.S. Appl. No. 15/621,888, 7 pages.
Sep. 13, 2019, Notice Of Allowance, U.S. Appl. No. 15/621,888, 9 pages.
Nonfinal Office Action, U.S. Appl. No. 15/621,888, dated Jun. 21, 2019, 9 pages.
Applicant Response To NonFinal Office Action, U.S. Appl. No. 15/621,888, filed Aug. 20, 2019, 8 pages.
Notice of Allowance, U.S. Appl. No. 15/621,888, dated Sep. 13, 2019.
Interview Summary, U.S. Appl. No. 15/621,888, dated Aug. 26, 2019, 9 pages.
Notice of Allowance, U.S. Appl. No. 15/690,006), dated Jan. 27, 2020, 13 pages.
U.S. Appl. No. 13/767,723, Kuzmin, Issued—U.S. Pat. No. 9,652,376.
U.S. Appl. No. 14/466,167, Kuzmin, Issued—U.S. Pat. No. 9,727,454.
U.S. Appl. No. 15/009,275, Kuzmin, Issued—U.S. Pat. No. 9,400,749.
U.S. Appl. No. 15/625,931, Kuzmin, on appeal, appeal docket no. 2019-005230.
U.S. Appl. No. 15/625,946, Kuzmin, pending.
U.S. Appl. No. 14/047193, Kuzmin, Issued—U.S. Pat. No. 9,229,854.
U.S. Appl. No. 14/951,708, Kuzmin, Issued—U.S. Pat. No. 9,519,578.
U.S. Appl. No. 15/346,641, Kuzmin, Issued—U.S. Pat. No. 9,710,377.
U.S. Appl. No. 15/621,888, Kuzmin, Issued—U.S. Pat. No. 10,445,229.
U.S. Appl. No. 16/570,922, Kuzmin, pending.
U.S. Appl. No. 16/751,925, Kuzmin, pending.
U.S. Appl. No. 14/848,273, Kuzmin, on appeal, appeal docket no. 2018-008814.
U.S. Appl. No. 14/880,529, Lercari, U.S. Pat. No. 9,542,118.
U.S. Appl. No. 15/053,372, Lercari, U.S. Pat. No. 9,588,904.
U.S. Appl. No. 15/074,778, Lercari, U.S. Pat. No. 9,785,572.
U.S. Appl. No. 15/690,006, Lercari, allowed.
U.S. Appl. No. 15/211,927, Jadon, U.S. Pat. No. 10,552,058.
U.S. Appl. No. 16/591,735, Jadon, pending.
U.S. Appl. No. 15/211,939, Chen, U.S. Pat. No. 10,552,085.
U.S. Appl. No. 16/702,736, Chen, pending.
U.S. Appl. No. 16/707,934, Lercari, pending.

* cited by examiner

FLASH MEMORY CONTROLLER TO PERFORM DELEGATED MOVE TO HOST-SPECIFIED DESTINATION

This application is a continuation of U.S. patent application Ser. No. 14/466,167, filed on behalf of first-named inventor Andrey V. Kuzmin on Aug. 22, 2014, which in turn is a continuation of U.S. patent application Ser. No. 13/767,723 (issued on May 16, 2017 as U.S. Pat. No. 9,652,376), filed on behalf of first-named inventor Andrey V. Kuzmin on Feb. 14, 2013, which in turn claims priority to U.S. Provisional Patent Application No. 61/757,464, filed on Jan. 28, 2013 on behalf of first-named inventor Andrey V. Kuzmin; each of the aforementioned patent applications are hereby incorporated by reference.

This disclosure relates to storage systems and, more specifically, to the architecture of storage systems that utilize flash memory. Still more particularly, the present disclosure relates to flash management techniques that facilitate more efficient integration and utilization of flash-based solid-state drives in network- and direct-attached storage systems.

BACKGROUND

Flash memory is a type of non-volatile storage medium. It is characterized by being partitioned into storage areas called erase units (EU). Different portions of an EU can be written (programmed) at different times, but each portion can only be written once without erasing the particular EU in its entirety. Once an EU is erased, all portions of that EU are again available for writing. Erase units can be large relative to many file system operations. For example, NAND flash memory features programming units of "pages" with each erase unit consisting of a large number of pages. This asymmetry in programming and erasing data is referred to as program-erase (P/E) asymmetry. Flash memory can be embodied in different forms, for example, solid-state drives (SSDs) that utilize NAND flash memory devices. "Flash memory" as used herein includes other technologies that share these asymmetries or the other control functions mentioned below, e.g., the term can include other forms of nonvolatile memory.

A flash memory controller is typically used to manage operations within flash memory. Other types of memory, for example random access memory (RAM) and hard disk drives (HDDs), also utilize controllers dedicated to managing operations within those types of memory. The use of a memory controller independent from a host is often desirable particularly for flash memory because without such a scheme the host would be encumbered with a number of management functions unique to, or characteristic of, flash memory. Such functions typically include caching of write data to reduce frequency of programming operations, wear leveling, bad block management and space reclamation. These tasks are typically managed by a flash memory controller using a flash translation layer (FTL), which keeps records of logical-to-physical translations, wear count, bad blocks and so forth using RAM that is built-in to the flash memory controller. For example, owing to P/E asymmetry and typically large erase block size, a flash memory controller can use this RAM as a cache to help reduce the frequency of P/E operations. That is, to minimize the frequency of flash programming operations, pages of data from flash memory can be temporarily stored in the RAM and only occasionally programmed into flash memory. This helps reduce write counts and thus dilutes wear, effectively extending useful flash life. Some flash memory controllers also use wear leveling to help mitigate wear caused by accumulated writes to particular locations of flash memory. That is, to avoid disproportionate wear associated with frequently-written logical addresses, wear leveling is employed to shuffle memory contents to new physical locations within flash memory, to distribute (and thereby level) wear for each specific logical address across different physical locations. A flash memory controller typically handles this function in a manner transparent to the host and, to this effect, tracks new physical locations for each logical address using the FTL; a memory operation from the host that specifies a logical address is translated to substitute in a physical address where the desired data can be found. The RAM mentioned above can be used to store logical-to-physical (L2P) translation tables used for this purpose. Note, however, that as memory capacity grows, the typical table sizes often exceed RAM capacity, which leads to further complications. The use of L2P translation built-in to the memory controller helps present flash memory to the host as ubiquitous memory, such that a host operating system does not have to concern itself with the P/E asymmetry or other special issues for flash memory. Also, as memory cells in flash memory lose their ability to retain data reliably, portions of physical storage can be marked as "bad;" some flash memory controllers therefore also track "bad blocks" and use the FTL to remap valid memory so as to avoid these bad blocks. The FTL can also be used to detect when a host attempts to write data to an already-programmed location (i.e., without an intervening erase operation); when such an operation is detected, the FTL remaps the respective logical address to a free EU and marks "overwritten" space at the original location as stale. Due to this and other manifestations of the P/E asymmetry, it is possible to have valuable data stored in one individually programmable unit of memory, while stale data is stored in other individually programmable units of memory within the same erase block. That is, many of the pages (e.g., a hundred pages or more) of an EU can remain unutilized while a small subset of the EU still contains data in active use, a problem which increases with time. To better utilize available storage space, some flash memory controllers therefore possess logic that periodically consolidates active data and, in so doing, frees up (reclaims) stale space, which can then be erased; this function is sometimes combined with wear leveling.

Each of these functions contributes substantial overhead and write amplification in flash memory. That is to say, substantial data and control bandwidth is consumed in implementing these functions, which can both increase the number of writes to memory (i.e., increase wear) as well as compete with new writes initiated by a host. The use of search trees or other L2P translation functions can also substantially encumber control bandwidth and input/output (IO) latency. For example, on host read commands, L2P translation is performed with the logical address provided in a command to obtain a physical address from which data should be read. At a 4 KB logical block size, L2P translation is organized into a B+-tree that requires extensive space, for example, 2 GB of space for 1 TB flash storage device. Inability to fit a L2P tree into local (fast) RAM can result in tree blocks being swapped out to flash memory media, penalizing the address look-up for the need to load the tree blocks, with high latency. The possibility of power loss further requires L2P mapping updates to be persistent, necessitating update logging or other techniques to provide fault-tolerance. Other techniques in some flash memory implementations, for example, error protection schemes such as RAID techniques, can also substantially encumber control and data bandwidth.

These encumbrances create unpredictable response latency in flash memory. In turn, these encumbrances inhibit the use of flash memory in many applications, particularly in non-homogenous storage systems (e.g., that include dissimilar types of memories, such as both flash and magnetic memory), direct-attached storage systems and storage systems directed to network-based applications. That is, the ability of a storage system to operate effectively typically depends on structured pipelining of memory commands. Unpredictable latencies often associated with flash memory can inhibit this pipelining and, further, inhibits the use of flash memory in multiple drive storage systems, particularly non-homogenous systems, as the unpredictable latency renders it difficult to pipeline commands for a flash drive with other memory types or drives.

What is needed is a mechanism for improving control and data bandwidth for flash memory and other forms of non-volatile memory. More particularly, a mechanism is needed that reduces control and data bandwidth encumbrances created by memory management functions and thereby decreases the issues referenced above. Still further, a need exists for a memory management scheme that does not create excessive write amplification and bandwidth competition. Finally, a need exists for a flash/nonvolatile memory architecture that has more consistent latency, is conductive to structured pipelining of commands, and permits ubiquitous management of SSDs and other forms of memory in direct-attached and network storage applications. Techniques provided by this disclosure satisfy these needs and provide further related advantages.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application to certain methods and devices. The description set out below exemplifies methods supporting cooperative memory management between a host and a memory controller, and improved designs for a memory controller, host, and memory system. While the specific examples are presented, particularly in the context of flash memory, the principles described herein may also be applied to other methods, devices and systems as well.

DETAILED DESCRIPTION

I. Introduction.

Figure 6:
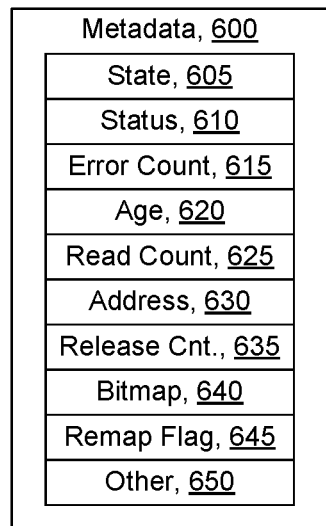
FIG. 6 a diagram showing examples of information that can be kept by a memory controller for each of plural physical subdivisions of memory.

This disclosure provides techniques for cooperative interaction between a memory controller and host. The techniques call for the memory controller to store information specific to each of plural subdivisions of memory, and to make data based on that stored information accessible to the host to assist with management of the memory. For example, the memory controller can store a table with information for each logical unit or physical unit spanning the entire memory managed by the controller. The data provided to the host can be the stored information itself, or the result of processing or filtering performed by the memory controller based on that information. In detailed embodiments, the memory controller includes logic that processes host queries and that provides data back to the host responsive to those queries. Further, the information stored by the memory controller can include status information (that is, information regarding the state or history of either a unit of memory cells, or regarding the state or history of logic contents of those cells); some non-limiting examples of such information are depicted in FIG. 6. The data provided back to the host can either be generated synchronously (in response to host trigger) or asynchronously (i.e., only upon satisfaction of a processing condition). Once in receipt of the data, the host can then electively take action in dependence on that data.

In one embodiment, the stored information can include one or more fields of metadata representing each erase unit (EU) or physical page of a flash memory. Examples of data that a memory controller could provide to the host responsive to this data include (i) extent to which a set of constituent pages of a particular EU have been released, (ii) a list of unerased EUs in order of amount of stale space (e.g., candidates for space consolidation), and (iii) data representing frequency of individual page or EU usage; naturally, these examples are non-limiting. Note that a host within this context can be any integrated circuit or other apparatus (e.g., such as virtual or actual machine) that is separate from the memory controller and that transmits a request to the memory controller for some type of processing or response. In one embodiment, the memory controller has interface logic that permits a host to request any of these pieces of information by issuing respective commands. To provide an example of an action a host could take based on this exemplary information, a host armed with this information can issue an erase command directly addressed to a specific EU of memory. Similar examples exist for garbage collection, space reclamation, wear leveling and other memory management functions.

Note that in one embodiment, this infrastructure can be employed to substantially eliminate the need for a flash memory controller to implement a flash translation layer (FTL). That is, a flash memory controller can maintain per-subdivision data, which is accessible to the host (e.g., retrievable by, or against which the host can issue function calls or queried). The host uses this information to issue new write commands that are targeted to specific physical locations in flash memory, thus substantially avoiding the need for translation at a memory controller, and reducing the likelihood of uneven wear. In addition, the host receives alerts, and issues queries as necessary, to ensure that it is generally apprised of events that signify the presence of wear, cold data, excessive "released" space and low available memory space and so forth. This information is then advantageously used in host-dictated scheduling of maintenance operations in flash memory, such that those operations do not interfere with writes and reads needed by the host. To provide one optional implementation illustration, in a storage aggregate having multiple storage drives, maintenance operations can be scheduled by the host for a first drive (and delegated to a memory controller for that drive) while the host is occupied with transactions directed to a second drive, i.e., the maintenance for one drive is "stacked" behind operations in another.

In embodiments below, a memory controller facilitates these actions by maintaining a stored repository of information, for each physical subdivision of memory, and updating this information as memory transactions are processed, e.g., as pages are released, and other events such as wear and defects transpire. If supported by the specific implementation, the host at any time can issue "synchronous" commands to the memory controller for an immediate return of information. Also if supported by the implementation, the host can issue asynchronous commands, which for example, cause the memory controller to "automatically respond" if and when a specified threshold is reached. The host has software which periodically issues these queries, maintains data necessary for L2P translation, and responsively schedules maintenance operations such as wear leveling and garbage collection. That is, host commands advantageously equate physical and logical space from the vantage point of the flash memory controller, because those commands directly address physical pages, EUs or other unit that are the target of intended operations, with at most insubstantial address translation in the memory controller. For example, in an overwrite (copy-on-write scenario), the host is made aware of a new memory location available for writes and directly writes modified data to the new memory location; while the flash memory controller can keeps track of metadata such as page release status, the host tracks the updated page address including any logical to physical translation and therefore can directly address it in the future (e.g., using the physical address). Note that the flash memory controller can still perform some mapping and address translation, even in this scenario—as one example, if a write error occurs, the memory controller can itself remap logical space on a limited basis to available memory space (e.g., with or without notifying the host). Even if the host is not immediately informed of the remapping, the discrepancy between physical and logical space will eventually be worked out through garbage collection and bad block management, and the host ultimately consolidates remapped data in physical address space that is directly addressed by host commands.

Employed in the context of flash memory, these techniques can help mitigate the concerns mentioned above, and thereby facilitate greater usage of nonvolatile memory in direct direct-attached and/or network-attached storage environments. That is, the techniques presented above can help reduce flash control bandwidth competition with host-initiated reads and writes and can help minimize write amplification. These techniques, in turn, can help substantially eliminate the need for an FTL as conventionally used, which leads to further efficiencies. By redefining host and/or controller responsibilities, host-controller management features duplication and associated disadvantages can also be avoided, leading to a simpler and less expensive memory controller design.

For example these techniques facilitate better pipelining of commands in flash memory systems. In an implementation where there is no FTL table that must be loaded into a flash memory controller, and no associated search tree, flash memory is capable of servicing host read requests more quickly. The reduction of write amplification and controller-initiated erase, wear leveling and garbage collection operations reduces unintended competition with host-initiated commands, i.e., the host is far less likely to find flash memory "busy" when it seeks to have a command filled, because the host is vested with scheduling of the potentially competing functions. In turn, the better pipelining permits a host to more easily interact with a storage aggregate having one or more discrete flash drives, optionally including other types of storage drives (i.e., mixed or non-homogenous memory).

In another embodiment, this disclosure provides for cooperative interaction between a host and memory controller where the host manages logical to physical (L2P) address translation. The host stores a L2P translation table; when the host has a need to issue a command to memory, it performs translation and directly addresses specific storage units in memory. In this manner, a memory controller (e.g., a flash memory controller) does not need to perform local address translation that might add latency in responding to host commands. Optionally, the memory controller of this embodiment uses the stored information for each of multiple subdivisions of memory, as referenced above.

This disclosure therefore also provides storage systems, hosts, network-ready storage servers, methods, software and other implementations consistent with the principles introduced above. Generally speaking, the techniques disclosed herein can be implemented in any one or more of these components, in a manner where a component can be designed, manufactured and/or sold for optional inclusion in a complete storage system having a host, memory controller and memory. Consistent with these principles, one implementation of the techniques referenced above is in a storage system having at least one memory controller and memory. Each memory controller and its associated memory can be bundled together as a storage drive and, in one implementation, the storage system includes plural storage drives, at least one of which is a solid-state storage drive (SSD) based in nonvolatile memory such as flash memory. Each memory controller maintains the information referenced above for each associated physical subdivision of memory, in one embodiment, for each unit of memory representing a smallest group of memory cells that can be erased in a single operation. The information maintained for each subdivision by the memory controller can optionally include one or more of:

whether the respective subdivision has been marked as bad;

whether a memory operation is currently in progress in the respective subdivision;

number of erase operations performed on the respective subdivision;

a period since data was last programmed within the respective subdivision;

number of reads to memory within the respective subdivision since last erase;

a logical address for data stored in the respective subdivision;

a number of pages released within the respective subdivision;

a number of pages used within the respective subdivision;

information representing page usage for all pages within the respective subdivision;

whether the respective subdivision has been programmed out of order relative to others of the plural subdivisions; or whether the respective subdivision has been assigned to defect management.

Other types of information can also be stored by the memory controller.

In one contemplated implementation, each subdivision is an EU or page of NAND flash memory, and a NAND flash memory controller can provide a map to the host indicating relative information (e.g., page utilization) for all subdivisions of the specific drive or a storage volume spanning multiple drives. Alternatively, the flash memory controller can provide filtered or derived information based on such a map to the host, for example, a listing of EUs best suited for space consolidation based on some threshold applied by the flash memory controller. Such a threshold can be defined as a default and/or can be dynamically programmed by the host (e.g., by asynchronous command).

Figure 1:
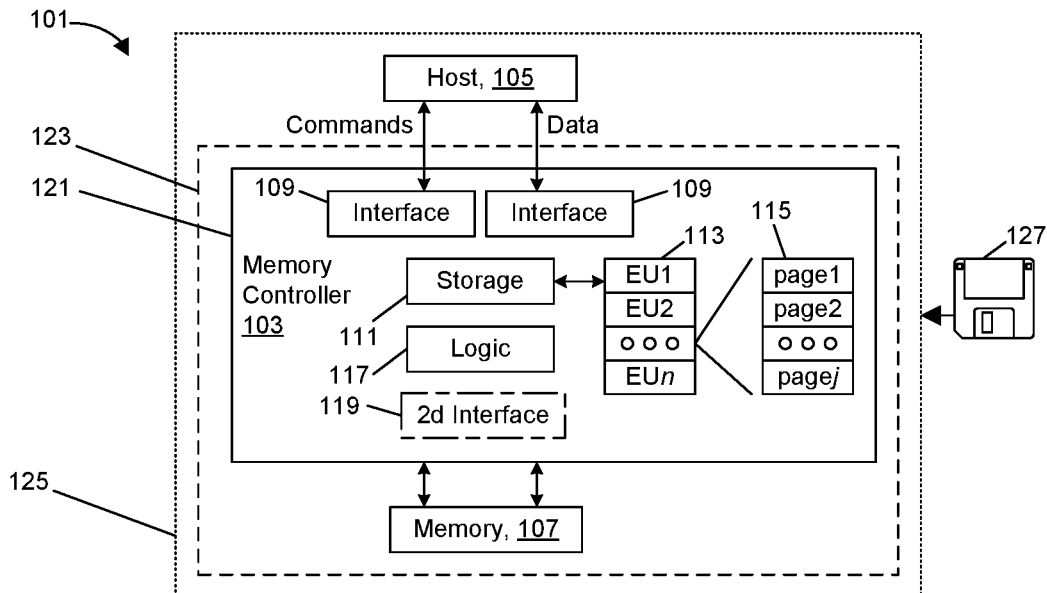
FIG. 1 is an illustrative diagram of a system having a memory controller 103, a host 105 and a memory 107.

FIG. 1 illustrates a first embodiment of a storage system 101 and associated memory controller 103, host 105 and memory 107. In the illustrated embodiment, the memory controller is structured to cooperate with the host 105 in the control of the memory 107. The memory controller 103 has at least one first interface 109 to exchange commands and data with the host. Although two such interfaces and corresponding transmission paths are seen in FIG. 1, these interfaces may be combined (e.g., with communications occurring via a packet-based transmission scheme). The commands generally relate to operations in memory such as read and write operations, although commands can also be directed to the memory controller 103 to assist in memory functions. In one embodiment, the commands and signaling protocol are compatible with one or more standards, for example, with Non-Volatile Memory Express (NVMe) or the Small Computer System Interface (SCSI) (in the case of commands) and Peripheral Component Interconnect Express (PCIe) or Serial-Attached SCSI/Serial ATA (SAS/SATA) (in the case of signaling formats). The memory 107 generally has an array of memory cells and array control circuitry that may support one or more planes or banks depending on design. The memory core in turn has one or more subdivisions of memory cells for which subdivision-specific usage data will be tracked by the memory controller 103. In embodiments where the memory is flash memory and the memory controller a flash memory controller, each subdivision can include one or more erase blocks or units (EUs), with each EU having a minimum number of memory cells that must be erased at once.

The memory controller tracks subdivision-specific-usage data using internal storage 111. In one embodiment, this storage can be volatile memory such as synchronous random access memory (SRAM); in another embodiment, this storage can be non-volatile memory, for example an internal flash array. As denoted by reference numeral 113, the storage retains information for each subdivision of the memory governed by the memory controller, in this case, for a physical subdivision of the memory 107. In embodiments where the memory 107 is a NAND flash memory, the storage retains information for each EU or physical page of the flash memory (e.g., EUs 1-$n$ as indicated by reference numeral 113). Note that for flash memory, each EU can also correspond to multiple pages, as indicated by numeral 115 (e.g., pages 1-$j$). For example, depending on manufacturer and design, there can be 128-256 pages per EU, with each EU corresponding to a substrate well, and each page corresponding to an independently controlled wordline for memory cells tied to that substrate well. The memory controller also has logic 117 that is operable to send to a host either some or all of the "raw" information retained in the storage 111, or derived or processed information based that storage 111. This logic for example can include circuitry within the memory controller that is adapted to respond to host commands seeking specific data; alternatively, this logic can also include circuitry that applies pertinent filters or comparisons and that notifies the host when a tracked metric meets an assigned threshold. This information or an alert representing a particular condition can be transmitted to the host via the at least one first interface 109, via a dedicated connection or via a backplane connection.

Several configurations are also represented by the embodiment of FIG. 1. First, as represented by numeral 121, the memory controller 103 can be designed as a standalone integrated circuit with the host 105 and the memory implemented as one or more discrete integrated circuits (e.g., the host in the form of a host processor). Second, as represented by dashed-line box 123, the memory controller 103 can instead be co-packaged or otherwise combined with the memory 107 as a storage subsystem. For example, dashed-line box 123 can represent a discrete solid-state drive (SSD) where the memory controller is implemented as an IC and where the memory is embodied as one or multiple NAND flash devices. It is also possible (as represented by dotted-line box 125) to combined the memory controller 103, the host 105 and the memory 107 as a single system, for example, a network-attached storage system or a storage system adapted for connection with another digital system (e.g., via a USB, PCIe, SATA, Ethernet or other standard signaling protocol). Finally, as represented by reference numeral 127, cooperative management functions can be embodied as instructions stored on non-transitory machine readable media, for example, for use in controlling a host processor, memory controller or other circuit. That is, software or firmware can be used to control actions of a host, memory controller or other circuits.

Figure 2:
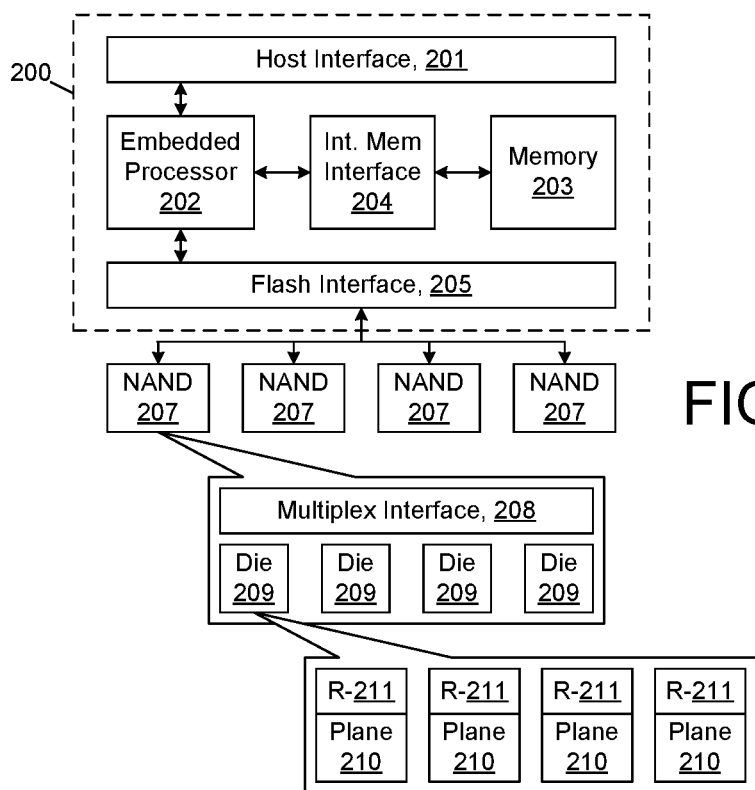
FIG. 2 is a block diagram of a solid-state drive (SSD) having a memory controller and NAND flash memory 207.

With principle parts of a cooperative memory system thus introduced, this disclosure will now proceed to a more detailed discussion of examples of memories, memory controllers, hosts and systems that implement principles of this disclosure. Generally speaking, FIG. 2 is used to provide additional detail on a NAND-flash implementation (e.g., a solid-state drive having flash memory and a memory controller). FIGS. 3A-13 are used to provide additional detail on a cooperative memory controller that implements principles of this disclosure, including various types of usage information that can be tracked in various embodiments and ways in which that information can be used to facilitate cooperative host-memory controller management of memory. Finally, FIGS. 14-19 will be used to describe possible system implementations, including a storage server and a heterogeneous memory system.

II. Architecture of an Exemplary, Cooperative Flash Controller.

FIG. 2 shows a solid-state drive (SSD) having a memory controller 200 and NAND flash memory comprising one or more NAND flash memory devices 207. The flash memory controller 200 includes storage to store information for each subdivision of memory as referenced above, as well as logic that services host commands relating to that information. The logic is partially in the form of an embedded processor 202, which receives commands from the host and fulfills those commands under the auspices of firmware. This logic and firmware will be further exemplified below in reference to FIGS. 3A and 3B, but for purposes of FIG. 2, it is noted that this logic relies on internal memory 203 including volatile storage (e.g., DRAM, or another very low-latency storage technology, for example, using a double-data rate or "DDR" signaling scheme) and nonvolatile storage (e.g., internal flash memory for the firmware). The memory, and associated firmware and data, are accessed via a dedicated interface 204. Once again, in one embodiment, the flash memory controller interacts with a host using exchanges of commands and data that are compatible with one or more well-known communication standards, such as NVMe or SCSI. Each of these standards provide for commands to be sent from an initiator (such as the host) to a target (such as a storage device). Signaling formats used by these commands structures can follow any desired signaling standard, for example, a version Peripheral Computer Interconnect Express (PCIE), serial ATA (SATA) or another signaling standard. The interaction can take the form of commands for memory transactions (e.g., read and write transactions), configuration commands to the memory controller (e.g., asynchronous commands), query commands (e.g., commands for synchronous or asynchronous returns of information based on memory controller processing requested by the host), and alerts and returns of various operating codes and other information from the memory controller. Generally speaking, a "synchronous command" as used herein will refer to a command to the memory controller which initiates a function in the memory controller that returns a result as soon as processing is completed. A synchronous command is analogous to a query. An "asynchronous command" as used herein will refer to a command that requests a return only once another condition is satisfied. Such a return of information can be triggered immediately (e.g., if the condition is already satisfied) or in the future (e.g., the memory controller alerts the host immediately and without solicitation when a condition specified by the host is later satisfied). An asynchronous command can be thought of as the host setting an operating mode or condition in the memory controller, e.g., setting a mode calling to trigger an immediate alert if previously released space exceeds a host-specified level.

To perform input/output (IO) operations, controller firmware interacts with a low-level flash memory interface 205 to translate high-level IO commands into flash memory operations. In this embodiment, the flash memory consists of one or more NAND storage devices (e.g., integrated circuits) 207, each coupled to the flash memory interface 205 via a multidrop channel. Each device 207 includes a multiplex interface 208 that connects to one or more co-packaged dies 209. Each die can have one or more planes 210, each with independent control and data registers 211, so that each die is capable of performing multiple IO commands simultaneously (e.g., an operation for each plane). These registers and respective planes can be delegated commands (e.g., programming commands) by the memory controller, or alternatively, the memory controller can use a fractional programming scheme. Following SCSI protocol tradition, a logical unit (LUN) is used to refer to the smallest device unit addressable by IO operations.

As mentioned, the controller can serve detailed information to the host for each subdivision of memory, and the host can also issue query requests to the memory controller, designed to assist the host with management of the bandwidth-consuming functions referenced above. Advantageously, to avoid delays associated with memory-controller-resident address translation, the host sends IO requests to the memory controller that directly specify physical address. Note that for a NVMe compatible embodiment, the predicate of direct physical addressing can be supported simply by configuring the memory controller to manage the host-specified address as a physical address, or otherwise with limited memory-controller-side address translation. The performance of commands (e.g., management of multiple program-verify cycles, or "P/V" cycles, of one write command) is then managed by the memory controller which alerts the host upon command completion. The meaning of the physical address in this context depends on flash memory geometry but, in this embodiment, includes multiple fields. These fields can identify for example the number of a communication channel within the flash memory interface 205, the number of a device 207 connected to that channel, the number of a die 209 within that device 207, the number of a plane 211 located on the die 209, the location of a block within the die 209, and the location of a page within the block. Thus, physical address in this embodiment includes a quadruple of channel, device, die and logic unit number (LUN).

Figure 3A:
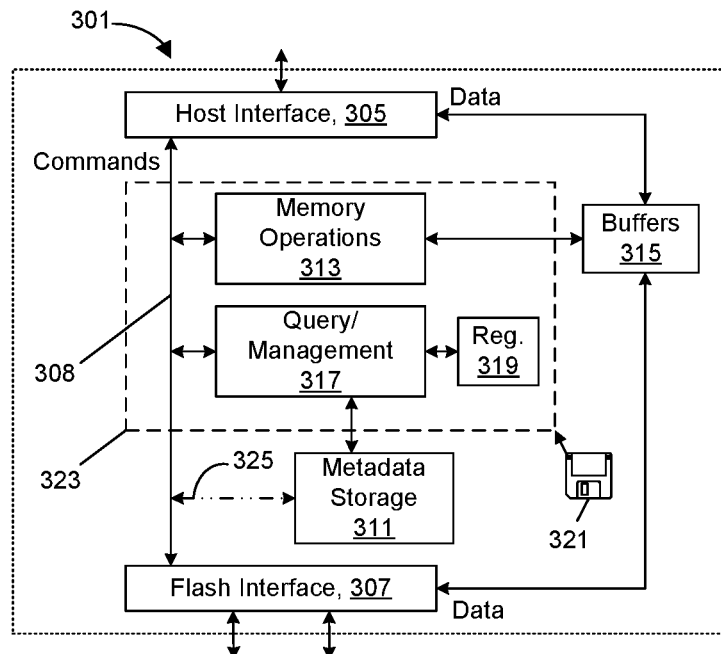
FIG. 3A is a block diagram of a memory controller.

FIG. 3A helps illustrate layout of one possible flash memory controller, with an emphasis on command processing. In particular, the flash memory controller can be implemented as a single integrated circuit 301. As before, a host interface 305 is used to exchange commands and data with a host, and a flash interface 307 is used to issue commands to and exchange data with one or more flash memory devices (not shown in FIG. 3A). Note that in this embodiment, a single path is illustrated as coupling the memory controller with the host, for packetized exchange of both commands and data; that is, the host interface can include logic that extracts commands and data from request packets, and can also packetize read data, alerts, metadata and other communications to the host. Other implementations are also possible, for example, using separated command and data busses. In the scheme depicted in FIG. 3A, it should be assumed that the host interface has a high speed serdes interface, such that communications with the host occur over one or more differential signaling paths, for example, compliant with a PCIe, SATA or other signaling scheme. Note that one or more flash devices can be copackaged with the memory controller, and thus the flash interface 307 does not necessarily have to use the same signaling scheme as the host interface, e.g., communications can be via wide-bus single-ended communications, using command and data busses.

The host interface 305 separates controller commands from any received packets (as necessary), and routes these commands over a command bus 308 internal to the flash memory controller. Generally speaking, commands will relate to memory operations (e.g., reading or writing of data) or to queries for data and memory management functions. To this effect, separate logic blocks within the memory controller are dedicated to each of these functions.

A memory operations logic block 313 manages operations involving the memory device. For example, as is well-known, NAND flash memory typically utilizes incremental programming—that is, array control circuitry for the flash memory device uses a minimum programming voltage, and results of programming are checked against contents of a write data register to determine whether those results are correct. This is performed using a "program-verify" (P/V) cycle having separate "program" and "verify" phases. During validation, a programmed page is typically sensed and an exclusive-or function is performed with contents of the write data register; for any bits that remain set, programming has not been effective, so the programming voltage is raised and the process repeated in a second P/V cycle. This process typically continues until proper programming has been achieved or some limit has been reached, the latter case resulting in a write error. The memory operations logic block 313 performs control over these various phases of programming using buffers 315. Since a memory device can include multiple planes (as discussed above), the memory command processing logic block 315 optionally uses multiple buffers, for example, with one dedicated to each plane or with buffers assigned on a rotating basis for individual commands received from the host. The memory command processing logic block also manages any functions of reporting write error and consequent remapping of data, as well as updating L2P mapping information in metadata storage 311 (for embodiments that perform such mapping). Note that this information can be part of a much larger class of metadata indexed by EU as discussed above (see, e.g., FIG. 6 and the accompanying discussion below for examples on types of information that can be tracked using this storage).

Commands relating to the return of query information (e.g., synchronous commands) or the setting of an operating mode (e.g., asynchronous commands) are sent to query/management logic block 317. Generally speaking, the host can request (a) return of raw information for the entire memory space managed by the memory controller, or for specific address ranges or EU ranges, or (b) processing or filtering of that data by the memory controller. For example, as referenced previously, the memory controller can be provided with logic operable to receive and interpret host commands for lists of blocks, e.g., the "top ten" candidates for garbage collection, ranked in order of page (under) utilization. Since the purpose of such an operation is to identify EUs for erasure, a memory controller receiving such a command interrogates the metadata storage to (a) identify EUs that are at least partially in use, (b) identify the extent of page utilization for each such EU, and (c) order a set of EUs that are candidates for erasure in the order of greatest number of released pages. The query/management logic block 317 uses internal registers 319 to manage functions like this and, when the requested processing is complete, the query/management logic block sends a reply message to the host with the requested information. Note that the host interface 305 includes buffers that receive this data, and queue the data for transmission to the host (e.g., as a reply packet that may be distinguished from read data). The mentioned example is only one type of query that can be processed by the host, i.e., there are many types of requests and queries that can be processed by a memory controller of the present disclosure. A skilled designer can implement any type of management processing desired. This request is an example of a synchronous query, because data is on-hand for the memory controller, and because the memory controller returns requested data as soon as its query processing is complete. In a simplified case, the host can request return of raw metadata. For asynchronous queries or functions, the host typically provides a parameter (such as a mode setting and/or a host-selected threshold of some type) and the memory controller then operates a continuous or intermittent process to check for the specified condition; when the condition occurs, the memory controller immediately alerts the host, typically providing information that triggered the alert (such as EU identity and metadata for the EU pertinent to the function being tracked). That is, if the condition does not occur, there is no responsive alert sent to the host, and the condition is monitored for occurrence at any time in the indeterminate future. As should also be apparent, sophisticated queries can be run that involve multiple metadata parameters. For example, a host might request an alert any time a partially written EU simultaneously reaches a specific page utilization threshold (e.g., less than 50% utilization) and has a time since last data access greater than a second threshold. Many examples of asynchronous processes are possible and will no doubt occur to the skilled memory architect. Once again, any suitable thresholds or modes are stored in registers 319.

A media icon 321 is depicted to indicate the use of software or firmware by the memory controller. The memory operations and query/management logic blocks 313 and 317 and registers 319 are all depicted within a dashed-line box 323 denoting that, in one implementation, these elements can optionally reside on a single die (e.g., a single processor or coprocessor); in such an embodiment, the media icon 321 typically denotes the use of firmware, for example, stored in memory within the single die in question. In this regard, such firmware can be designed to respond to vendor-specific NVMe extensions to implement specific query/management functions. For example, any desired asynchronous query can be implemented as a function call supported by firmware; when the asynchronous command in question is triggered, it is run as an open process in the die (323) or a coprocessor dedicated to the query/management functions. Alternatively, many processors can be provided, each assigned queries/asynchronous processes as they are invoked. As implied earlier, a specific asynchronous process can be associated with a mode set by the host; for example, in one mode defined by the host, the memory controller can automatically alert the host any time it identifies a space reclamation (garbage collection) candidate, based on default or host-identified parameters—in a second mode, this function is turned "off." Note that in the future, newer versions of standards such as NVMe can be structured so as to inherently support generic commands calls consistent with the operations discussed above.

The metadata storage 311 is indicated as separate from dashed-line box 323, reflecting that the metadata storage optionally can exist independent of the processing logic, e.g., on a separate die. That is, in one embodiment, the metadata storage consists of nonvolatile memory, such that it is persistent in through power cycling. In another embodiment, the metadata storage can exist in SRAM (e.g., internal to optional die 323), with data switched to nonvolatile memory and loaded back again in response to power cycling. In still another embodiment, as denoted by optional connection block 325, the metadata storage can be read directly by the host, i.e., via a form of commands for direct memory access. In such an embodiment, the host simply reads a special memory location which it knows will contain metadata for a specific EU or EU range, or for the flash memory as a whole.

Figure 3B:
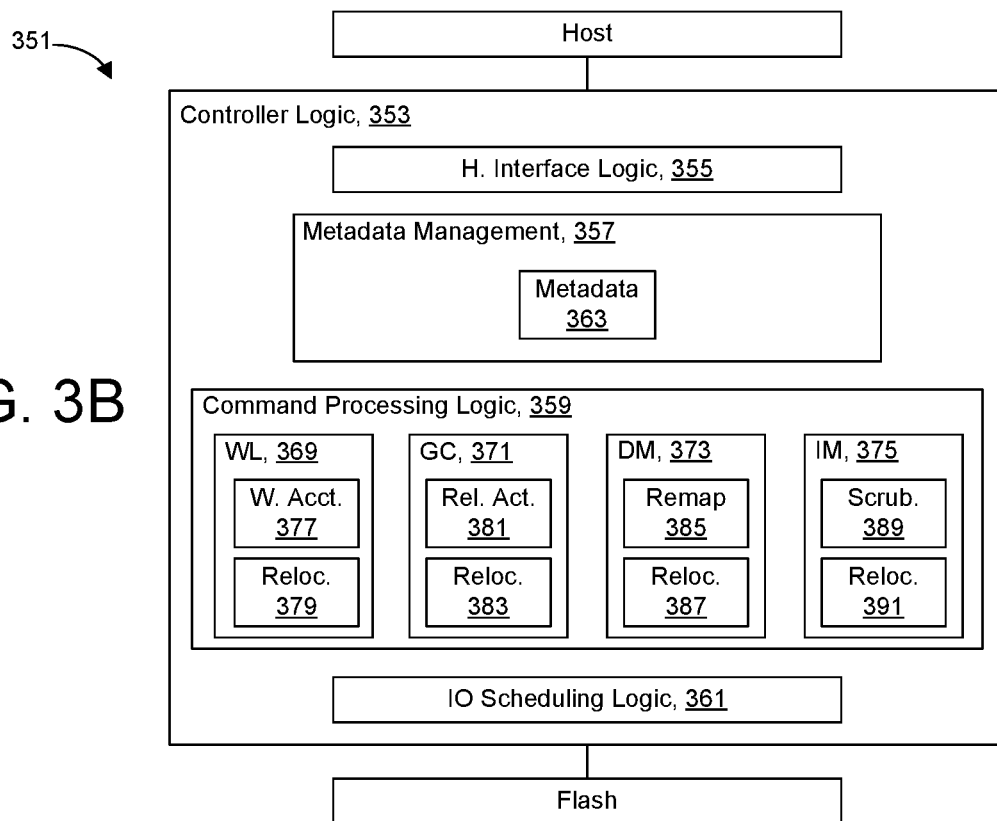
FIG. 3B is a block diagram of memory controller logic used in supporting cooperative functions.

FIG. 3B shows a block diagram of a cooperative memory controller 351; more particularly, FIG. 3B is used to show how logic functions can be implemented using hardware and firmware logic 353. This logic 353 supports a number of optional processing features. In one embodiment, this memory controller uses this logic to perform many traditional flash controller functions (e.g., management of an FTL and associated search trees). This is to say, while one advantage of the memory controller 351 is the substantial reduction or omission of an FTL layer, this is not required for all embodiments. In another embodiment, the memory controller implements comprehensive cooperative functions that help reduce the need for complex FTL processes, as referenced above. In each embodiment, the memory controller 351 serves to the host unit-specific information for all units of memory governed by that memory controller; with this information, the host can directly address specified physical locations, thereby substantially reducing or obviating need for complex FTL processes resident at the memory controller.

For the embodiment of FIG. 3B, logic 353 is seen to have a number of basic function blocks, including interface logic 355 to interact with the host using packetized commands and responses, logic 357 used for local metadata management, command processing logic 359 used for query processing and other management functions, and IO scheduling logic 361 used to manage memory transactions (e.g., program and erase operations). As noted, even in an embodiment where it is desired to substantially reduce the FTL layer, a memory controller can still optionally implement some address translation, for example, for defect remapping as well as other functions. This will be described below. The metadata management logic 357 maintains locally-stored information in the form of metadata 363, as mentioned, for each unit of memory of the memory device. Non-limiting examples of information that can be tracked are once again discussed below in connection with FIG. 6. This information can include L2P or P2L mappings for each memory unit; that is, as discussed below, even for an embodiment where the host uses direct physical addressing, a scheme of shared address assignment responsibility can be implemented, with the memory controller assigning physical addresses based on an initial logical address specified by the host, with the memory controller reporting back assigned physical address(es) to the host, for the host to build a L2P table for future reads to the data. This shared addressing scheme can also optionally be employed for certain other delegated functions, e.g., valid data relocation, unit erase, garbage collection, defect management and other functions. Note that this is not required for all embodiments, i.e., as will be detailed below, a host can also support these functions and dictate physical addresses for new writes. In many embodiments described below, an adaptable memory controller architecture will be described, providing implementation flexibility in assigning specific tasks to either host or memory controller. To these ends, the metadata management logic can include structure to assign physical address and generate updates to stored metadata 363 and to report back to the host an index of physical locations assigned the newly-written file for situations where address assignment is to be performed by the memory controller.

To provide another example of use of a limited address translation scheme notwithstanding address directed by the host, the memory controller can be configured to identify write error and to transparently remap the subject data over to reserved memory space. Because such reassignment might affect only a very small portion of data written to memory, the memory controller can advantageously keep track of this reassignment using the metadata 363. Future reads specifying the remapped EU are intercepted by the memory controller logic using locally-stored metadata 363 and redirected to the proper physical location in memory for defective blocks. In this manner, the memory controller is freed from having to implement extensive search trees to find physical locations based on supplied logical addresses, i.e., the memory controller need only track defective memory reassignments, which ultimately become stale as the memory controller progresses through erase operations, garbage collection and updates of data (the latter being directly written to new pages or EUs). Note that such addressing can be made even simpler if memory controller simply allocates remapped space to a reserved EU using a like page assignment.

The command processing logic 359 receives commands from the host directed to general configuration of memory operations and for queries. Generally speaking, this logic manages and updates the metadata 363 and runs queries on the metadata, returning information to the host as appropriate via the host interface logic 355. The returns to the host can be immediate returns to synchronous commands and immediate or later responses (or alerts) to asynchronous commands. Exemplifying some command options, the command logic can (a) serve information up to the host drawn from metadata 363 for use in wear aware writes, and (b) assist with wear leveling (WL), garbage collection (GC), defect management (DM) and integrity management (IM) functions in memory. Note that in network storage applications with multiple drives, this further enables certain novel host capabilities, as will be described in the section dealing with an exemplary storage system further below. Note also that in some embodiments the host can also directly access raw metadata, e.g., as a form of direct memory access.

An exemplary memory controller can assume varying levels of host support in a manner that can be customized to any specific memory system design. That is, memory controller 351 possesses dedicated logic infrastructure to perform WL, GC, DM and IM specific functions (369, 371, 373 and 375, respectively), each of which can be tailored to a specific level of interaction with the host pertinent to the specific implementation. Depending on the desired level of interaction, the memory controller 351 helps avoid the need for remote storage and retrieval of large address translation tables and the use of complex search trees, e.g., address translation can be performed using a greatly simplified address translation table or omitted in the memory controller entirely. In addition, the configured level of cooperation can advantageously permit a host to directly assume scheduling of many flash management functions that might interfere with (i.e., compete with) host-directed writes, such as garbage collection, data relocation, wear leveling and so forth. That is to say, an architecture will be described below that permits a memory controller to serve sophisticated information to the host to assist with this scheduling. This, combined with less FTL overhead, provides for faster, more consistent flash response, and facilitates multiple drive storage aggregates based on solid state (flash) drives (SSDs) as well as mixed or heterogeneous systems that combine SSDs with other memory types.

Note that this is an example only, e.g., the architecture described herein can optionally also support a traditional FTL design, or memory controller management of complex functions.

To assist with host scheduling of flash management tasks, the memory controller can have firmware or hardware logic (or both) dedicated to specific types of host commands and host queries. In the embodiment of FIG. 3B, this structure is illustrated as optionally including structure to assist with wear leveling (WL), garbage collection (GC), defect management (DM) and integrity management (IM) functions, but other functions or logic can also or instead be used. To support these functions, the memory controller uses command processing logic 359 to manage space allocation and space reclamation, and otherwise to service host calls for the return of management data. For example, this command processing logic can facilitate direct physical addressing by identifying for the host available (i.e., available, erased) address space, candidates for erase (released space), candidates for data relocation and garbage collection (e.g., based on low page utilization), assistance with cold data location (e.g., wear leveling), or more general functions.

For both embodiments that use wear-aware writes as well as those that do not, the memory controller can include wear leveling logic 369. That is, to account for a limited number of flash memory P/E cycles (typically on the order of tens to hundreds of thousands of cycles for NAND flash), the logic on board the memory controller can be designed to track wear as part of metadata 363 and to provide this information to the host. If over time, certain units of memory are determined to represent disproportionately high or low wear relative to overall memory, wear leveling can then be performed. Note that for embodiments where wear-aware writes are used, wear leveling can be highly localized, i.e., performed as a data relocation option simply to redistribute cold data. The memory controller 351 can generate alerts when predetermined wear thresholds are reached, and can otherwise perform low level queries relating to wear leveling. In support of the techniques presented by this disclosure, the wear accounting logic 377 can keep a changing-list of EUs, ranked in order of coldest data, least wear, greatest wear or in another manner. In one embodiment, this logic can be prompted via an explicit host command to synchronously compile such a list or to asynchronously notify the host of EU identity any time a wear metric (e.g., EU erase count) exceeds a programmably-defined value. Then, when and as wear leveling is scheduled by the host, the host issues a command to the memory controller to relocate cold data and erase the old space (e.g., using relocation logic 379), thereby redistributing that space into a pool of available space used for active writes (and potentially more frequently-cycled data). Note that in an embodiment where the host directly addresses physical space and performs wear-aware address assignment, distribution of wear can be inherently minimized as part of the write process. However, disproportionate wear can still occur for data that is held for a long time and which is therefore deemed "cold;" that is, cold data can keep EUs out of circulation while other EUs are more frequently recycled. The memory controller architecture presented by this disclosure supports memory controller cooperation with wear management through the use of "limited" data relocation and wear leveling processes (e.g., directed only to specific address ranges within flash) as well as (if pertinent to the implementation), the scheduling and management of more extensive wear leveling, e.g., for entire flash devices or across multiple flash devices or drives.

As discussed earlier, a copy-on-write process can result in retaining old pages in flash memory that are stale. This is because a given EU can have other pages that are still in use, and the old page location typically cannot be reused until the entire associated EU is recycled. Over time, substantial portions of flash memory can be locked up simply because a small fraction of space in many respective EUs is still in use. This situation can occur whether the host or the memory controller performs address translation. To address this, the memory controller of FIG. 3B therefore uses garbage collection logic 371 to assist with functions of periodically consolidating data. That is, the garbage collection logic can track information pertinent to whether an EU is mostly stale or is still efficiently being used and can process host queries relating to this information. One form of this tracked information is page utilization information, e.g., where the memory controller stores information indicating whether each page in a given EU is available (erased but not yet written), has valid data (cannot be written to without an erase), or is released (a page with stale data that cannot be rewritten until it is first erased). Garbage collection involves accounting for released pages, for example, using release accounting logic 381 to track the mentioned page utilization information for each page (or other logical unit) for each EU; EUs with relatively few used pages can have those pages consolidated with pages from other EUs having similarly low page utilization, with the then-concentrated valid date being rewritten to a new destination. In an embodiment where the memory controller tracks this information, the memory controller can compute an extent of page utilization (e.g., 10% valid data) and can provide this information to a host with EU identity to permit the host to decide which EUs should have data consolidated and moved. The host can then schedule any resultant operation in a manner that does not compete for needed read data elsewhere in the subject memory. Note that "page utilization" as used herein generally refers to the extent to which pages of a given EU are valid (in use) or are stale or not in use. For example, if most pages in a given EU were stale or unused and only a few pages of the EU had valid data, the extent of page utilization in the given EU would be low. Conversely, if most pages in an EU were in active use, the extent of page utilization for the given EU would be high.

In an embodiment where the host cooperates with the garbage collection task, the host can query the memory controller using a command, with processing of the command performed in cooperation with the release accounting logic 381. In more detailed embodiments, the release accounting logic can be designed to perform low level inquiries, for example, to return a list of EUs where page utilization falls below a specific threshold (e.g., 50%). This type of function can also be managed as an asynchronous task, e.g., the host can request that the memory controller alert the host if at any time an EU that has been written-to (or that has just had a page released) experiences less than a threshold level of page utilization; in this regard, the release accounting logic 381 tracks explicit page release with each command information update, and can perform any processing necessary to alert the host in response to any asynchronous queries. The release accounting logic 381 also has circuitry and/or firmware that performs other forms of processing, for example, optionally providing a list of "the 10 best" candidates for garbage collection in order of page (under)utilization. In another embodiment, some or all of the data relocation functions can be managed by the memory controller, for example, with relocation logic 383 being delegated specific tasks by the host (such as the identification of EUs to the host for relocation of data, or relocation of data in response to a host-specified target memory address). Once relocation has been performed, with respective L2P mappings updated and associated physical pages are released, the full EU is reclaimable. In one embodiment, this is performed by the host, which issues an explicit EraseBlock command for an address-specified EU—logic 355 processes this command and, once the command is completed, returns the freed EU to a pool of available EUs for future data allocation.

Write and erase errors discovered by the flash memory controller are handled by defect management flash management logic 373. Pages found defective due to write error are remapped by defect remapping logic 385, with write operation retried transparent to the host. The original page in error is marked defective or "bad" and added to a bad block list or map to avoid further use of associated physical pages. Unit relocation logic 387 performs background relocation of data that experienced write error to minimize possibility of further write errors. Unit erase errors are handled by the defect management logic as well, with defective EUs also reflected on a bad block list kept by the flash memory controller. As indicated, in such a scheme, the entire EU can optionally be moved, preserving relative page layout and simplifying translation issues.

While flash memory typically provides strong error detection and correction (EDC), the memory controller may also provide onboard data integrity management logic 375. Data scrubbing logic 389 is responsible for background data integrity checks based on EDC or additional data integrity metadata. Suspect blocks with transient errors identified are relocated by suspect relocation logic 391 using mechanisms similar to wear leveling and garbage-collection relocation processes described above.

As operations are performed in memory, whether as part of a management operation (such as data relocation) or in servicing a write or read command, IO scheduling logic 361 detects completion of the command. Pertinent information is added by metadata management logic 357 to the stored metadata 363 for the pertinent EU, and the host is then signaled with any completion codes as necessary. For example, if a data relocation operation has been performed, the metadata 363 can be updated with new information for both source and target blocks of memory (e.g., new page release information, L2P and P2L mapping, wear information and so forth), and the host can be signaled with new physical addresses for relocated valid data.

Note that, depending on embodiment, the flash memory controller can support one or more of the functions or units of logic described above, i.e., a memory controller can include subsets of the described logic to assist in the performance of specific tasks. For example, one hypothetical memory controller could omit the data relocation logic 383 if the host was to perform this function. Also, other logic functions can also be supported or provided for beyond those discussed. As mentioned, the embodiment of FIG. 3B presents a single memory controller architecture adaptable to multiple, different implementations, but this is not required for all embodiments.

Clearly, many examples exist for the layout of a cooperative memory controller. In various embodiments, these layouts can support different cooperative functions. FIGS. 4-13B are used to provide non-limiting examples of different types of functions that can be supported.

A. General Flow.

As discussed above, a cooperative flash memory controller can participate in and support periodic management tasks, such as relates to defect management, wear leveling, and garbage collection. A given task (e.g., an asynchronous task) will typically have an associated management condition that is triggered when a specific, tracked parameter exceeds a predefined threshold. Once the management condition occurs, data which triggered the condition is evaluated by the memory controller, the host or both based on pertinent metadata. Depending on implementation, individual management tasks and the need for action can be addressed solely by the memory controller, solely by the host (e.g., based on reported information), or cooperatively by both the memory controller and the host. That is to say, in any given embodiment, provision can be made for the handling of any one or more of the management tasks described above on a cooperative basis. In addition, these functions can also be made multimodal, i.e., invoked by components that invoke controller-owned processing, host-owned processing or cooperative processing, dependent on system design or implementation. That is, a typical implementation can feature a single flash memory controller design which is customizable to a number of different memory systems or system configurations; depending on features supported by the specific system (e.g., the specific customer), the memory controller can support adaptation or configuration at design time (or programmatically at initial system configuration) to support the desired architecture. As an example, a particular cooperative memory controller might support cooperative garbage collection, but a particular design many not implement this type of cooperation between host and memory system—in such an implementation, the memory controller can be programmed (e.g., using a command register or mode register) to turn this feature (and associated functions) off. Typically, once initially configured for a specific implementation, a memory controller will maintain its configuration throughout system life or until the system is reformatted, although it is also possible to support dynamic modes for some purposes.

When configured to execute in the cooperative flash management mode for any one or more of the areas mentioned above, a cooperative memory controller provides methods and mechanisms for a host (e.g., host software) to define and detect the management condition, to query metadata in connection with that condition, and to electively take responsive action.

Figure 4:
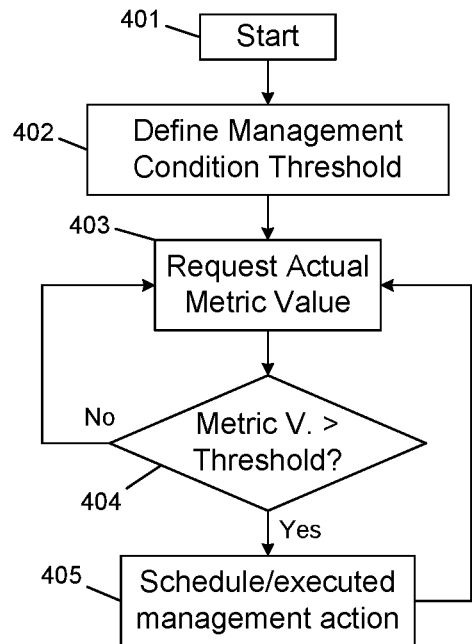
FIG. 4 is a flow diagram that illustrates host tasks in a cooperative memory management scheme.

FIG. 4 illustrates a process of the host-controller interaction in management condition detection. The process starts at step 401. At step 402, either of the host or the memory controller determines a need to assess the management condition, for example, as a function of running a routine or based on some type of trigger. For example, in one embodiment, the host can initiate a process such as periodic wear leveling (either via explicit command or as a result of setting an asynchronous process in the memory controller). The memory controller can also be set for a default operation, e.g., automatically alerting the host or providing data unsolicitedly to the host any time all pages have been released for a given EU; such a process can be triggered by the memory controller, which notifies the host of a need for intervention or simply (unsolicitedly) provides pertinent information to the host. Such a notification can also be the result of an asynchronous process or mode selectively set by the host, as mentioned above. Many other examples also exist. In one such example, a particular implementation may call for specifically alerting the host "automatically" any time a page release is determined to be the last page release for an EU (e.g., the EU is completely released); in different implementation, this information might always be tracked by the host (or not tracked at all). Irrespective of how the process is initiated, at step 403, the memory controller provides data to the host based on tracked, subdivision-specific (e.g., EU-specific) information associated with a particular parameter or metric. In one embodiment, each exchange between memory controller and host can be performed in a manner compliant with NVMe, for example, using a vendor-specific extension or a vendor specific NVMe administrative command. At step 404, host software checks the value returned at step 403 against a specified threshold to determine existence of a condition requiring intervention. On a negative determination, the process ends or otherwise loops to step 403 after a suitable delay. On a positive determination, host software proceeds to take management action (step 405). Once management action completes, the process either concludes or is looped back to step 402.

As an example of management action, a host can initiate an explicit erase operation that specifies an EU physical address. Because such an operation is host-initiated, it does not collide with a host-issued read or write request, thereby improving system performance. In a multiple drive system, the host can hide an explicit erase (and garbage collection and other functions) behind a read or write request to another system drive. For example, in a configuration where multiple drives are coupled to a host through (e.g., through a multidrop connection, a bridge or other routing scheme), commands from the host can be interleaved such that as read and write operations are performed in one drive, garbage collection and unit erase tasks are performed in another. In a system which has multiple SSDs, this parallel processing ability can lead to further performance benefits. Note that this type of parallel processing can also be performed where drives are connected point-to-point with a host.

Figure 5:
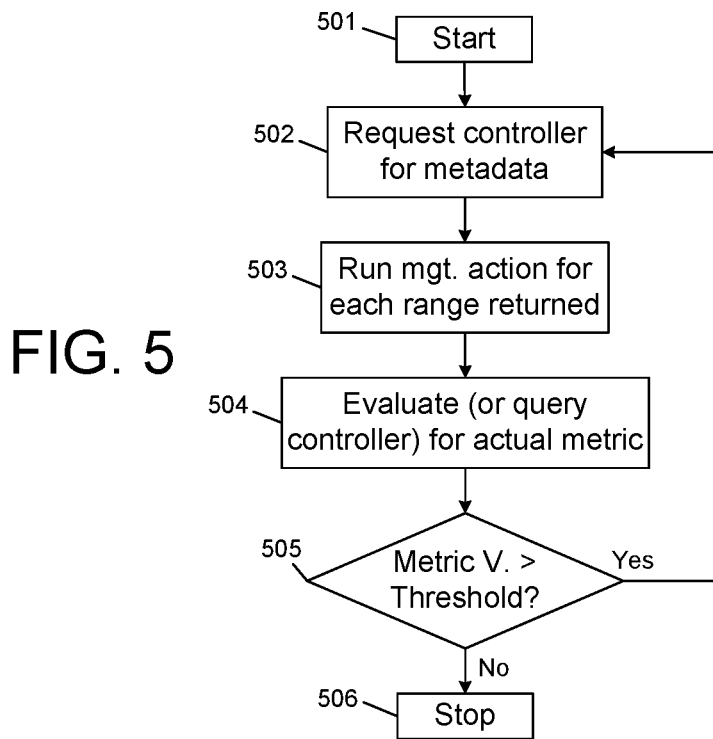
FIG. 5 is a flow diagram that illustrates host tasks in a cooperative memory management scheme.

FIG. 5 shows a method for host software to query metadata pertaining to pending management tasks; the host software can then determine the existence of a condition and optionally execute the decision it deems appropriate. The process starts at step 501. At step 502, host software—either in response to the management condition being detected with one of the methods described above or at will—requests the controller for metadata. For example, the requested information can be in the form of a map that verbatim passes tracked subdivision-specific usage data to the host, for example, by providing a bad block, EU or page utilization map to the host. At step 503, for each metadata range returned, host software performs any processing appropriate on returned metadata. At step 504, if management action is to be performed in response to the management condition being detected, host software either evaluates a current metric based on actions performed or queries the controller for a value. Based on the value obtained, at step 505 the host software checks if the condition still holds and if more metadata needs to be requested. On a positive determination, the process loops to step 502 where additional metadata is requested. If the determination is negative, the process concludes (step 506).

As mentioned, the cooperative memory controller of this disclosure can track many different types of information representing subdivision-specific-usage. This tracking information can be in the form of metadata 600 that represents one or more parameters, illustrated in FIG. 6. A first tracked parameter represents unit state 605; in the case of an EU, this field can be used to store data indicated whether the EU is bad. Alternatively, this field can also be used to denote whether the EU contains valid host data, or is otherwise available for allocation to the host or to the controller. Status 610 can be used to track any active controller operation. Erase count 615 keeps track of the number of program/erase cycles to date for the particular unit (e.g. the particular EU). An age field 620 keeps track of how long it has been since data was written to the erase unit. Time in this context can be represented in many different equivalent manners, for example, based on a time stamp or any other desired numerical value or other metric. Read count 625 identifies how many reads have been performed for data stored in the unit (e.g. EU) since the last erasure. In one embodiment, time since last read can be computed from the erase or another metric, e.g., with those memory controller or host calculating time relative to other EUs or metrics, tracked either by the memory controller or the host. Address 630 keeps track of a logical address associated with the erase unit. Release Count 635 identifies number of pages within the particular unit (e.g., EU) that have been released. The bitmap field 640 lists or otherwise identifies pages within the erase unit that are free (i.e., available for writes), valid (with actively-used data), or released. Depending on embodiment, this type of data can be maintained in a variety of ways; for example, more than one field can be used to track each of these parameters, or release status can be inferred from valid data status, or vice versa. Other alternatives are also possible. The bitmap field can also be used to indicate whether the pages in the particular EU were written out-of-order. The remapped flag field 645 indicates whether the EU has been allocated to defect management. In another embodiment, the above metadata could instead be tracked on the basis of logical erase unit with a mapping to the physical erase unit.

FIG. 6 should be understood as providing non-limiting examples only, that is, not all of the listed data must be maintained by a memory controller, and each identified field should be viewed as optional. Similarly, there are also many other types of data, beyond those specifically illustrated in FIG. 6, which can be used.

B. Specific Flash Management Tasks.

Flash management tasks discussed below can be grouped according to three primary categories: Defect Management, Wear Leveling Management, and Garbage Collection Management. The novel memory controller-host interaction described in this disclosure provides a unique ways of handling these management functions in a way that can be customized to the specific implementation. That is, a single memory controller design can support a number of configurable options (or modes) for allocating responsibility for these tasks as described below. Prior to discussing these options, however, it would first be helpful to revisit some of the capabilities provided by the structure described above. Once again, in one embodiment, information can be tracked by the memory controller and made accessible to the host in a manner that helps reduce reliance on a memory controller to maintain detailed address translation tables. That is, for purposes of the discussion below, it should be assumed as a default that (1) the host maintains a reasonably-accurate understanding of physical location of data in flash memory and is thus capable of directly addressing data to the specific physical locations in memory at which the data will be stored, and (2) many of the operations which might traditionally compete with host read/write requests will instead be managed by the host, i.e., such that tasks are schedule so that there is no competition.

1. Capabilities.

a. Wear-Aware Writes.

As discussed above, the host can issue commands to the memory controller requesting a listing of space that is available for writes, that is, either EUs that are erased, or pages in EUs that are not yet written to following an erase operation; this information can be returned with wear data used by the host to selectively direct new writes as a priority to space that is relatively more virgin. That is, generally speaking, the host need not track available space and in one embodiment can simply at any time request an update of available space by explicit command to the memory controller. The host can rely on this information for a period of time (e.g., until its list of available space grows low) and the host can then schedule garbage collection and erase operations at a time convenient to the host.

Figure 7:
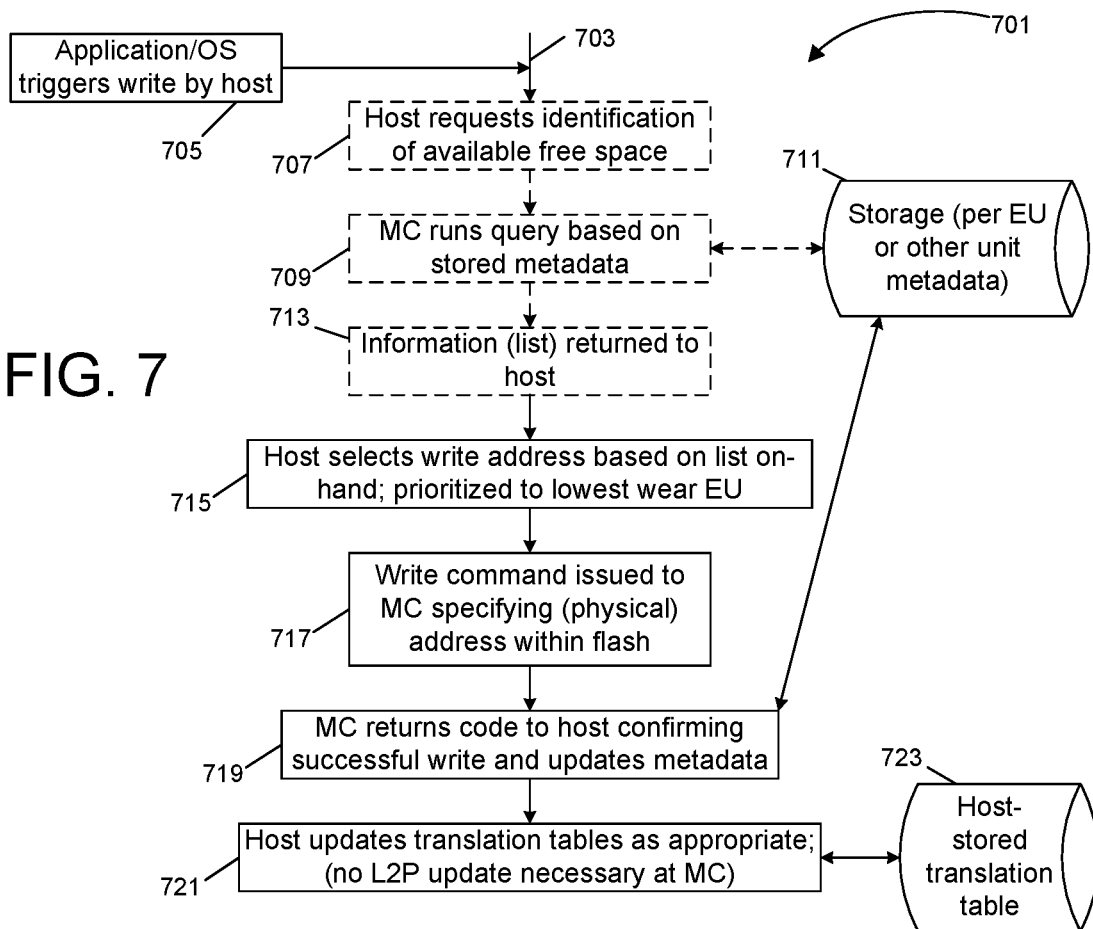
FIG. 7 shows a process associated with wear-aware writes.

FIG. 7 shows flow for a method 701 by which a host targets writes of new data to specific physical addresses in flash memory. The method begins at 703 in FIG. 7. Note that invocation of the method can be triggered by the need for an application or an operating system to write data to memory, per numeral 705. The host is responsible for having a list on-hand with available free space; this list can be periodically updated by the host by query to the memory controller, e.g., after an erase operation is performed. Note that a steps associated with such a query are illustrated in phantom-line boxes in FIG. 7, i.e., are designated by function blocks 707, 709 and 713. That is, optionally in connection with an erase operation, the host requests the memory controller to identify all free space, sorted or prioritized in order of least wear; this listing is determined by reference to the memory controller's metadata repository 711. In a system having multiple SSDs, the host can maintain a dedicated table for each SSD or, alternatively, it can instead build a table spanning memory space for multiple SSDs using sorted information from each SSD. "Available space" or "free space" in this context refers to space that has previously been erased in flash memory but has not yet been written to, meaning it is available for immediate programming (i.e., writes). Per numeral 715, the host then chooses a write address for data based on the list. Note that other priority schemes besides those listed above can also be used; as a non-limiting example, space can also be assigned for writes based on data type (e.g., specific file types) and other criteria, tracked or otherwise. After selecting a suitable destination address, the host then issues a write command to the memory controller specifying a desired physical address within flash memory, per numeral 717. As indicated by function block 719, the memory controller then manages the write process and, once successful, returns a code to the host confirming a successful write. The memory controller also updates the metadata repository (711) stored for each pertinent EU (e.g., to indicate that the assigned space is now taken, and to update any other tracked parameters regarding the data or use of the particular memory space). As reinforced by function block 721, the host then updates its own translation tables (723) as appropriate, i.e., with little to no L2P translation performed by the memory controller. In one embodiment to be discussed below, in which a memory controller is to perform its own defect management, the memory controller can remap data and mark the intended physical address as "bad" without immediately reporting this information to the host—advantageously, L2P translation is restricted to few, notable situations such as this. For a NVMe compatible implementation, these processes can once again be implemented with a vendor specific command. For example, the host can issue a command requesting LUN ranges and the amount of space that the host software is considering to allocate. Upon successful completion, the command returns a list of erase unit size logical block address ranges, prioritized by wear, and described by (LUN, offset) pair or single offset value (if the LUN was specified in the host request). A returned command status code can further specify whether the requested amount of space was available, whether the request was satisfied or whether further calls are required. The host then directs its writes as appropriate, directly specifying addresses for pertinent memory operations.

Note that writes targeted in the manner indicated above will inherently tend to level wear in flash memory, thereby reducing the need for wear leveling relative to some conventional schemes. As further noted below, even with such a scheme, asymmetric wear is possible and, therefore, cold data detection and consequent data relocation is advantageously performed even where wear-aware programming is performed, i.e., to perform "limited" wear leveling as described above. Also note that because the host has or is provided with direct physical addresses of free space, there is no need (or greatly reduced need) for L2P address translation at the memory controller.

b. Page Underutilization and Stale Space Reclamation.

To address page utilization issues, including the presence of stale (unused) data, the host can advantageously enquire at any time as to the extent of page utilization and/or aged data present in a flash device or SSD. First, note that updates of memory content in flash memory is typically processed as a copy-on-write operation, which writes updated data to a new memory location, leaving the old memory location in an unusable state (at least until the subject EU is the target of an erase operation). Note that in the context of the embodiments proposed herein, this operation can be performed directly by the host, i.e., with the host reading data from a first physical location, modifying that data, and writing the modified data directly to a different physical address based on a listing of available space. Over time, EUs can acquire greater and greater numbers of unused (released) pages, and so, experience low page utilization. Also, as certain times, it can be beneficial to inquire as to infrequently written data, so as to proactively assess whether any data should remain at its current location. That is, while wear-aware writes does effectively distribute wear, data that is only infrequently changed (e.g., a media library) can still be effectively tied up as infrequently written memory space while other memory space is more frequently cycled. "Cold data" detection processes (as well as "hot data" detection processes) can therefore be run to identify this data and determine whether this data should be moved, and optionally consolidated with other data, or potentially moved to other storage drives. This is to say, "cold data" can be moved to better distribute wear in a given memory space, and if that "cold data" has read/write characteristics similar to other "cold data," the respective data can be consolidated in one or more specific EUs or moved to a different storage drive or to another tier of a multi-tier storage system. This also enables the host to better match data access patterns to media characteristics, such as access latency or available capacity. Note that shuffling various data based on type can help improve the efficiency with which memory is used and also help better distribute wear.

As with the various schemes presented above, either the host or both the host and the memory controller can participate in this type of evaluation. For example, the host can issue a command (e.g., a vendor-specific NVMe command) specifying an EU or a LUN or a range of memory space. Upon successful completion of the command, the memory controller returns information representing the amount of capacity used by, e.g., cold data, either on a global basis (e.g., by returning a map) or can identify "cold" or "hot" status for a specific LUN identified by the host. The host can also (or instead) instruct the memory controller to asynchronously generate a notification any time data meeting a specific "hot" or "cold" threshold meets a predetermined threshold. For example, in one implementation, a cooperative memory controller receiving an erase command automatically queries EUs present in the pertinent memory space to determine whether a deviation exists from a target wear level (e.g., based on erase count deviation). The memory controller can also provide other types of asynchronous updates to the host, for example, in response to a periodic cold data check, with either raw metadata being returned to the host, or with the memory controller performing a query and returning pertinent data (e.g., an indication that data at a specified location does not meet thresholds such that it would be considered "cold"). Other operations are also possible. As with the schemes identified above, logic on board the memory controller receives the pertinent command, and sets registers and initiates routines as necessary to synchronously or asynchronously provide the requested data.

In some embodiments, as mentioned, the host is provided with the ability to request stale space identification either for a flash memory as a whole, or for a specific LUN range. A function call to this effect can be implemented with a vendor-specific command that returns the list of EUs described by one or more offset values (e.g., based on an offset to a LUN if a LUN was specified in host request). Host software can proactively use this method to assess units with stale data or in the context of a request for relocation candidates. Such a synchronous process could be advantageously applied in response to capacity pressure or other situations requiring immediate action. Asynchronous processes can also be used, for example, pursuant to a host command that the memory controller is to notify the host any time global page utilization, EU-specific utilization, or available memory space match host-specified thresholds. Note that in a storage system having multiple drives, a host can choose the most suitable destination for data relocation, potentially including another drive. For example, a host can elect to relocate data from one SSD onto another SSD, or even onto another memory type (e.g., a HDD). If host chooses to relocate valid or "cold data" within the boundaries of the flash memory device where this data resides, these techniques provide a method to relocate data without first reading it into host memory, thereby saving IO bandwidth and other system resources. That is, the host can delegate a data relocation operation to the memory controller; with such an operation, the host first queries the memory controller for a list of free address space (optionally meeting some criteria), schedules a relocation and then (at the appropriate time) provides a relocation command to the memory controller, with both source address and target address specified.

i. Delegated Copy/Data Relocation.

Figure 8:
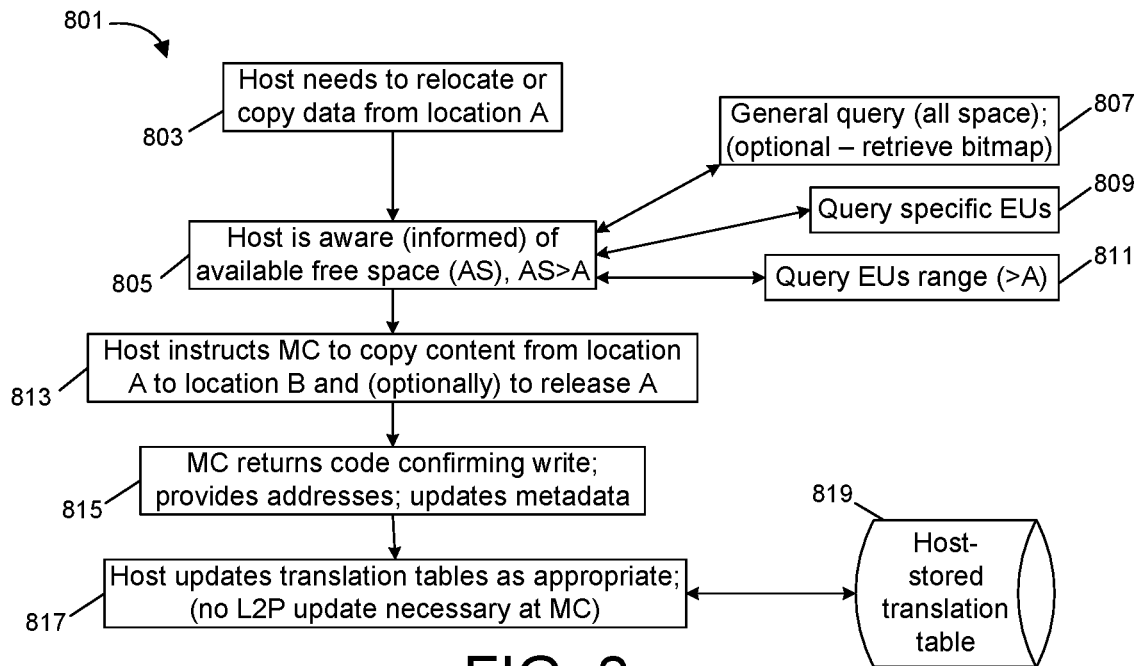
FIG. 8 shows a process associated with a delegated copy operation.

A delegated copy operation can be scheduled by the host in a manner (a) so as to not collide with ongoing data operations, and (b) without requiring movement of the affected data either to or from the host. Such a process is illustrated in FIG. 8 by reference numeral 801. More specifically, the host first determines that it needs to relocate or copy data, per reference numeral 803. As a non-limiting example, such an operation could be performed for an EU determined to have one or more defective memory cells. Alternatively, such an operation could be performed if page utilization for two or more EUs is low, and the host wants to consolidate "valid" data so that one or more EUs can be erased, thereby freeing all pages or other logical blocks associated with that EU. Still further, such an operation can be performed for cold data, to move it to a new physical memory address. Depending on the amount of data that must be copied, the host then identifies free space needed to hold the data to be copied, per function block 805. This query can be satisfied, for example, by retrieving information (e.g. a bitmap) representing all space managed by the memory controller; alternatively, the host can also query specific EUs or can indicate the amount of space needed, with the memory controller returning a list of available space. These options are generally indicated by reference numerals 807, 809 and 811. With addresses for both existing and recipient data locations identified, the host then issues a command (813) containing these addresses for the memory controller to perform a delegated copy operation. As an optional, implicit part of this command, the memory controller can be configured to release pages of the original source addresses following such a copy operation; note that with pertinent pages "released," the prior memory locations are in a condition where they cannot be written to until the entire EU associated with those pages is first erased. As another optional command feature, the memory controller can be configured to automatically check whether such a release completely releases the pertinent EU (i.e., as a release of the "last page") and to initiate an erase operation for the EU if this is the case. The memory controller then (815) returns a code to the host confirming successful write and updates metadata for the pertinent EUs. Finally, per numerals 817 and 819, the host updates its translation tables such that the host can directly address physical locations of memory, thereby freeing the memory controller from the bulk of translation duties.

In one embodiment, a vendor-specific NVMe copy command can be used to specify a source logical or physical block address and destination logical block or physical block address. Multiple pairs of source and destination addresses can be specified by a single command; if such pairs are specified, any such copy operations are executed transparently by the memory controller until the argument list is exhausted or until the operation fails.

Note that a delegated copy operation as just described can provide substantial performance benefits, i.e., the memory controller is relieved from the bulk of address translation duties, with the host being primarily responsible for issuing commands that directly specify physical address. Furthermore, the use of the delegate copy operation charges the host with scheduling of copy operations, with the memory controller being responsible for completing a delegated copy operation once issued; since the host is in charge of scheduling such a command, it can once again pipeline command issuance so as to no unduly interfere with read and write operations, and it can hide a delegated copy operation behind operations in other memory (e.g., other planes or SSDs). Delegating the copy operation to the memory controller frees up host-controller interface bandwidth that might otherwise be consumed by the need to send data to be copied from the controller to the host and then back from the host from the controller.

ii. Explicit Erase.

Memory bandwidth competition between host and memory controller can be further reduced through the use of an explicit erase command. That is, one optional design takes scheduling of erasing of flash memory out of the hands of the memory controller and vests it directly with the host. The host therefore pipelines issuance of explicit erased commands at times when flash memory (e.g., a particular SSD) has bandwidth to process such a command; as before, in an implementation featuring multiple drives, a host can hide (stack) an explicit erase of one SSD behind data operations to another SSD. Note that in a multidrop or other shared command path system, such an embodiment can interleave commands across multiple SSDs (each having their own memory controller), such that explicit erase operations are performed in one or more SSDs while data is exchanged in the performance of a write or read command in a different SSD (e.g., with data being exchanged over a shared data path).

Figure 9:
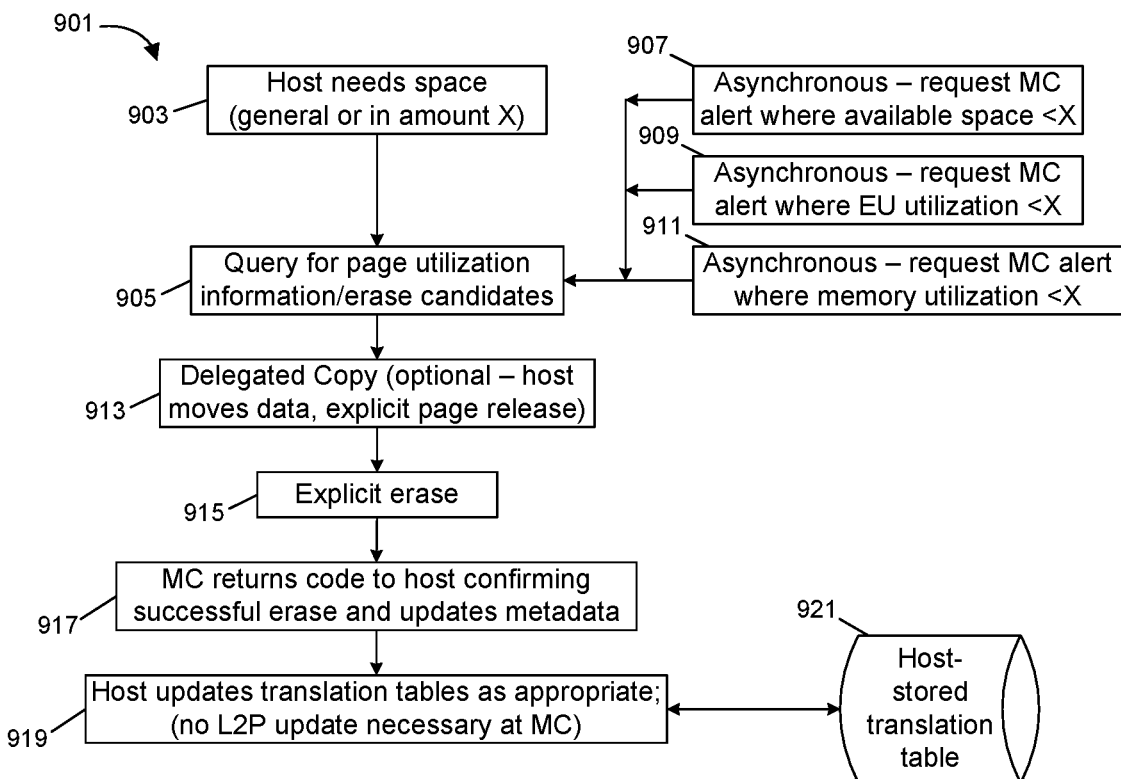
FIG. 9 shows a process associated with an explicit erase operation (or relocation of data and recycling of previously used memory space).

FIG. 9 illustrates a method 901 for explicit data relocation and/or erase operations. The host schedules an explicit erase operation to occur either immediately, or when it has sufficient spare bandwidth. As indicated by numeral 903, typically this will be triggered by a condition when the host needs space (e.g., of amount X). The host then issues a command (905) to the memory controller querying erase candidates based on low degree of page utilization. Note that with such a command, available space is not counted, i.e., such space is already free and available—rather, in responding to such a query, the host seeks to identify space that is released (not in active use) and for which an erase operation must be performed for entire EUs before constituent space can once again be made available for programming. An explicit erase command or data relocation command (e.g., delegated copy, referenced above) can be performed as part of a garbage collection operation.

As with commands discussed previously, synchronous or asynchronous commands can be issued by the host, depending on desired implementation. Where the host immediately needs free space, it can issue a synchronous command to the memory controller, for example, requiring a listing of units where page utilization falls below a specific threshold (e.g., any EU where released page space is greater than a threshold, e.g., 50% of an EU's capacity). Many choices of metric are possible, and in some embodiments, complex conditions can be evaluated (e.g., EUs where more than 50% of pages are released, but where less than 10% of space is currently available). In response to such a command, the memory controller returns a listing of EUs (or logical units), sorted by any desired priority scheme (e.g., by lowest amount of wear). Asynchronous commands can also be issued, as represented by numerals 907, 909 and 911, seen at the right of FIG. 9. For example, some designers may choose to set a condition where the memory controller unsolicitedly sends an alert to the host any time "available space" tracked by the memory controller falls below a specific threshold, e.g., less than 10% of total capacity managed by that memory controller. Alternatively, the memory controller can be configured in some implementations to alert the host in connection with any page release if that page release causes the subject-EU to have more than a specific released page threshold. As yet another example, a memory controller can be configured to notify the host any time overall memory (under) utilization (e.g., released page count to valid page count) exceeds a specific threshold. Commands that invoke these functions are examples of asynchronous commands, because the memory controller might respond immediately (e.g., if the specified condition were already satisfied) or at a later point in time (e.g., at a time of later occurrence of the condition specified by the command). As noted by numeral 913, a delegated copy command can then be executed by the host to relocate any valid data in an EU selected for an erase, with all constituent pages of that EU then being released. Then, per numeral 915, the host issues an explicit erase commands; the memory controller manages the erase operation (e.g., as a sequence of P/V cycles applied to a substrate well of affected memory) and returns a code to the host confirming successful erase (917). In a NVMe-compatible embodiment, an explicit erase command can be implemented using a vendor-specific extension of the "Deallocate" administrative command. The memory controller at this time also updates its local metadata repository for the memory in question, for example, identifying all logical units of the pertinent EU as "available," adding the EU to a list of available space, and so forth. Finally, upon receipt of the confirmation code from the memory controller, the host then updates its translation tables as appropriate (919/921).

Note that once again, explicit erase provides a benefit in that this operation is scheduled by the host (i.e., to avoid conflicts), with the host maintaining primarily responsibility for L2P address translation.

c. Determination of Geometry and Physical Addressing.

To facilitate cooperative flash management and otherwise permit the use of discrete storage drives, a cooperative host and/or cooperative memory controller can provide a mechanism to permit the host to have insight into flash array geometry. To this effect, the host can request (or the memory controller can transmit to the host) information indicating the type of memory present, capabilities of the memory controller and other parameters. Such a task can be implemented with a vendor-specific extension to the NVMe Identify Controller command, where the memory controller responds by returning information such as the number of channels, targets per channel, LUNs per target, and number of EUs per LUN, and whether the memory controller supports specific management schemes for defect management, wear leveling or garbage collection, discussed below. Geometry information can also additionally include physical EU and page size, as well as many other types of information. This information can be used by a host to configure operation with the particular memory device or drive, and to configure wear leveling, garbage collection and other schemes as appropriate. For example, the host and/or the memory controller can upon power-up request device configuration, and can then set the pertinent scheme(s) by responsively configuring a mode register. The pertinent scheme can be selected according to policy (e.g., based on the configuration of memory available or other system requirements).

2. Management Tasks: Configurable Allocation of Responsibilities.

A cooperative memory controller and cooperative host can generally support a host-owned, memory controller-owned, or shared schemes for managing various tasks associated with flash memory. The particular choice of configuration is an implementation choice, and can depend in any given system of the type of data being managed, desired performance parameters, file management or network policies, or other factors. For example, a music server or video server application (e.g., where data has read-mostly characteristics and where data is read intermittently) might be more amenable to a host-owned scheme than to a memory controller-owned or shared scheme.

a. Defect Management.

Flash memory, as with any storage media, is potentially subject to data errors. While read errors are proactively handled using EDC techniques, write and erase errors may occur at random over the device lifetime, with some units initially marked unusable (i.e., bad) and others being initially good, but later being found to be bad and marked as bad over time. These units, whether initially bad or later marked as bad, are tracked by either the flash memory controller or the host so that writes of data are not directed to these units. Thus, a cooperative memory controller and host will typically support a scheme for managing defects which are detected in flash media. As with other management functions, whether a given implementation uses host-owned, memory controller-owned or shared defect management can be configured according to preference, for example, adapted at initial power-up (for example, in dependence on detected device or system geometry, policy and other considerations), via the programming of a mode register. For example, the registers illustrated in FIG. 3A can be used for this purpose. Note that in each mode or scheme discussed, the memory controller will still typically provide some form of cooperative input to the host, for example, by serving stored metadata, providing functional returns to host-initiated queries, using on-board storage for metadata and associated processing logic. That is, a cooperative or shared management task should not be confused with a cooperative memory controller that provides certain functional services (e.g., including the serving of subdivision-specific data) that can be electively used by the host.

i. Host-Owned Defect Management.

For host-owned defect management, units marked unusable by the chip manufacturer are identified during first time device initialization. Host software is then expected to query the flash memory controller or the flash memory for this defect list using the method provided by the controller.

In an embodiment where host-controller communications are NVMe compatible, the host software and flash memory controller can interact using a vendor-specific GetLogPage command. When issued by host software, such a custom command is structured so as to return a log page describing logical address ranges marked as unusable, with each range identified by starting logical block address and the length in logical blocks (e.g., in pages where a page is the logical block size identified by the host). Recording defect areas so as to proactively manage further read and write access to the correct address is then the responsibility of the host. Note that the effect of such host-owned defect management is that once again, there is no need for L2P translation at the memory controller—the host registers and tracks defects and consequent changes in physical locations of data, and then it directly accesses that data as appropriate.

Subsequent write errors that occur can be incrementally reported back to the host software without further memory controller involvement. Such general interaction is generally designated by reference numeral 1001 in FIG. 10A. Generally speaking, the host first initiates a write command, per numeral 1003, and the memory controller detects the occurrence of a write error, for example, a timeout after reaching a programming limit (e.g., maximum write time out or number of program-verify cycles); this write error is then reported back to the host (1005). The error condition is then recorded by the host (1007) so as to avoid further writes to the area in error, with writes directed by the host to another location. The host marks the unit (EU or other unit as bad).

In addition, any memory operation retry in this mode is advantageously controlled and performed solely by the host software, with the memory controller confirming a successful write to the host and also updating local metadata for correctly written data (and optionally, for the bad blocks as well). Note that, once again, the fact that the host updates translation tables so as to avoid future writes to the location avoids the need to maintain L2P translation infrastructure at the memory controller (1011, 1013). When configured to execute in this host-owned defect management mode, the controller does not need to reserve any spare for defect area remapping and thus can advertise full device capacity to the host, such that the memory controller is not required to implement even a minimal L2P capability for this mode. That is to say, the memory controller need not reserve spare capacity since all address assignment and defect tracking is owned by the host, i.e., such that there is no form or remapping performed by the memory controller and all physical address assignment to new writes is exclusively owned by the host.

When the host owns defect management, the memory controller is typically inhibited from attempting a unit erase operation due to the inability to handle erase errors that could occur. To overcome this issue, for host-owned defect management, the host explicitly initiates all erase operations, with a status code returned to the host software that specifies whether the erase operation completed successfully or failed. Recording the unit that experienced an erase error so as to avoid further writes to a "bad" EU is then once again the responsibility of the host.

Note that it was referenced above that the memory controller, the host, or both can track lists of free erase units. In connection with defect management, a reserve of available space is kept on hand in order to provide a pool for immediate reassignment of writes when a defect is detected. Such a list can be implemented in a manner that supports midstream insertion of an EU after erasure. In one embodiment for example, when spare capacity is low, the host can initiate an operation that identifies candidate blocks for erasure in a given memory device or drive. A memory controller sharing responsibility for defect management might already be charged with managing a list of erased units that it holds for spare capacity. A cooperative host can identify pages with low page utilization, move any active data, instruct the erasure of associated EUs, and instruct the memory controller to add newly erased units to its list of free pages. If desired, this list can be organized according to a desired priority criteria, e.g., as a FIFO list, according to wear, or using another priority scheme. In one embodiment, the list can be organized as a B-tree, or alternatively, as a hierarchical doubly linked list.

ii. Shared Defect Management.

While providing host software with complete control over media defects, host-owned defect management can exert an extra burden of defect list management on the host software; this may be undesirable for some applications. Shared responsibility for defect management using principles of this disclosure can instead be used. That is, the memory controller can be used to monitor and track errors and other parameters, leaving error detection and/or defect list management to the host.

In one embodiment, write errors as they occur are reported back to the host software. Host software can then instruct the memory controller to mark the particular physical block of memory cells associated with the error as bad. In a NVMe context, such a method can be performed using a WriteUncorrectable command that, when issued, instructs the controller to add a specified logical block address range to the bad block list, maintained in storage of the memory controller.

Units marked unusable by a chip manufacturer can be identified during first time device initialization and saved in the defect list in the controller's internal memory. The memory controller preferably further guarantees persistence of the defect list across power-cycles, so that defect information is always up-to-date. Host software is permitted to inquire at any time whether a given address range or block has been previously marked as bad, or to query the memory controller for the complete defect list. In a NVMe embodiment, such a query can once again be implemented with a vendor-specific NVMe administrative command.

Figure 10A:
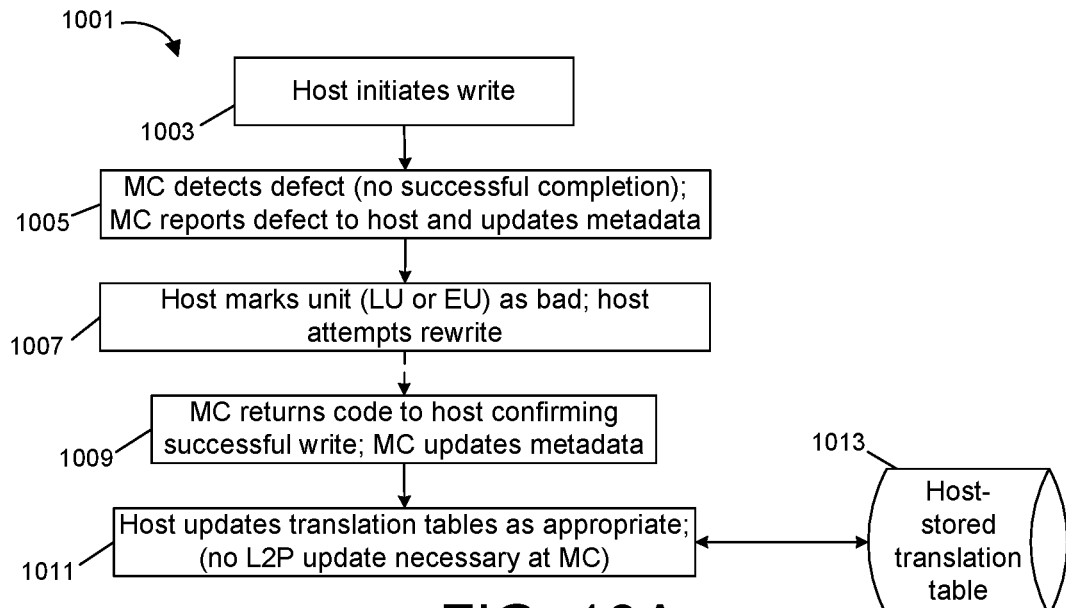
FIG. 10A shows a process associated with host-owned defect management.
Figure 10B:
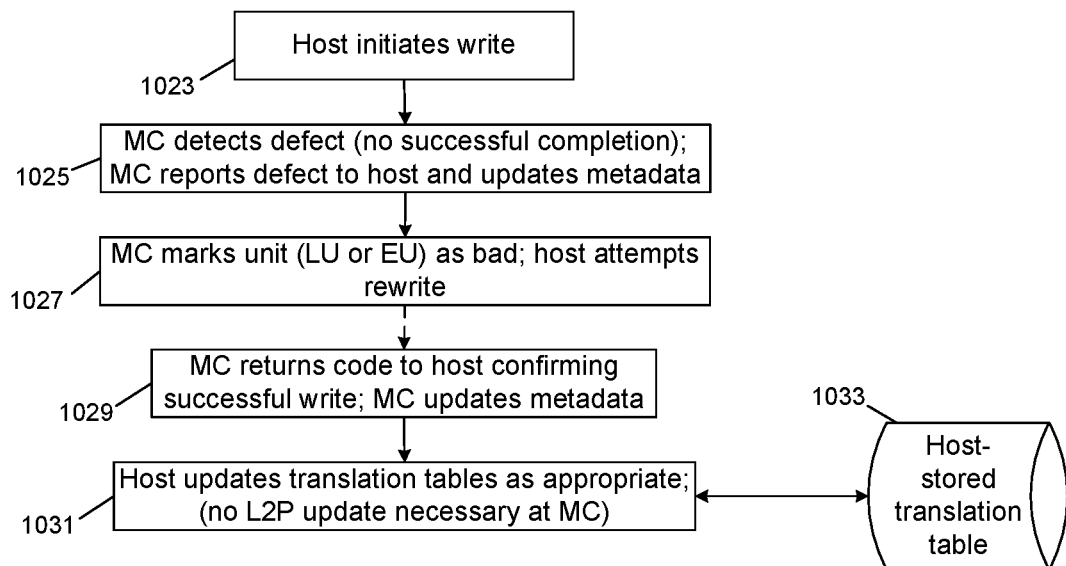
FIG. 10B shows a process associated with shared defect management.

As seen in FIG. 10B, as with host-owned defect management, a cooperative memory controller can once again provide for an write operation to be initiated by host software (1023), with an alert code being returned in the event that the write operation failed (1025). Host software may then request the memory controller to identify the bad unit in the memory controller's defect list and the host then attempts a rewrite (1027). Once again, once the retried write is successful, both the host and the memory controller update translation tables and metadata respectively (1029, 1031, 1033). As before, because the host is informed of a failed write and locally maintains precise physical address identifiers for each page in flash memory, the memory controller is substantially freed from having to provide for an L2P mechanism. When configured for cooperative defect management, a memory controller once again does not need to reserve any spare capacity for defect area remapping, and can instead advertise full device capacity to the host software.

In some embodiments, host software can be permitted to classify an EU or a smaller address range as unreliable due to read error detected using the additional data integrity features mentioned earlier or other host-specific features. Host software can therefore be provided with an option to request that this range to be added to the defect list using the method described above. This option provides for greater flexibility in error detection and correction at a system level.

iii. Memory Controller-Owned (Transparent) Defect Management.

Figure 10C:
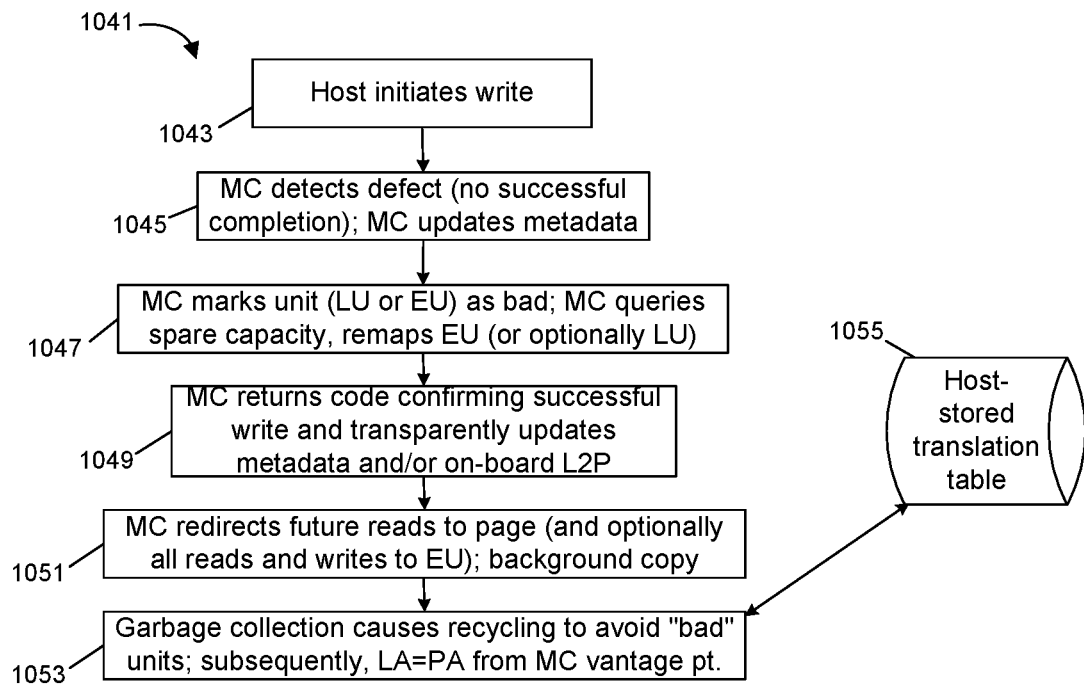
FIG. 10C shows a process associated with memory-controller owned defect management.

In situations where the memory controller manages defects, when write or erase errors occur, they are not reported to the host software unless the controller is out of spare capacity (e.g., to remap data). That is, if sufficient spare capacity exists, defective areas are automatically remapped by the memory controller, transparent to host, and added to the defect list maintained by the memory controller. This configuration is represented by FIG. 10C, and is generally denoted using reference numeral 1041.

As before, a defect is detected in the event of a failed write (1041, 1043). The memory controller detects this error and updates local metadata (1045). However, in this mode, the memory controller does not immediately notify the host. Rather, the locally maintained metadata is updated in a manner that flags a remapping situation, and the memory controller reserves some spare capacity for redirected writes. The memory controller also updates a locally-maintained bad block list (1047); note that as indicated in FIG. 10C, each of these pieces of information can be once again maintained on a per-EU or per-logical unit (LU) basis. When the data is correctly written to substitute EU(s), the memory controller returns a code indicating completion of a successful write (1049). Per function blocks 1049 and 1051, ensuing reads to the remapped data are detected by the memory controller, which detects correspondence of a read address with the physically-defective "bad" block, transparently obtains the remapped address from the metadata associated with the bad block, and services read requests directly from the remapped space. Note that when configured in this mode, the memory controller continues to store information tracking usage for each subdivision of memory, and continues to serve this information to the host. The memory controller can also provide query capability as referenced above. As use of the memory progresses over time, and as wear leveling and garbage collection occur, the host will be informed of new available memory that does not include marked "bad" blocks; as a consequence, physical address assignment for new writes ultimately moves remapped data to a different memory location, thereby avoiding the "bad" blocks. In turn, this results in the host once again having a direct physical address for the data in question (1053, 1055). In other words, irrespective of the fact that the memory controller owns defect tracking in this scheme, the extent of L2P remapping is advantageously both minimal and self-limiting. The host manages address translation for data reads, but because defect space in practice will be limited, the memory controller should not require large search trees or other complex mechanisms to perform address translation.

When spare area reserved for defect remapping is exhausted, the controller issues an alert to the host or otherwise flags an error condition to draw the attention of the host. In a NVMe-compatible embodiment, such an alert can be raised with an asynchronous event notification. The host software can then take the appropriate actions such as switching to another supported defect management mode, initiating garbage collection or data relocation, or using some other process.

Note that if spare capacity is exhausted, this even can threaten and potentially halt normal device operations. To overcome this potential issue, a cooperative host can be permitted to poll the spare capacity for defects in any flash device or drive, or set a state that requests asynchronous notification if spare capacity for defects falls below a host-defined threshold. Methods for host software to detect this management condition are described above.

Also, as alluded-to above, the host can also take management action to increase the amount of defect spare when a defect-spare management condition is detected. That is, host software may pro-actively address potential spare capacity run-out by improving spare capacity by, for example, initiating space reclamation, garbage collection or data relocation operations or using another process that can improve usable device capacity.

b. Garbage-Collection Management.

As discussed earlier, a page in NAND flash memory cannot be rewritten until an entire EU including that page has been erased; this is the P/E asymmetry referred to earlier. Some flash memory controllers operate by detecting an attempt to write to a previously-written page (i.e., a page that has already been programmed but not yet erased) and responsively implementing a copy-on-write operation. With such an operation, the memory controller remaps the page or other logical quantum of data by remapping it to erased location. Over time, the number of unused pages grows without any free space being reclaimed due to the P/E asymmetry. To reclaim released space, memory controllers are periodically forced to run a garbage collection task, where they locate and consolidate partially used erase blocks to reclaim space. Conventional garbage collection practices can require substantial reserved buffer space, up to 20% of available storage capacity, to compensate for non-reclaimable released space, and can compete with write coincidentally initiated by the host. Performance penalties associated with these conventional practices management can be especially pronounced when page utilization exceeds 50-60%.

Host-owned and shared garbage collection techniques permit significant reduction of these performance penalties and associated overhead. As before, in one embodiment, a cooperative memory controller and/or cooperative host can be made configurable so as to support host-owned, memory controller-owned, or shared garbage collection management responsibilities. Host-owned and shared garbage collection techniques are discussed with reference to FIG. 11A, while memory controller-owned techniques are discussed in reference to FIG. 11B.

i. Host-Owned and Shared Garbage Collection.

Figure 11B:
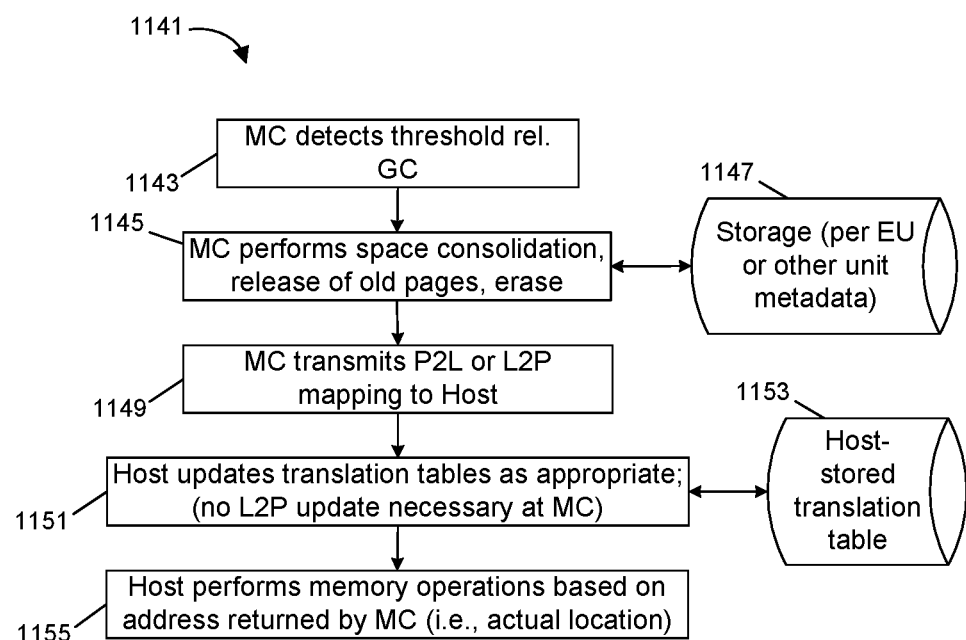
FIG. 11B shows a process associated with memory controller-managed garbage collection.
Figure 11A:
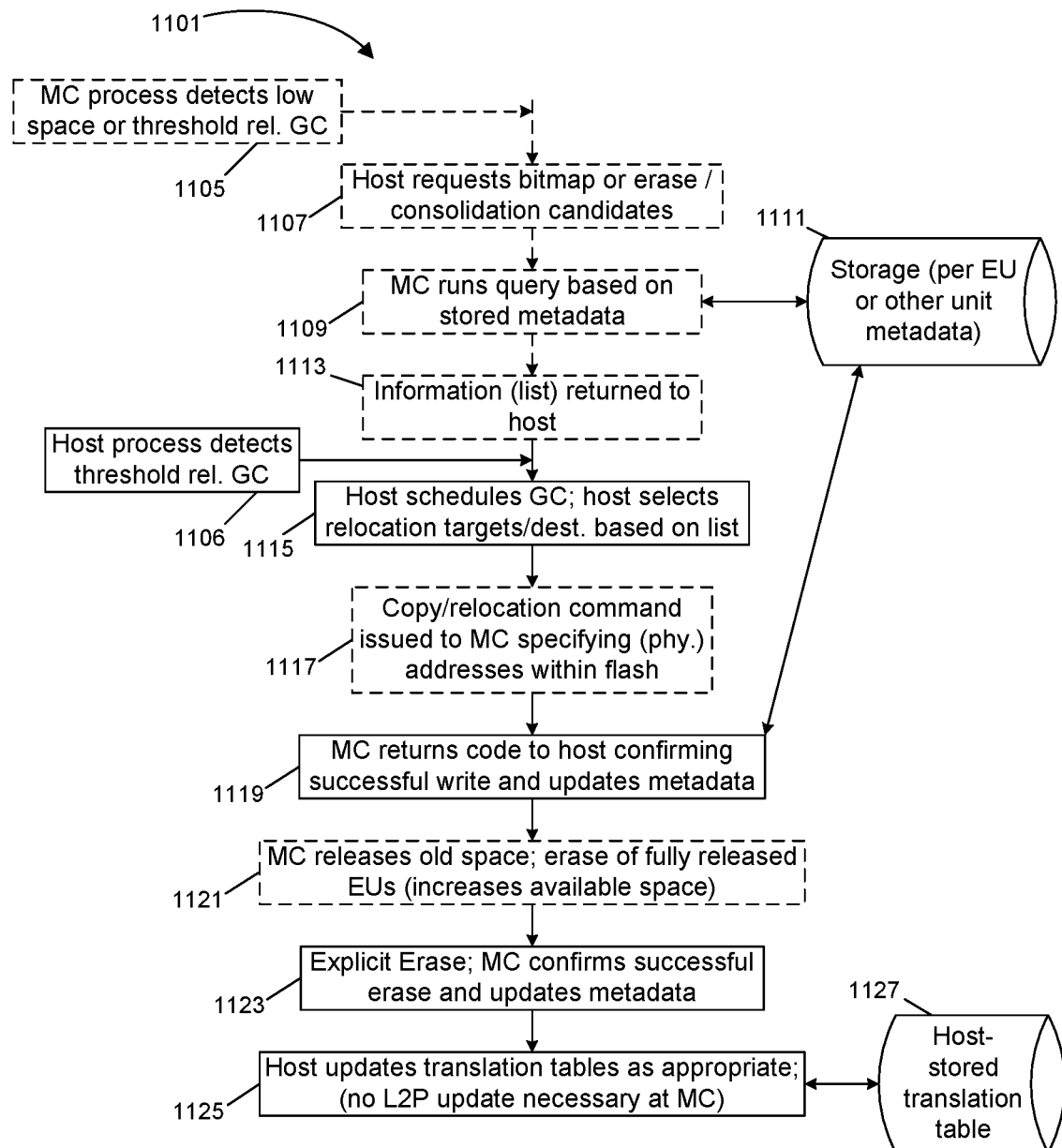
FIG. 11A shows a process associated with host-owned and shared garbage collection.

In a host-owned garbage collection process, generally designated 1101 in FIG. 11A, the host can assume full control and responsibility for garbage collection, including released space accounting, candidate unit selection, and relocation of valid (active) data. The operation is initiated when a host process detects a threshold condition related to garbage collection, as referenced by numeral 1106. Unit erase operations and actions to reclaim free space are thereafter initiated by host software with an explicit erase command, for example, as described in connection with defect management above. The host is further expected to appreciate P/E asymmetry, to track released pages for each unit, and to apply any garbage collection candidate identification logic to ensure the desired amount of free units or available capacity. All of these functions can be facilitated via the information stored and made available by the memory controller presented by this disclosure, and the queries that can be run to such a memory controller. That is, the memory controller can provide page utilization information to the host, which can determine scheduling, pull data, issue erase commands and rewrite data as necessary. Based on this information, the host schedules garbage collection and selects both source locations and destination locations for any data that is to be relocated (1115). As indicated by dashed-line block 1117, if supported by the particular implementation, the host can delegate a copy operation, for example, as was discussed earlier. Such an implementation has the advantage that a data relocation operation does not require moving data back and forth to and from the host, and thus, does not encumber a data communication path between the host and the controller. Alternatively, if it is desired to copy the data to the host (e.g., to move data to another SSD), the copy/relocation operation can be directly performed by the host. When data is properly written as part of such an operation, the memory controller returns with a confirmation to the host and successfully updates its metadata as appropriate (1119). As denoted by numeral 1121 and as previously discussed, the memory controller can be configured as an option to automatically release old pages that were the source of relocated data, and to automatically erase any EU for which the last page has been released. Alternatively, if this function is not automatically performed, the host then issues an explicit erase command 1123, and the memory controller then returns a code indicating successful erase. Per numerals 1125 and 1127, as the host schedules the operations and is informed of associated physical addresses, the host can once again directly update its own translation tables, without need for a complex translation mechanism at the memory controller.

Dashed-lines in FIG. 11A are also used to discuss shared responsibility for garbage collection management. In addition to host detection of a threshold condition relating to garbage collection, this can also be performed at the memory controller (1105), as a default function or programmatically configured as a result of an asynchronous command from the host. The first task associated with garbage collection scheme is the identification of released, but not erased, memory space present. Accordingly, the host is advantageously provided with the ability to query each flash memory controller present in a memory system as to whether such space is present. Again, this information can be returned in the form of a map or in a manner specific to ranges of addressable memory (1111). In addition, a cooperative memory controller can also be configured to return general metrics such as the extent of page utilization or the number of released pages for a memory device in general. This latter information could be used by a host, for example, in selecting a specific one of multiple SSDs as a garbage collection operand. Further, these techniques can also be performed unsolicitedly, for example, they can be triggered automatically by a different type of command or in connection with an asynchronous process; otherwise stated, a different type of command can trigger an alert of the sending of data to the host as a result of a metadata update that causes specific metadata to satisfy a threshold.

In one embodiment, the ability to query a flash memory controller is implemented with vendor-specific NVMe command specifying a particular LUN, or requesting a return of information for an entire flash memory device or drive. Upon successful completion of the command, the memory controller returns information to the host representing the amount of released space that may be reclaimed and the amount of valid data that needs to be relocated for reclamation to happen. In yet another embodiment, the memory controller can asynchronously notify the host when released non-reclaimed space reaches a predetermined threshold. For example, a host can issue vendor-specific NVMe asynchronous event request to a particular memory controller that specifies a threshold reclaimable space needed to trigger alert of the host. The flash memory controller then responds asynchronously when it detects the specified condition, notifying host software of the condition and delivering condition specific information.

As mentioned, as an option, the host can query (1109) the memory controller for a suggestion of suitable garbage collection candidates. Logic on board the memory controller receives this requires, processes stored metadata (1111), and responds as appropriate (1113). For example, depending on implementation, a response can identify a predetermined number of EUs in order of page (under) utilization. Alternatively, the response could rank all EUs in the flash memory being managed in order of suitability for garbage collection. As a further option, if the host command specified an amount of space to free up, the memory controller could return an identification of EUs which, when consolidated, would provide the specified amount of free space. Other options are also possible. As with other functions described above, the memory controller services this query by processing on locally stored information (e.g., metadata, 1111).

iii. Memory Controller-Owned Garbage Collection.

Memory controller-owned garbage collection typically requests some type of L2P tracking local to the memory controller and it therefore entails different considerations than the embodiments discussed above. Nevertheless, a skilled designer could implement such a scheme in a manner consistent with a memory controller that tracks and serves information (e.g., metadata) for host access. FIG. 11B depicts one possible method (1141) of managing this process. More specifically, a memory controller detecting a need for garbage collection (1143) performs local space consolidation, data relocation and erase operations (1145). In association with these actions, the memory controller updates its local metadata (1147) and transmits a consequent logical to physical mapping back to the host, together with metadata that enables the host to perform a reverse lookup and consequently build its own address translation table for files (1149, 1151, 1153). Thereafter, the host performs memory operations (such as read commands) based on the physical address of data.

Other schemes consistent with memory controller-managed garbage collection are also possible; a designer, however, wishing to minimize control overhead associated with managing flash memory, not to mention avoiding L2P overhead on a flash memory device, will typically elect the clear advantages presented by the host-owned and shared configurations discussed above.

c. Wear Leveling Management.

As noted earlier, flash memory typically can sustain a limited number of P/E cycles, e.g., tens to hundreds of thousands. As the number of times the unit was erased approaches the manufacturer defined limit, the unit wears out and finally becomes unusable such that data cannot be retained.

The cooperative management techniques of this disclosure permit host software to take full or partial responsibility of wear leveling. As before, a cooperative memory controller and/or cooperative host can support configuration of a host-owned, memory controller-owned, or shared wear leveling scheme. Also as discussed before, the pertinent scheme can be selected in dependence on a mode register or system configuration process or at system design time.

i. Host-Owned and Shared Wear Leveling.

Figure 12A:
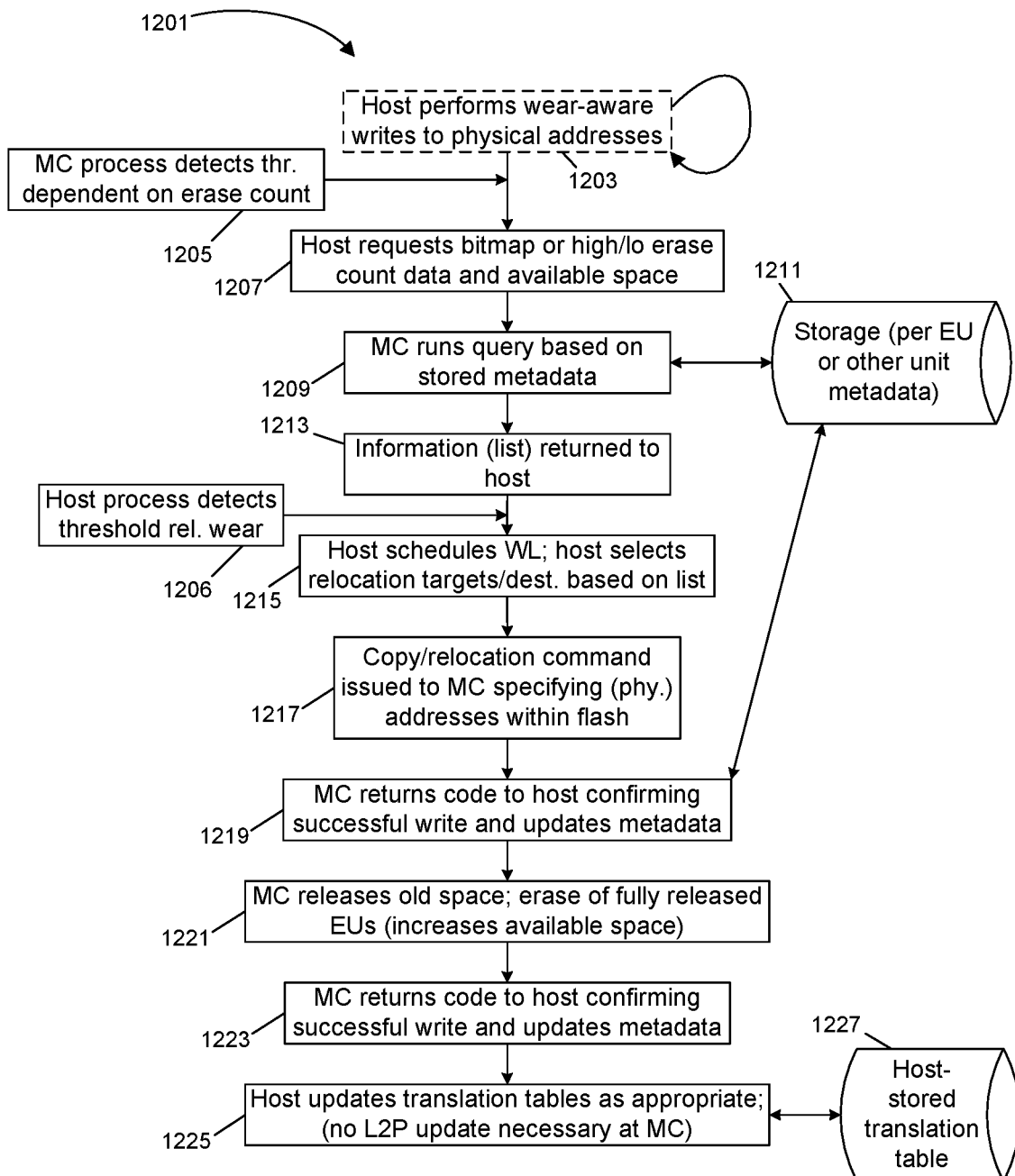
FIG. 12A shows a process associated with host-owned and shared wear leveling.

Host-owned and shared wear leveling schemes are generally represented by FIG. 12A. Generally speaking, whichever scheme is selected, the host can generally improve wear leveling by performing wear-aware writes, as generally denoted by reference numeral 1203. As mentioned, in some cases, wear leveling might still sometimes have to be performed, for example, due to differences in garbage collection differently affecting "hot" and "cold" data. Generally speaking, the need for wear leveling can be detected either by the memory controller or the host, as represented by numerals 1205 and 1206; a number of measures can be used for this purpose, such as a detection of a difference in EU wear for a given memory range exceeding a predetermined threshold. Alternatively, a statistical measure can also be used (e.g., statistical variance) to inherently apply a weighted measure across the entire memory range being managed by a memory controller.

For host-owned wear leveling, once again, the host can poll a memory controller to request a bitmap from the memory controller or can maintain its own tracked parameters representing uneven wear. Note that for many embodiments, tracked wear parameters will be maintained at a location consistent with where processes are run to detect wear leveling, but it is also possible for example to host-monitoring of wear based on memory controller-maintained metadata. Irrespective of the source of the wear data, for host-owned wear leveling, the host identifies candidate address ranges that are to be redistributed or recycled. For example, if wear-aware writes fail to evenly distribute wear, it could be that cold data is being recycled differently than hot data; note that this situation is slightly different than the issue of low page utilization mentioned earlier, i.e., in this case, an EU might be highly utilized for reads, but might have pages that are released only infrequently. If this data is periodically moved, then this underwritten memory can be used to dilute wear attributed to frequently written data. The host can also continuously track such information and, irrespective of the mechanism used to acquire data, the host monitors data to detect occurrence of one or more threshold conditions relative to wear (1206). With host-owned wear leveling, host software assumes full control and responsibility for scheduling and initiating wear leveling, and for selecting source data addresses and destination addresses associated with copy operations (1215). Once again, the host can perform copy operations itself, pulling data back to the host (e.g., for transferal to another drive), or it can issue a delegated copy command as discussed above (1217). Successful operations are confirmed by the memory controller and also form the basis of updates to metadata (1219, 1211). Release of source pages for copy operations and unit erase operations are again initiated by the host software (1221), for example using an explicit erase command, as described above. When old space is erased and available to receive new data, the memory controller provides a confirmation code to the host (1223), which can then serve as a recipient address for another data copy/relocation operation. Note that many types of tracked data can be used to assist in wear leveling management, for example, tracked metadata representing data type, read frequency, write frequency, and other measures can be considered in determining whether data is "hot" or "cold," and thus whether data should be moved. Also note that with the mentioned confirmation codes, the host once again advantageously maintains a current list of physical addresses for all data stored in flash memory, updated as appropriate following transaction completion (1225, 1227). The use of these physical addresses in association with file structure by the host will be discussed further below in connection with description of an exemplary storage server.

FIG. 12A also represents a scheme for shared responsibility over wear leveling. In such a scheme, the host can be permitted to query the memory controller as to what units are most suitable for allocation based on wear considerations (1207, 1209, 1213). A synchronous command can once again be used (1209) to cause the memory controller to run a query based on stored metadata (1211) and to return a result to the host (1213); as indicated in FIG. 12A, this result can be expressed in the form of a list that identifies a "suggestion" of candidate address ranges that are to be redistributed or recycled. Per numeral 1213, a list can be provided to the host based on time since last write, low wear, and so forth. The host can then explicitly direct new writes to specific EUs or other physical units based on this information. In addition, the memory controller can also be programmed using an asynchronous command to alert the host when a predetermined wear threshold or set of thresholds is achieved (1205). Note that, as discussed elsewhere herein, some limited L2P mapping can still be performed by the memory device, but with the use of direct addressing, it is expected that translation issues can be greatly minimized, thereby greatly reducing the possibility of memory controller task competition with host requests.

ii. Controller-Owned Wear Leveling.

A storage system can also implement a scheme where wear leveling is managed by the flash memory controller; the memory controller manages wear detection transparently to host by itself detecting the need to remap units to ensure uniform wear distribution. In one embodiment, the host can then schedule wear leveling (e.g., data relocation and unit erase), and in a second embodiment, the memory controller can transparently schedule and one or both of these functions. Such schemes still have context in a cooperative host-controller management scheme. For example, a memory controller transparently scheduling and performing data relocation can periodically report new L2P mappings to the host, which then implements direct physical addressing as indicated earlier. Further, a memory controller can still make metadata available to the host for most other management functions, for example, cold data relocation via both asynchronous and synchronous mechanisms described above. It should be noted though that if a memory controller transparently manages these functions, the functions can potentially collide with other host requests unless measures are taken to avoid collision; for this reason, in many embodiments, scheduling of wear leveling and other operations involving data relocation, unit erase and so forth can advantageously be reserved to the host.

Figure 12B:
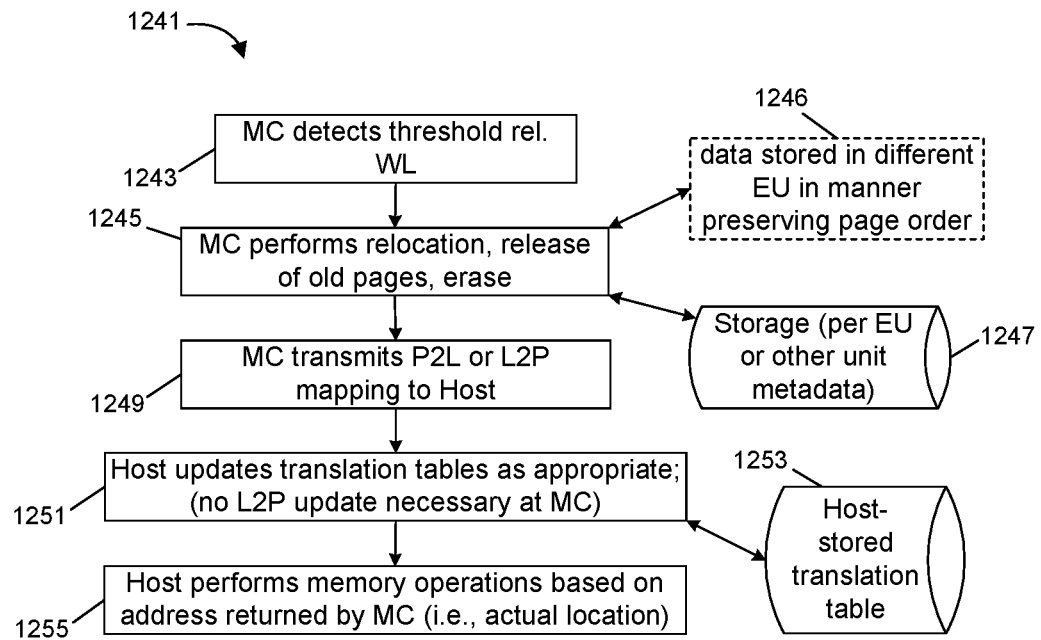
FIG. 12B shows a process associated with memory controller-managed wear leveling.

Memory controller-owned wear leveling typically utilizes some type of L2P assignment and tracking local to the memory controller and it therefore entails different considerations than the embodiments presented earlier. That is, such an embodiment features additional overhead associated with an L2P translation mechanism in the memory controller; even in a situation where such reassignment is limited (e.g., entire EUs are simply remapped to spare EUs, such that for example, internal page ordering is preserved, e.g., per function block 1246), this can potentially compete with host operations and create unpredictable latencies. Nevertheless, a skilled designer could implement such a scheme in a manner consistent with a memory controller that tracks and serves information (e.g., metadata) for host access. FIG. 12B depicts one possible method (1241) of managing this process. More specifically, a memory controller detecting disparate wear (1243) performs local space consolidation, data relocation and erase operations (1245); as mentioned, these can be advantageously scheduled by the host, with the memory controller then commanded to oversee these operations at the scheduled time. In association with these actions, the memory controller updates its local metadata (1247) and transmits a consequent logical to physical mapping back to the host, together with metadata that enables the host to perform a reverse lookup and consequently build its own address translation table for files (1249, 1251, 1253). Thereafter, the host performs memory operations (such as read commands) based on the physical address of data.

Other schemes consistent with memory controller-managed wear leveling are also possible; a designer, however, wishing to minimize control overhead associated with managing flash memory, not to mention avoiding L2P overhead on a flash memory device, will typically elect the clear advantages presented by the host-owned and shared configurations discussed above.

C. Shared Responsibility for Physical Address Management.

In some implementations, it might be desired for the memory controller to assign physical addresses for new data writes and then report these addresses back to the host; this is to say, in such an implementation, the host might not have architectural features required to assign physical addresses on its end so as to account for in-flight IO operations and to ensure maximum attainable device bandwidth utilization. Under such circumstances, this task can be beneficially delegated to the memory controller. To minimize latency and otherwise benefit from direct addressing in such circumstance, it is advantageous to provide physical addressing assigned by the memory controller back to the host, in order that the host can associate physical addressing with file-level and other logical addressing structures and appropriately update its L2P translation tables. This is to say, as part of the write operation, the memory controller extracts logical address, assigns physical address, updates its tracked metadata to track these addresses, and then reports this addressing information back to the host; the host, based on the logical address it specified and the physical address(es) returned by the memory controller, updates its tracked information so as to maintain L2P mapping. Such a process can also be used by the memory controller to provide address information back to the host in associated with a delegated copy or relocation operation, and with forms of controller-managed wear leveling and garbage collection (if implemented).

In another embodiment, the memory controller further cooperates with the host by keeping track of backward address translations, known as back references. This enables the host to derive logical addresses of the data block given their physical addresses as returned by the controller in response to queries such as used for managing garbage collection (GC) and "cold" data relocation (e.g., WL) candidates (e.g., such that the host is able to map new physical addressing to the pertinent logical files and addresses). Where the host software requires logical addresses to perform relocation while at the same time missing back references, it can request the controller to return, for each block range suggested in the query response, the metadata provided by host software when the block was written. That metadata, in particular, can contain a physical-to-logical mapping allowing for the physical block address as returned by the controller to be translated to the logical block address used by the host storage software. Once again, this permits the host to thereafter use physical addressing, avoiding costly extraneous address translation in the memory controller for IO operations. In one embodiment, this scheme is supported by native memory controller hardware and, once again, can be selected at initial power-up by programming pertinent registers on board the memory controller, such as the registers seen in FIG. 3B.

In a NVMe-compatible embodiment, both types of addressing-related exchanges between the host and the memory controller can be implemented using a NVMe logical block metadata exchange mechanism. To inform the host of memory controller assigned physical addressing (i.e., L2P correspondence), the memory controller specifies as part of the logical block metadata vector the physical addresses assigned to each logical block associated with the host write command. To store the host-provided logical addresses for subsequent retrieval and use (e.g., for GC or WL processes), logical addresses are sent from the host to the memory controller as logical block metadata accompanying a write command, and then are stored as part of the per-subdivision (e.g. per EU) metadata storage maintained by the memory controller for all managed memory.

Note that by using the NVMe logical block metadata structure, both types of exchanges retain the standard IO addressing interface and are compatible with the NVMe structure while at the same time providing the host with the ability to specify appropriate (i.e., logical or physical) addresses as needed.

Figure 13:
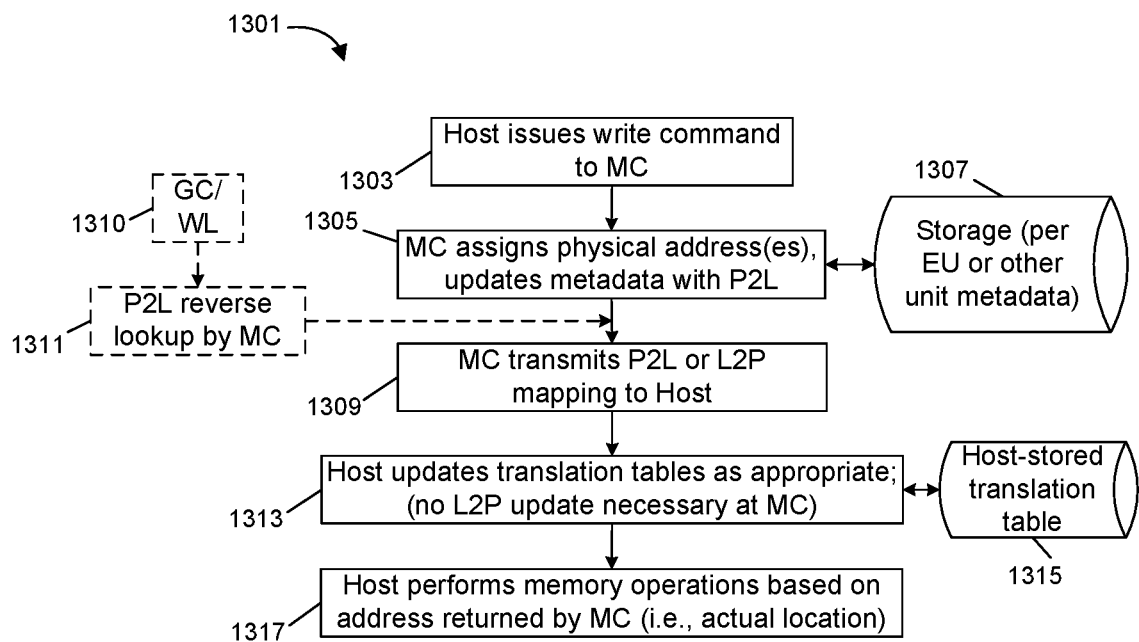
FIG. 13 shows a process associated with assignment of available space at memory controller, and ensuing reverse lookup and communication to a host of assigned physical address(es).

Such a process is generally designated by reference numeral 1301 in FIG. 13. In such a process, the host initiates a write command to the memory controller, as generally indicated by function block 1303. This write command specifies a logical address. The memory controller, upon receipt of this command, queries available space and assigns physical addressing as appropriate to the new write data. It also updates its local metadata storage with the pertinent information, indexed by physical unit (1305, 1307). This is to say, the memory controller maintains this information per erase unit (or other unit) information for the entire managed memory space. In the case where physical units such as EUs or physical pages are tracked, the memory controller stores each corresponding logical address as metadata for the pertinent physical unit. As mentioned, in another embodiment, the memory controller can also track this information in a manner indexed by assigned logical unit (e.g. block or page). The assigned physical address is then transmitted back to the host (e.g., as a confirmation code), per numeral 1309, and the host builds a L2P translation table by processing this data. Finally, the host updates its translation tables as appropriate (1313, 1315); as before, because the host maintains L2P information for all files stored in flash memory, it uses direct addressing (i.e., addressing of physical units) notwithstanding the presence of the memory controller (1317). That is, the memory controller is advantageously not encumbered by time consuming translation or address lookup mechanisms. Thus, for delegated data assignment (or the other mentioned processes), the memory controller can support residence space assignment, while at the same time providing the benefits of a physical access to specific addresses dictated by the host.

FIG. 13 also represents a process usable by the memory controller in connection with garbage collection (GC), wear leveling (WL) and certain other processes. That is, in a scheme where the host manages physical addressing (and specifies destination addresses for GC and WL processes) but where the memory controller is charged with suggesting garbage collection and/or wear leveling candidates, the memory controller advantageously informs the host of logical data correspondence associated with those candidates at the time of making suggestions; in this manner, the host missing back references can obtain logical addresses and peruse its L2P mapping tables as part of the GC or WL process. This functionality is various represented by dashed line blocks 1310 and 1311 in FIG. 13, and by solid-line blocks 1313, 1315 and 1317.

Those skilled in the art will recognize that other combinations of sole/shared management schemes other than those shown above are also possible.

With basic implementation of a cooperative flash memory controller and/or cooperative host thus described, this disclosure will now proceed to a description of an exemplary storage system configuration, with reference to FIGS. 14-19.

III. Architecture of an Exemplary Storage System or Subsystem.

FIGS. 14-19 are used to illustrate functions introduced above in an exemplary storage system. It should be assumed that a storage system or subsystem includes plural storage modules or drives, at least one of which is based on NAND flash memory solid-state devices (i.e., integrated circuits). A "drive" as used in this section denotes any grouping of memory that has a common memory controller, meaning a common interface that interprets commands and that directs memory access operations and associated physical addressing to dies or other forms of memory as appropriate. A memory controller can be in the form of an integrated circuit, and a drive can be in the form of a memory module, board, or other type of subsystem. Each drive can have one or more memory integrated circuits, disks or other storage media that are selected and accessed by the respective memory controller. Other configurations are also possible. The storage system can optionally be a hybrid or heterogeneous storage system; that is, the storage system can have plural drives, at least one of these is NAND flash-based solid-state drive (SSD), and one or more of these can optionally be a magnetic drive, such as a hard disk drive (HDD). In the context of a network-based storage appliance, the storage system or subsystem can be configured as a storage server having plural drives, each of which is a separate memory module.

As has been introduced previously, each SSD (and optionally, each other drive) in such an embodiment supports functional calls from the storage system to identify drive geometry. In one embodiment, drives can therefore be made interchangeable, with storage system dynamically adjusting its practices for any particular drive and the system as a whole according to whether the particular drive is a NAND-flash based and according to drive geometry. This architecture provides for host-controller cooperation in managing NAND flash memory-based storage devices in direct-attached and/or network-attached storage environments based on existing host storage software features, with minimal modifications of the latter. To that end, host storage software is modified and configured (relative to conventional designs) to perform management tasks as required by unique NAND flash memory requirements, with NAND-based storage device controller providing supportive information and features needed. By redefining host and controller responsibilities, with management task control regained by the host storage software, and each controller providing locally maintained metadata for cooperative management task execution, host-controller management feature duplication and associated disadvantages are avoided.

Figure 14:
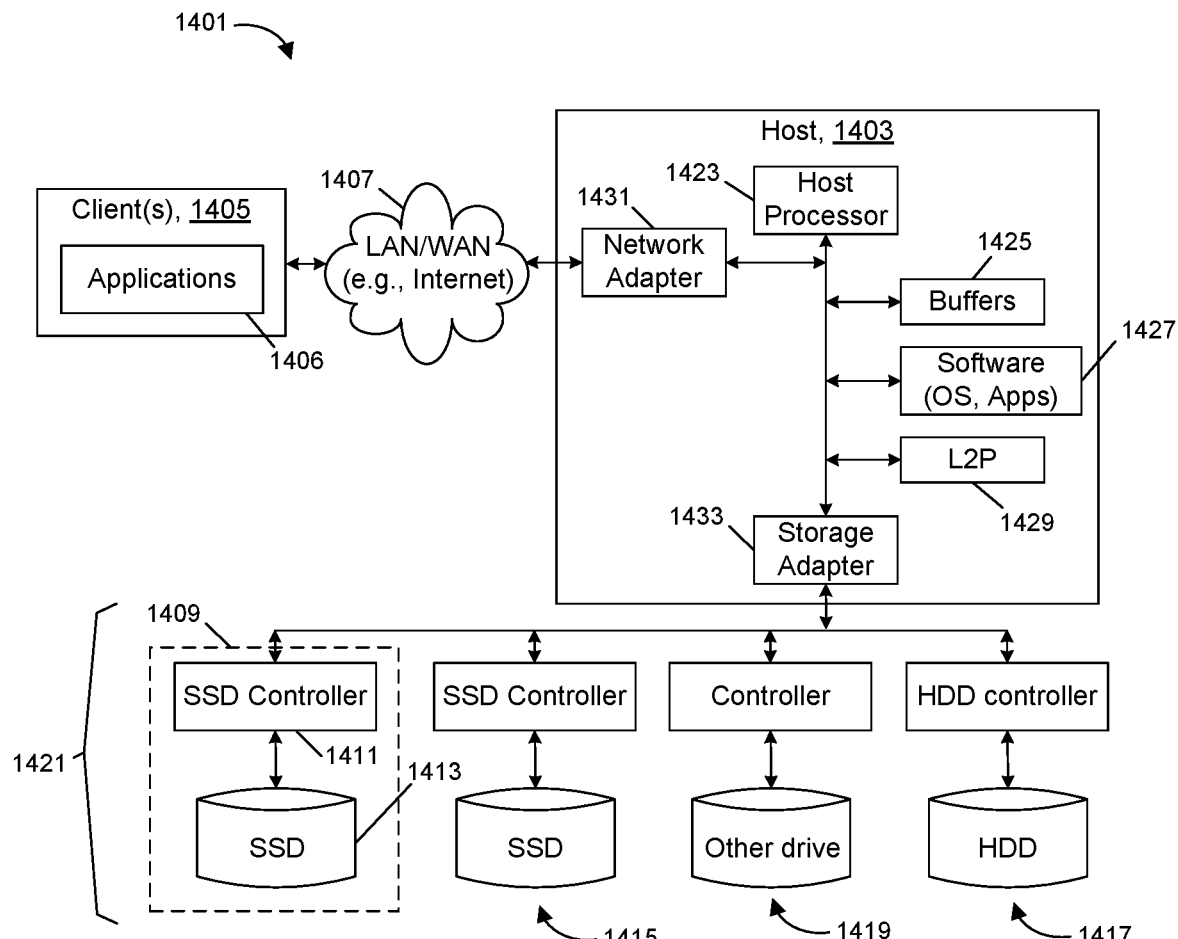
FIG. 14 illustrates a block diagram of a storage server having multiple solid state drives (SSDs) and hard disk drives (HDDs).

FIG. 14 illustrates an exemplary system 1401. In particular, a storage server 1403 receives requests for data or to store data, and optionally, requests for processing that data from one or more clients 1405. These clients each have respective applications 1406 which generate the respective data-related needs. The clients can each be desktop or laptop computers, smart phones, pads or other devices, or other types of digital systems. Each client 1405 sends requests to the storage server 1401 and receives responses via a wide area network, e.g., a local area network (LAN) or a wide area network (WAN) such as the Internet. The storage server, in turn, manages plural drives, each of which can be an SSD (e.g., a flash based drive), a HDD or another type of drive. As seen in FIG. 14, each drive also has its own dedicated memory controller, either bundled together as a single assembly 1409, or as separate devices; for example, assembly 1409 is seen to include a SSD controller 1411 and a SSD 1413. To simplify FIG. 14, a dashed-line box is shown only for assembly 1409. The SSD controller 1411 can be a NAND flash memory controller and the SSD 1413 can have one or more NAND flash memory devices. FIG. 14 also shows optional presence of other dedicate assemblies, 1415, 1417 and 1419, in this case seen to include a second SSD, an HDD and another unspecified type of memory, respectively. The collection of memory is seamlessly managed as a storage aggregate 1421, with the storage server managing scheduling for all drives so as to avoid collisions with storage-server-directed reads and writes, as described earlier. In this regard, the storage aggregate and the host are bundled together to form the storage server, but this is not required for all embodiments. The storage server has a storage operating system that implements a file system to organize the stored data as a hierarchical structure of logical data containers (e.g., volumes, logical units, directories and/or files) on electronic and/or magnetic storage media. It will be understood by those skilled in the art that this description may apply to any type of special-purpose computer (e.g., file server or storage serving appliance) or general-purpose computer embodied as, or having, a storage server or portion thereof. Moreover, the teachings of this description can be adapted to a variety of storage server architectures including, but not limited to, a network-attached storage (NAS), storage area network (SAN), or a disk assembly directly-attached to a client or host computer. The term "storage server" should therefore be taken broadly to include such arrangements.

The storage server 1403 includes a host processor 1423, which uses various buffers 1425 under the auspices of the host software 1427 to schedule and manage memory operations, including both memory transactions and memory maintenance operations. The host maintains a local L2P translation table so as to access files which can be fragmented in multiple memory locations and potentially multiple drives. The storage server also optionally employs policy-based space allocation, supporting data- and media-characteristic-aware data placement across the entire storage aggregate 1421. The storage server communicates with the clients 1405 via a network adapter 1431 and with the storage aggregate 1421 via a storage adapter 1433 (although it is also possible to have all communications performed via network adapter or otherwise remotely over a network such as a WAN or LAN).

In some implementations, the client(s) can issue packets including file-based access protocols such as the Common Internet File System (CIFS) protocol or Network File System (NFS) protocol over TCP/IP when accessing information in the form of files. In other implementations, the client(s) can issue packets including block-based access protocols such as the Small Computer Systems Interface (SCSI) protocol encapsulated over TCP (iSCSI) and SCSI encapsulated over FC (FCP) when accessing information in the form of LUNs or blocks. Also in some implementations, the storage adapter includes input/output (IO) interface circuitry that couples to SSDs (1409 and 1415) and HDD (1417) over an IO interconnect arrangement, such as a conventional high-performance Fibre Channel serial link topology.

The storage server manages flash memory using a log-structured copy-on-write file system, with physical block addressing and wear-aware writes of new data (as has been described earlier, e.g., in a manner that obviates need for an extensive FTL layer on the side of the SSD and that better distributes wear). The storage server is configured to access NAND flash memory, such as in drives 1409 and 1415. using physical block addressing, and to account for NAND flash memory-based device wear-out, and to execute garbage collection with associated valid data migration to manage NAND flash P/E asymmetry and other NAND flash management functions, all as referenced earlier. This is to say, each flash-based drive such as assemblies 1409 and 1415 advantageously have a cooperative memory controller that implements the principles described earlier. Depending on system architecture, host software manages interaction with each such controller. This architecture provides for host-memory-controller cooperation in managing NAND flash memory-based storage devices in direct-attached and/or network-attached storage environments. For example, each flash-based drive has a respective controller that serves information to the host regarding each subdivision of the associated memory. The storage server (in this case, the host) can manage wear distribution across multiple drives to help lessen wear to any one area of memory; for example, in the context of the wear-aware writes, the storage server can collect wear metrics for all flash memory managed as well as for other types of nonvolatile memory, if present. The storage server can combine bitmaps from multiple drives and can allocate if desired new writes to a single drive only if needed to better distribute wear. As mentioned, the host can also electively direct writes of data based on policy, for example, in a manner that avoids fragmentation or that groups certain types of data together based on read-write characteristics. In one embodiment, each SSD memory controller (such as controller 1411) is rooted in a configurable architecture that depends on host capabilities, policy, or other considerations. For example, in such an architecture, if the host processor does not support host-assignment of physical addresses for new writes, the host configures each SSD memory controller to perform this function and to report back assigned physical addresses as described earlier.

Figure 15:
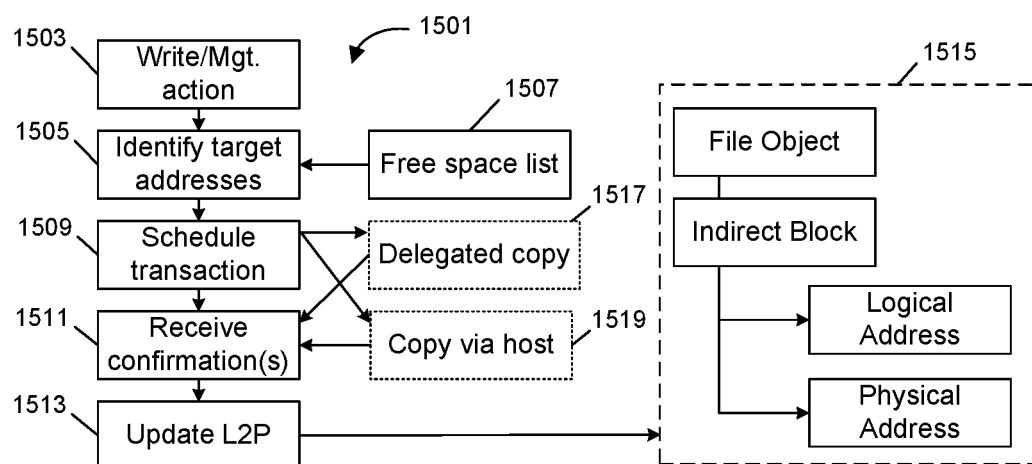
FIG. 15 illustrates a block diagram of functions performed a storage server operating system.

FIG. 15 provides a flow diagram 1501 used to discuss some considerations used by the host processor of FIG. 14 in performing wear-aware writes and in managing addressing. First, the host processor receives a trigger to write new data to memory or the host otherwise determines that a need for management action is warranted, for example, to relocate data (e.g., hot or cold data) and/or to reclaim space (1503). The host processor proceeds to determine target addresses (1505) that will serve as the write destination for the new/moved data, and it does this based on a list of available free space (1507). This list can if desired represent multiple drives as well as mixed memory types. For locations in flash, the data advantageously also is prioritized in order of least wear, i.e., such that the first location represents the most virgin space, and so forth. If the host processor/operating system does not have such a list, it proceeds to request one or otherwise initiates garbage collection and erase operations as necessary to generate free space; system designers if desired can implement a policy that ensures the list references at least a first threshold level of available free space, and that calls garbage collection and explicit erase to raise available free space to a second level (e.g., employing hysteresis) any time this list represents free space less than the first threshold. With the target physical addresses thereby identified, the storage server then proceeds to schedule memory operations (1509). In a multiple drive system, this can be achieved using one or more transaction queues (one for each control path or bus) which interleave commands as appropriate to multiple drives. Once the host processor receives confirmations of completion of the various commands (1511), the host processor then updates its L2P translation tables and file references (1513). Numeral 1515 references an exemplary file naming structure, i.e., where each file is an object having a name, and where the file is stored across multiple, not-necessarily-contiguous blocks. The file has one or more indirect references (for example, to memory locations that will store lists of physical addresses for blocks having ordered portions of the file), and it has physical address and logical position within the file for each such file reference. When a transaction is completed, for example, changing physical address in association with a data copy operation, the physical address of data move from a first block to a second is changed (updated), so that the host software can thereafter use direct physical addressing to identify locations of the subject-data. Note that FIG. 15 shows two options in dashed lines, including a delegated copy operation 1517, and a copy-via-host operation 1519. That is, in situations where a data copy operation is dictated, the delegated copy operation can be employed to perform data transfers within a single SSD as described earlier, which does not encumber the host processor-memory controller connection with the requirement of data transfer. As indicated by function block 1519, transfers in between different drives will typically be processed by first transferring data back to the host processor, and then onto the second drive.

Figure 16:
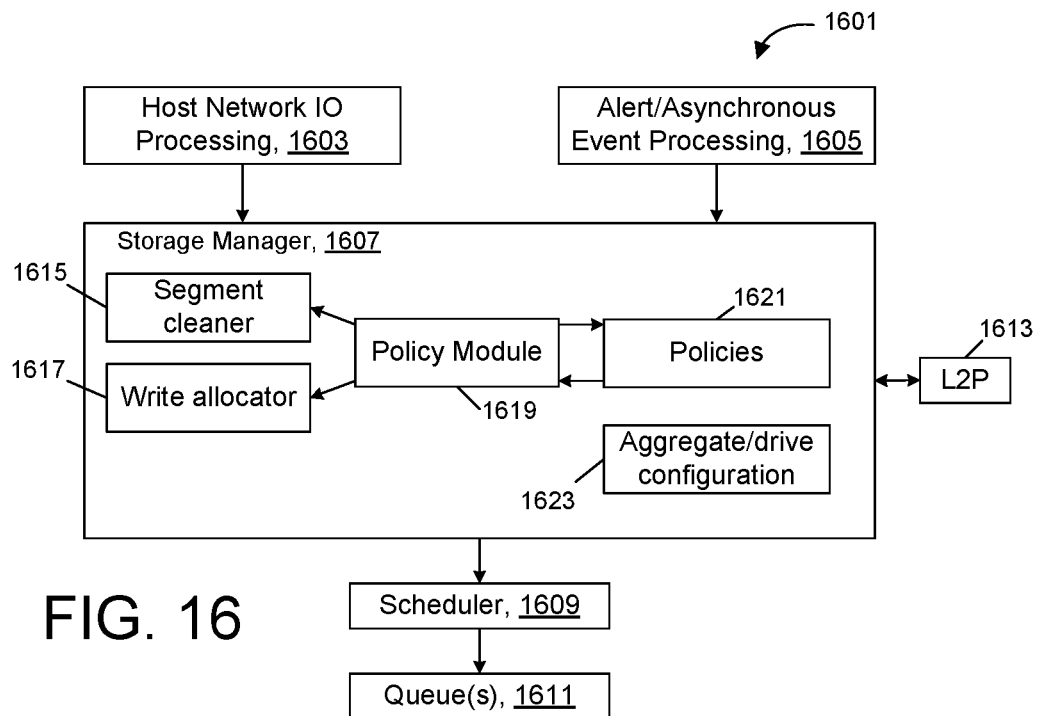
FIG. 16 illustrates a block diagram of storage management tasks used by a storage server.

FIG. 16 shows a block diagram for functions of host software 1601 in managing SSDs. Generally speaking, the host software 1601 first identifies a condition associated with a SSD, for example, a new data access request from a client (1603) or an alert condition (or asynchronous return from memory), represented by numeral 1605. The host software then invokes a storage manager 1607 to determine actions that need to be taken with respect to flash memory. The storage manager, in turn, sends actions to a scheduler 1609. Actions can include requests that are to be immediately sent to memory as well as conditional requests, for example, for background processing. As an illustrative example of the latter operation, it might be desired to perform space reclamation and release of additional space as a background operation (for example, to provide buffering of available space not critically needed by the host); such a request can be queued by the scheduler and invoked at a time when background traffic (e.g., frequency of other IO operations) are below a threshold level of traffic. As operations are scheduled, constituent commands associated with those operations are sent to a transaction queue 1611 for pipelined issuance to the pertinent SSD(s). In this regard, the storage manager 1607 relies on interaction with a host-maintained L2P address translation table 1613 to select pertinent "direct" physical addresses associated with each command. Note that the scheduler can interleave commands for one SSD with commands for a second SSD (or an HDD or other drive type). As another illustrative example, the storage server might be called upon to retrieve a large media file (e.g., for a streaming application) from one drive while freeing space in a second drive. The transaction queue can interleave periodic requests to the first drive for the read data (e.g., to maintain sufficient streaming buffer occupancy) with periodic commands to the second drive to relocate data and erase EUs of that drive until the desired amount of space has been released. Additional detail will be presented below relating to performance of these types of operations. As depicted by FIG. 16, the storage manager 1607 can include a number of components, including a segment cleaner module 1615, and a write allocator module 1617. The storage manager can interact with policy module 1619 and a policy repository 1621 in configuring and managing each of two modules. That is, the host software in this exemplary system configures the segment cleaner module 1615 to operate (e.g., to free additional space, perform garbage collection, weal leveling, defragmentation and relocation of existing data) within homogeneous storage media, between heterogeneous storage media, or both, in accordance with any specified policies. The write allocator module 1617 is used to allocate physical subdivisions that may then be written to, as previously described above. Note that, as was alluded to previously, the host software beneficially is provided with the ability to query each controller and/or drive of the storage aggregate to determine drive type, manufacturer, capabilities and other information pertinent to the management of memory and system configuration. This information is stored for use by the storage manager 1607 in accessing and managing the drives, as generally indicated by reference numeral 1623.

A. Reclamation in NAND-Flash Memory (SSDs).

Figure 17:
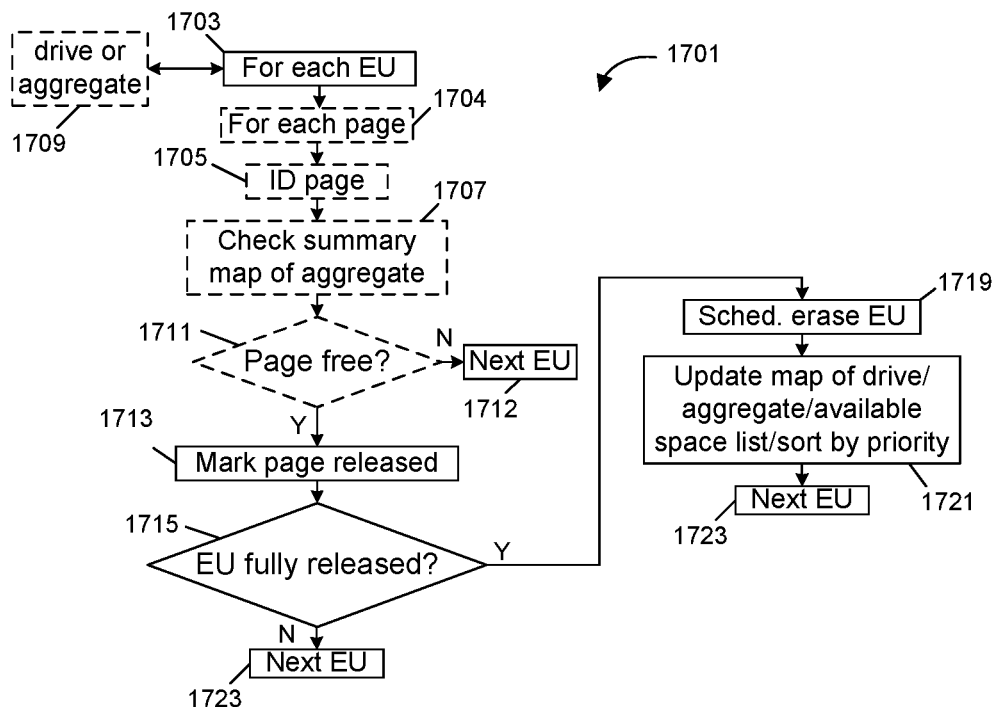
FIG. 17 illustrates how space reclamation is applied to mitigate P/E asymmetry.

Host-assisted space reclamation uses metadata from a flash controller to reclaim and consolidate space owing to P/E asymmetry in flash, using principles described earlier. If it were not for the P/E asymmetry, the storage server could equate physical memory no longer used for valid data with free space. Such is generally the case for HDDs and other forms of random access memory, to the extent managed in common by the storage server. However, for flash drives (or other memory types having P/E asymmetry), released space cannot typically be reused until (a) all independently-writable units that form an EU have been released, and (b) an explicit erase procedure has been performed, in a manner that returns the floating gates of each constituent memory cell back to a default state. FIG. 17 illustrates a method 1701 that can be used applied by the host software. Note that it can be beneficial to postpone or batch reclamation operations. In particular, it may be advantageous to schedule erase operations for a later point in time, scheduled in a manner appropriate to load and other system-level considerations; as an example, if free space shortage is not critical, it can be advantageous to batch erase operations to times of low network traffic or when there is low demand for a particular storage drive. The EU units and its pages are only marked as free once the erasure has successfully completed and confirmed by return of completion code by the particular memory controller.

FIG. 17 generally shows two methods, including a method of automatic erasure (if appropriate) each time a page is released, represented by solid lines only, and a method of batched space reclamation appropriate for address ranges, specified "candidate" EUs, or for a drive as a whole. The latter method will be described first. The method 1701 generally starts at step 1703, for which at least one EU is identified. For each EU identified, at 1704, the method proceeds to check each page of that EU to see if it is released; that is, as indicated by steps 1705, 1707 and 1711, the method tests whether the pertinent page is no longer referenced by any file system structure. If a page is still referenced, the method ends for that EU at step 1712, and the method then continues to the next EU (1703). If it is not referenced, at step 1713 the page is marked as released rather than free. If a page is determined to be free, the bitmap is checked (1715) to determine whether it is the last page of that EU; for EUs that are determined to be fully released, the method continues at 1717, with an explicit erase operation being called (1719) and the drive summary information being updated (1721); otherwise, the method ends for that EU at step 1716, and the method then proceeds to the next EU (1703). The method then proceeds to the next EU (1723). For example, if the method is called for a specific range or list of EUs, the method 1701 proceeds in this manner for each EU until it has processed the last EU. Note that, as indicated by reference numeral 1709, this method can optionally be performed for a storage aggregate or for each drive on an independent basis.

As noted, FIG. 17 also shows steps associated with a page release operation (i.e., solid lines only). That is, in some implementations, it might be desired to have the storage server immediately schedule an erase operation each time "the last page" in any EU is released. Such a method begins at 1713, where the host processor identifies a page release—the host processor checks the pertinent bitmap to see whether the latest release has resulted in the EU being fully released (1715); if it is not fully released, the method ends. If the EU is fully released, the method continues at the right side of FIG. 17, where an explicit erase operation is automatically queued (1719); when this operation is confirmed, the bitmap for the drive or aggregate as pertinent is updated (1721), and the method ends.

B. Garbage Collection.

In one embodiment, garbage collection is performed to reclaim space of EUs where the amount of released space relative to unreleased space exceeds a predetermined threshold. Garbage collection is achieved by copying valid data to another tier or another location in the same tier to release source locations. The valid data can be combined with other data, for example, data from the same file (e.g., for purposes of defragmentation), or data belonging to another file. Once all valid data for an EU has been relocated, all portions of a partially used EU are thereby released, and the EU can be marked as fully released and erasable. The method just discussed can then (or at a later time associated with batch processing) be called to trigger the erase operation. Note that any desired garbage collection policy or trigger can be used, and that such a policy or trigger can be dynamically adjusted. For example, garbage collection can be performed using a batch process, in a manner analogous to the batched processing just discussed. Alternatively, garbage collection could be initiated (or a host alerted) any time released space to valid (unreleased, written space) exceeds a 1:1 ratio (e.g., less than 50% page utilization). Such a metric could be dynamically changed, e.g., this metric could be dynamically varied such that (depending on policy or other system considerations) garbage collection would be initiated when this ratio exceeds 1:5 (e.g., at least twenty percent of valid space in an EU has been released), or implemented by policy module (1619 from FIG. 16) as a policy applicable to supportive flash-memory controllers and/or drives. Many such examples are possible.

Figure 18:
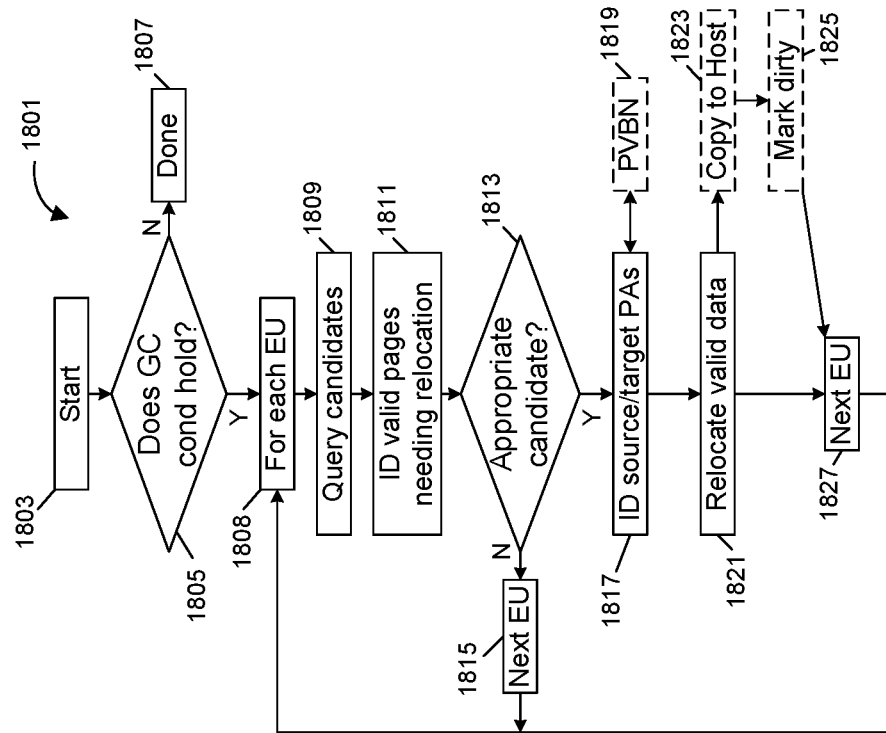
FIG. 18 illustrates a garbage collection process.

FIG. 18 illustrates a method followed by the host processor/software (e.g., by the segment cleaner of FIG. 16) in response to a garbage collection (GC) alert raised by a flash memory controller. The method starts at step 1803. While such an alert remains in effect (1805), the host software identifies a specific EU under consideration (e.g., from a prioritized list of EUs) and then loops from one EU to another (1808) through a range of EUs. When the list is exhausted, the method queries whether the GC condition alert still holds (1805)—as long as the condition that triggered the alert remains valid (e.g., an available space shortage, or EUs not satisfying a threshold level of utilization), the method retrieves a successor list and processes each EU in that list. Once the condition is cleared, the process stops at step 1807.

At step 1809, the host software queries the memory controller for candidate segments that are suitable for GC. Step 1811 will loop for each returned GC candidate. If storage manager (1607 from FIG. 16) does not employ back references, controller-provided backward address translation as described earlier may be applied at this step, to derive logical addresses of the returned candidate ranges identified by their physical flash addresses. At step 1813, host software screens whether each suggested candidate is an appropriate candidate for relocation; for example, due to policy or other considerations, it might be desired to not relocate certain types of data (e.g., a host policy is in effect that groups certain types of data together at one location based on read-write characteristics). If the candidate is not appropriate, the host software then proceeds to examine the next candidate in the list, per numeral 1815. If the candidate is appropriate, the host identifies pages needing relocation (1817), typically from information provided by the memory controller together with suggested candidates; this can optionally be provided in the form of a bitmask of valid data that needs relocation. The host software (e.g., the segment cleaner) at step 1819 then schedules the relocation operation (1821), identifying source and target physical addresses as appropriate. As referenced earlier, such an operation can be performed using a delegated copy process for relocation within a source SSD, or alternatively can be performed to relocate data to a different drive (and potentially a different memory type). As indicated by dashed-line numerals 1823 and 1825, such an operation typically calls for reading data to the host processor and attendant memory, and marking the data as pseudo-dirty (i.e., as modified even though the data is not in this example). The pseudo-dirty modification will trigger scheduling of a copy-on-write operation that then rewrites this data to available memory space. The process of FIG. 17 can then be called to fully erase the pertinent EU (and to add that EU to the pertinent list of available space). Note that, if desired, the destination of such a copy-on-write operation can be selected according to policy. Finally, per numeral 1827, the next EU in the candidate list is processed. If the segment cleaner chooses not to relocate data immediately, it will save the candidate for later relocation.

C. Shared and Host-Owned Wear Leveling.

With shared and host-owned wear leveling, the storage server becomes aware of physical blocks (e.g., EUs) that represent "cold" (or optionally, "hot") data and, thus, that potentially signify uneven wear. In one implementation of a "shared" scheme, the host can periodically ask for a drive- or system-wide wear metric and an updated list of wear leveling candidates in advance of any wear leveling process to ensure quick allocation is possible when they are needed. The storage server then can then schedule processing of this list as a periodic maintenance operation, or as a background process. If and when the list starts being exhausted, a new list can be requested. While in a shared scheme the list request is sent to the memory controller, in a host-owned scheme, this query can be sent to another host process.

In one implementation, the write allocator of FIG. 16 interacts with the memory controller to replenish a pool of wear-ordered EUs when either the pool becomes small or when the memory controller (or host software) detects a wear leveling related condition that requires host's attention. The latter can occur for example, when due to recalculation of device wear distribution, the memory controller or the host detects the existence of other EUs that are now considered less worn out relative to mean wear; alternatively, this condition can also exist when one or more EUs are detected to have significantly-less-than-normal wear. The pool in this context can include EUs having "cold data" that otherwise represent low wear relative to the mean, and that are to be recycled, such that future writes will be directed to these "low wear" EUs instead of further contributing to wear variance in a particular SSD.

Figure 19:
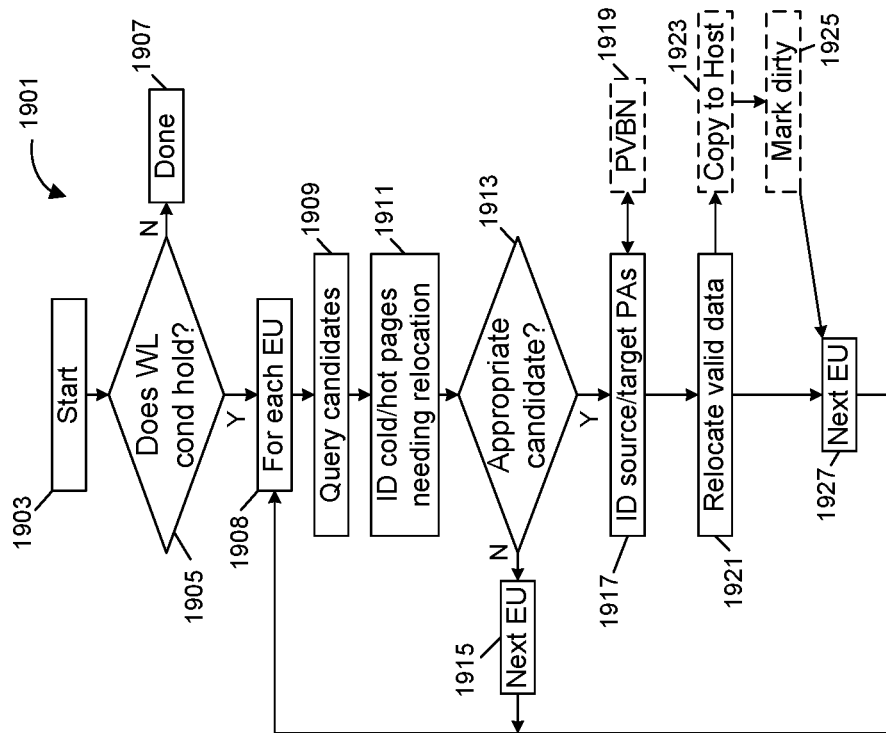
FIG. 19 illustrates a process associated with wear leveling.

A wear leveling process from the host processor's perspective is seen in FIG. 19, and is generally designated by numeral 1901. The illustrated method is substantively similar to the method of FIG. 18, used for garbage collection.

The method starts at step 1903. While the need for wear leveling remains in effect (1905), the host software identifies specific EUs under consideration (e.g., from a prioritized list of EUs) and then loops from one EU to another (1908) through the EUs specified in any provided list or range. When the list is exhausted, the method queries whether the WL condition alert still holds (1905)—as long as the condition that triggered the alert remains valid (e.g., an available space shortage, or EUs not satisfying a threshold wear metric utilization), the method retrieves a successor list and processes each EU in that list. Once the condition is cleared, the process ends (1907).

At step 1909, the host software queries the memory controller for candidate segments that are suitable for WL. Step 1911 will loop for each WL candidate. The host software screens whether each suggested candidate is an appropriate candidate for relocation (1913), for example, not redistributing space which according to policy might be used for areas reserved for important system parameters. If the candidate is not appropriate, the host software then proceeds to examine the next candidate in the list, per numeral 1915. If the candidate is appropriate, the flash memory controller identifies pages needing relocation (1917); this can optionally be permed by calling on the memory controller to provide the starting physical block number (e.g., page number) and bitmask of valid data that needs relocation. The host software (e.g., the segment cleaner) at step 1919 then schedules the relocation operation (1921), identifying source and target physical addresses as appropriate. As referenced earlier, such an operation can be performed using a delegated copy process for relocation within a source SSD, or alternatively can be performed to relocate data to a different drive (and potentially a different memory type). As indicated once again by optional process blocks 1923 and 1925, the data can be read back to the host operating system, and the data can be marked as dirty so as to trigger a copy-on-write operation that then rewrites this data to available memory space. The process of FIG. 17 can then once again be called to fully erase the pertinent (and to add that EU to the pertinent list of available space). The destination of such a copy-on-write operation can once again be selected according to policy. Finally, per numeral 1927, the next EU in the candidate WL list is processed.

IV. Multi-Modal Operation.

As should be apparent from the description above, a cooperative storage architecture facilitates performance of management and access functions across multiple drives, regardless of type of memory. Reserving some SSD (i.e., flash) functions to the host in this architecture helps ameliorate latency concerns and drive expense issues that have traditionally hindered use of SSD drives in direct-attached and network storage applications. That is, the techniques and functions that contribute to this architecture can be embodied in memory devices themselves, controllers for memory devices or drives, the host, or in any combination of these elements. Note however that in practice, it might be desired to fabricate a memory, memory controller or host architecture (e.g. host software) in a manner that supports both implementations with other cooperative storage elements and implementations with legacy devices. In addition, it is possible to fabricate elements and systems that, depending on design or network management considerations, selectively use certain cooperative techniques but not others.

Thus, in one embodiment, a memory controller supports any one or more of the host-owned, cooperative, or memory-controller owned modes or features described above. A register (for example, part of the memory controller storage 111 from FIG. 1) can be programmed with a value, for example, by hardwiring a signal connection or setting a fuse, or by configuration at initial power-up. Providing a number of programmable modes in this manner permits a cooperative memory controller and/or cooperative host to be used both in the cooperative management of memory (e.g., where the host processes data provided by the controller and where the memory controller tracks subdivision-specific usage information) and also with legacy components that do not support these cooperative features. In addition, providing these capabilities also provides flexibility to a host or system designer in the selection of mode based on performance criteria, intended application, or other factors.

V. Conclusion.

The description presented above provides examples of a cooperative memory controller as well as a host that interacts with such a memory controller, a storage system architecture, and various memory systems. As indicated, these techniques can optionally be employed with any one or more of these components. Further, while various embodiments shown above have described structure and functions in the context of a host, memory controller and/or memory, it should be understood that various ones of these components can be combined with one another or packaged, mounted or sold together. For example, depending on implementation, a host processor can be copackaged with a memory controller or mounted to a common board. Conversely, it is possible to copackage a memory controller with memory, such as mounted them on a single die, multichip module or system on chip (SoC). In the system context, solid state drives (SSDs) and hard disk drives (HDDs) have been described as generally having their own, dedicated controllers, but it is possible to have multiple types of memory managed by a single controller, i.e., with a drive or memory itself constituting a hybrid. Further to the system context, embodiments have been described having two tiers of memory, but it is possible to have a single tier of memory (e.g., all NAND-flash), or three or more tiers of memory. As an example, one contemplated implementation features a host with multiple tiers of fast-access memory (e.g., local SRAM and DRAM), one or more SSDs and one or more HDDs, configured as different tiers. Some embodiments may omit one or more of these in favor of other memory types, for example, the HDDs can be omitted, or a different type of storage media can be used.

To provide a few further examples, instead of using flash memory, the techniques applied above can be applied to other forms of both volatile and nonvolatile memory. For example, it is possible to apply some of the management and network configuration schemes discussed above to DRAM and other forms of volatile memory. In addition, some or all of the garbage collection, space reclamation, geometry reporting, wear leveling, defragmentation and other schemes discussed above can be applied to other forms of nonvolatile memory. Although known by a variety of names, these memories typically have bistable elements have properties where resistance change is a manifestation of some type of change in physical materials. For example, RRAM, magnetic random access memory (MRAM), phase change random access memory (PCRAM), nanowire RAM, and similar designs all operate based on similar state change principles where the current that flows through the material (or equivalently, voltage drop seen across the material) changes depending on state of the underlying materials. Therefore, in many of the detailed examples provided above, flash memory is used, but as mentioned, other designs are possible. Also, the examples discussed above were focused on NAND-flash memory, but it should be equally possible to apply the teachings herein to NOR-flash memory designs.

Also, the techniques discussed above, when implemented on a comprehensive basis, permit substantial reductions in memory controller functions which would be conventionally needed to manage an FTL. However, as should be apparent from the examples provided above, many of the cooperative techniques provided by this disclosure and supporting circuitry can be implemented in embodiments that utilize a traditional FTL. For example, it is possible to combine cooperative garbage collection and space reclamation processes with a conventional FTL. Advantageously, by providing ready-host visibility into EU-specific, tracked parameters (e.g., metadata) and making liberal use of cooperative capabilities, a given design can eliminate much of the overhead that would be traditionally needed to manage an FTL.

It should be noted that the subject matter disclosed herein can be expressed (or represented), as data and/or instructions embodied in various computer-readable storage media, meaning physical non-transitory media such as computer memory, storage disks and the like. In this context, the described subject matter can take the form of instructions or data for fabricating an integrated circuit (or integrated circuits) that, when built and operated, possesses the circuits and structures, and performs the techniques described herein. An output of a process for designing an integrated circuit, or a portion of an integrated circuit, comprising one or more of the circuits described herein may be such a computer-readable medium such as, for example, a magnetic tape or an optical or magnetic disk, or other non-volatile physical storage. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein. Some or all of the functions described above can also be embodied as instructions stored on machine-readable media, including software code or firmware that, when executed, cause a machine (e.g. a microprocessor or device having a microprocessor) to perform the described functions. Generally speaking, any such instructions can be alternatively implemented as hardware logic, or a combination of hardware and software logic, depending on implementation.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory controller integrated circuit to control flash memory, the flash memory having a hierarchical structure of subdivisions, each subdivision of the flash memory at a higher tier of the hierarchical structure comprising plural subdivisions at a lower tier of the hierarchical structure, the memory controller integrated circuit comprising:
   logic to receive read requests and write requests from a host and to control the performance of the read requests and the write requests in the flash memory, including the storage of first data in a first subdivision at the lower tier, the first subdivision at the lower tier being associated with a first subdivision at the higher tier, in response to a first write request;
   logic to receive one or more commands from the host to copy the data from the first subdivision at the lower tier into a second subdivision at the lower tier, and to subsequently erase the first subdivision at the lower tier, so as to place the first subdivision at the lower tier into a state in which it can be reprogrammed, wherein the second subdivision at the lower tier is associated with a second subdivision at the higher tier; and
   logic to receive a host-supplied address for each of the read requests and the one or more commands, and to responsively generate physical addresses to select a specific subdivision at each of the higher tier and the lower tier;
   wherein a non-exhaustive portion of each host supplied-address as sent by the host is mapped in advance to the subdivisions at the higher tier, the higher tier comprising one of a channel, a die, or a block within a die, such that each host-supplied address is effective to select one of the subdivisions at the higher tier according to a value of the non-exhaustive portion;
   wherein said memory controller integrated circuit is to copy the first data into the storage location corresponding to the second subdivision at the lower tier, responsive to the one or more commands, without sending the data to the host;
   wherein the one or more commands are to select each of the first subdivision at the higher tier and the second subdivision at the higher tier respectively as a source of the data to be copied and a destination of the data to be copied;
   wherein said memory controller integrated circuit further includes logic to assign address information for a storage location in the flash memory in connection with a prior write request received from the host for the data and to transmit to the host metadata which identifies the address information, and wherein each host-supplied address for the data includes the address information; and
   wherein each said logic comprises at least one of (1) hardware circuit elements or (2) instructions stored on non-transitory storage which, when executed, are to control circuitry of said memory controller integrated circuit.

2. The memory controller integrated circuit of claim 1, wherein said memory controller integrated circuit is not, in response to the one or more commands, to write, read or erase data stored in any subdivision at the higher tier in response to the one or more commands, excepting storage locations associated with the first and second subdivisions at the higher tier.

3. The memory controller integrated circuit of claim 2, wherein each subdivision at the higher tier is a respective erase unit of the flash memory and wherein each of the plural subdivisions at the lower tier is a page of flash memory cells.

4. The memory controller integrated circuit of claim 2, wherein each subdivision at the higher tier comprises a respective independently-controlled array of flash memory cells.

5. The memory controller integrated circuit of claim 1, wherein the one or more commands comprise a copy command and wherein the copy command is to explicitly specify each of a source address and a destination address for copying of the data between physical storage locations.

6. The memory controller integrated circuit of claim 5, wherein the source address corresponds to a storage location within the first subdivision at the higher tier of the flash memory, wherein the destination address is a logical address, and wherein the flash memory integrated circuit comprises logic to perform address translation, to convert the destination address to a physical address for a specific page of flash memory cells associated with the second subdivision at the higher tier.

7. The memory controller integrated circuit of claim 1, wherein:
   said memory controller integrated circuit further comprises
      logic to cause said memory controller integrated circuit to detect a need for move of said first data, and
      logic to transmit to the host information identifying said need;
   said logic to receive the read requests and the write requests from the host and to control the performance of the read requests and the write requests is to control the performance of the read requests and the write requests notwithstanding prior transmission to the host of said information identifying said need, said one or more commands from the host being interleaved amongst the read requests and the write requests; and
   a timing of the one or more command from the host is effective to determine when the memory controller integrated circuit is to perform said move and said erase, relative to performance of the read requests and the write requests.

8. The memory controller integrated circuit of claim 7, wherein an order of (1) receipt of the one or more commands, relative to (2) receipt of the read requests and the write requests, is effective to determine when the memory controller integrated circuit is to perform execution of the one or more commands relative to performance of the respective requests.

9. The memory controller integrated circuit of claim 1, wherein said memory controller integrated circuit is to store metadata associated with the first data into a memory location respective to the first subdivision at the lower tier and, wherein further, responsive to the one or more commands, said memory controller integrated circuit is to move the metadata from the memory location respective to the first subdivision at the lower tier into a memory location respective to the second subdivision at the lower tier.

10. An apparatus comprising instructions stored on non-transitory machine-readable media, for use in controlling flash memory, the flash memory having a hierarchical structure of subdivisions, each subdivision of the flash memory at a higher tier of the hierarchical structure comprising plural subdivisions at a lower tier of the hierarchical structure, said instructions when executed to cause circuitry of a memory controller integrated circuit to:
   receive read requests and write requests from a host and control the performance of the read requests and the write requests in the flash memory, including the storage of first data in a first subdivision at the lower tier, the first subdivision at the lower tier being associated with a first subdivision at the higher tier, in response to a first write request;
   receive one or more commands from the host to copy the data from the first subdivision at the lower tier into a second subdivision at the lower tier, and to subsequently erase the first subdivision at the lower tier, so as to place the first subdivision at the lower tier into a state in which it can be reprogrammed, wherein the second subdivision at the lower tier is associated with a second subdivision at the higher tier; and
   receive a host-supplied address for each of the read requests and the one or more commands, and responsively generate physical addresses to select a specific subdivision at each of the higher tier and the lower tier;
   wherein a non-exhaustive portion of each host supplied-address as sent by the host is mapped in advance to the subdivisions at the higher tier, the higher tier comprising one of a channel, a die, or a block within a die, so as to select one of the subdivisions at the higher tier;
   wherein said instructions when executed are to cause the memory controller integrated circuit to copy the first data into the storage location corresponding to the second subdivision at the lower tier without sending the data to the host, responsive to the one or more commands;
   wherein the one or more commands are to select each of the first subdivision at the higher tier and the second subdivision at the higher tier respectively as a source of the data to be copied and a destination of the data to be copied; and
   wherein said instructions are further to cause the memory controller integrated circuit to assign address information for a storage location in the flash memory in connection with a prior write request received from the host for the data and to transmit to the host metadata which identifies the address information, and wherein each host-supplied address for the data includes the address information.

11. The apparatus of claim 10, wherein said instructions are to control the memory controller integrated circuit so as to not, in response to the one or more commands, write, read or erase data stored in any subdivision at the higher tier in response to the one or more commands, excepting storage locations associated with the first and second subdivisions at the higher tier.

12. The apparatus of claim 11, wherein each subdivision at the higher tier is a respective erase unit of the flash memory and wherein each of the plural subdivisions at the lower tier is a respective page of flash memory cells.

13. The apparatus of claim 11, wherein each subdivision at the higher tier comprises a respective independently-controlled array of flash memory cells.

14. The apparatus of claim 10, wherein the one or more commands comprise a copy command and wherein the copy command is to explicitly specify each of a source address and a destination address for copying of the data between physical storage locations.

15. The apparatus of claim 14, wherein the source address corresponds to a storage location within the first subdivision at the higher tier of the flash memory, wherein the destination address is a logical address, and wherein the flash memory integrated circuit is to perform address translation, to convert the destination address to a physical address for a specific page of flash memory cells associated with the second subdivision at the higher tier.

16. The apparatus of claim 10, wherein:

said instructions, when executed, are further to cause the memory controller integrated circuit to detect a need for move of said first data, and transmit to the host information identifying said need;

the memory controller integrated circuit is to control the performance of the read requests and the write requests, notwithstanding prior transmission to the host of said information identifying said need, said one or more commands from the host being interleaved amongst the read requests and the write requests; and a timing of the one or more command from the host is effective to determine when the memory controller integrated circuit is to perform said move and said erase, relative to performance of the read requests and the write requests.

17. The apparatus of claim 16, wherein an order of (1) receipt of the one or more commands, relative to (2) respective requests of the read requests and the write requests, is effective to determine when the memory controller integrated circuit is to perform execution of the one or more commands relative to performance of the respective requests.

18. The apparatus of claim 10, wherein said instructions, when executed, are to cause the memory controller integrated circuit to store metadata associated with the first data into a memory location respective to the first subdivision at the lower tier and, wherein further, responsive to the one or more commands, to move the metadata from the memory location respective to the first subdivision at the lower tier into a memory location respective to the second subdivision at the lower tier.

19. A storage drive, comprising:

flash memory having a hierarchical structure of subdivisions, each subdivision of the flash memory at a higher tier of the hierarchical structure comprising plural subdivisions at a lower tier of the hierarchical structure; and a memory controller integrated circuit to control flash memory, the memory controller integrated circuit comprising logic to receive read requests and write requests from the host and to control the performance of the read requests and the write requests in the flash memory, including the storage of first data in a first subdivision at the lower tier, the first subdivision at the lower tier being associated with a first subdivision at the higher tier, in response to a first write request, logic to receive one or more commands from the host to copy the data from the first subdivision at the lower tier into a second subdivision at the lower tier, and to subsequently erase the first subdivision at the lower tier, so as to place the first subdivision at the lower tier into a state in which it can be reprogrammed, wherein the second subdivision at the lower tier is associated with a second subdivision at the higher tier, and logic to receive a host-supplied address for each of the read requests and the one or more commands, and to responsively generate physical addresses to select a specific subdivision at each of the higher tier and the lower tier;

wherein a non-exhaustive portion of each host supplied-address as sent by the host is mapped in advance to the subdivisions at the higher tier, the higher tier comprising one of a channel, a die, or a block within a die, such that each host-supplied address is effective to select one of the subdivisions at the higher tier according to a value of the non-exhaustive portion;

wherein the memory controller integrated circuit is to copy the first data into the storage location corresponding to the second subdivision at the lower tier, responsive to the one or more commands, without sending the data to the host;

wherein said memory controller integrated circuit further includes logic to assign address information for a storage location in the flash memory in connection with a prior write request received from the host for the data and to transmit to the host metadata which identifies the address information, and wherein each host-supplied address for the data includes the address information; and wherein each said logic comprises at least one of (1) hardware circuit elements or (2) instructions stored on non-transitory storage which, when executed, are to control circuitry of said memory controller integrated circuit.

20. The storage drive of claim 19, wherein said memory controller integrated circuit is not, in response to the one or more commands, to write, read or erase data stored in any subdivision at the higher tier in response to the one or more commands, excepting storage locations associated with the first and second subdivisions at the higher tier.

21. The memory controller integrated circuit of claim 1, further comprising logic to transmit to the host information representing the structural hierarchy, including a number of the subdivisions at each of the higher tier and the lower tier that are available to the host for the storage of data, and wherein the host-supplied addresses are to be configured by the host responsive to said transmitted information.

22. The apparatus of claim 10, further comprising instructions that when executed are to cause circuitry of the memory controller integrated circuit to transmit to the host information representing the structural hierarchy, including a number of the subdivisions at each of the higher tier and the lower tier that are available to the host for the storage of data, and wherein the host-supplied addresses are to be configured by the host responsive to said transmitted information.

23. The storage drive of claim 19, wherein the memory controller integrated circuit further comprises logic to transmit to the host information representing the structural hierarchy, including a number of the subdivisions at each of the higher tier and the lower tier that are available to the host for the storage of data, and wherein the host-supplied addresses are to be configured by the host responsive to said transmitted information.

24. The memory controller integrated circuit of claim 7, wherein the logic to cause said memory controller integrated circuit to detect the need for move of said first data is to identify a condition when said first data is at least one of hot or cold relative to a threshold, and is to responsively identify the need for the move.

25. The apparatus of claim 16, wherein said instructions, when executed, are further to cause the memory controller integrated circuit to detect the need for move of said first data by identifying a condition when said first data is at least one of hot or cold relative to a threshold, and to responsively identify the need for the move.

26. The storage drive of claim 19, wherein:
said memory controller integrated circuit further comprises
logic to cause said memory controller integrated circuit to detect a need for move of said first data, and
logic to transmit to the host information identifying said need;
said logic to receive the read requests and the write requests from the host and to control the performance of the read requests and the write requests is to control the performance of the read requests and the write requests notwithstanding prior transmission to the host of said information identifying said need, said one or more commands from the host being interleaved amongst the read requests and the write requests; and
a timing of receipt of the one or more command from the host is effective to determine when the memory controller integrated circuit is to perform said move and said erase, relative to receipt of the read requests and the write requests.

27. The storage drive of claim 26, wherein the logic to cause said memory controller integrated circuit to detect the need for the move of said first data is to identify a condition when said first data is at least one of hot or cold relative to a threshold, and is to responsively identify the need for the move.

* * * * *